(12) United States Patent
Matsumoto et al.

(10) Patent No.: US 7,312,969 B2
(45) Date of Patent: Dec. 25, 2007

(54) CURRENT CONTROL APPARATUS FOR ELECTRIC LOAD

(75) Inventors: Shuuiti Matsumoto, Tokyo (JP);
Hiroyoshi Nishizaki, Hyogo (JP);
Takeshi Fujiwara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 344 days.

(21) Appl. No.: 11/204,221

(22) Filed: Aug. 16, 2005

(65) Prior Publication Data

US 2006/0197508 A1    Sep. 7, 2006

(30) Foreign Application Priority Data

Feb. 28, 2005   (JP) .............................. 2005-053229

(51) Int. Cl.
*H02H 3/18* (2006.01)
(52) U.S. Cl. ........................................ 361/93.9; 361/87
(58) Field of Classification Search ................. 361/23, 361/87, 93.9
See application file for complete search history.

(56) References Cited

FOREIGN PATENT DOCUMENTS

| | | |
|---|---|---|
| JP | 05-217737 A | 8/1993 |
| JP | A 05-217737 | 8/1993 |
| JP | 10-039939 A | 2/1998 |
| JP | A 10-039939 | 2/1998 |
| JP | 10-225179 A | 8/1998 |
| JP | A 10-225179 | 8/1998 |
| JP | 2000-114039 A | 4/2000 |
| JP | A 2000-114039 | 4/2000 |
| JP | 2003-111487 A | 4/2003 |
| JP | A 2003-111487 | 4/2003 |
| WO | WO 03/074338 A1 | 9/2003 |

*Primary Examiner*—Michael Sherry
*Assistant Examiner*—Danny Nguyen
(74) *Attorney, Agent, or Firm*—Sughrue Mion, PLLC

(57) ABSTRACT

A current control apparatus for an electric load can prevent burnout at a short-circuit accident with high control precision. A switching element is interrupted by an overcurrent detection circuit upon occurrence of a load short circuit, but is transitionally limited in current by a current detection resistor. A differential amplifier amplifies a difference voltage between voltages at opposite ends of the current detection resistor to generate a monitored voltage Ef corresponding to a load current. A microprocessor controls the energization rate of the switching element so as to make an estimated load current Ime calculated from the monitored voltage Ef coincide with a target load current Is, and it calculates, upon calibration operation, calibration constants and estimates, during actual operation, a load current Ime from the monitored voltage Ef using the calibration constants.

19 Claims, 11 Drawing Sheets

CURRENT CONTROL APPARATUS FOR ELECTRIC LOAD

BACKGROUND OF THE INVENTION

1. Field of the Invention

The present invention relates to a current control apparatus for an inductive electric load used, for instance, in a vehicle-mounted electronic control system, and more particularly, it relates to such a current control apparatus for an electric load that serves to prevent the burnout of the apparatus due to a short circuit of the load or the like for improved current control accuracy.

2. Description of the Related Art

In conventional current control apparatuses for an electric load, there have been known a variety of such ones in which the switching energization rate of a switching element connected between a drive power supply and the electric load is controlled in such a manner that the current detected by a current detection resistor is made equal to a target load current to be supplied. Such a kind of electric load current control apparatus is used to control a current supplied to a linear solenoid that requires a wide range of a variable constant current, or control a current supplied to a fuel injection electromagnetic valve system that serves to hold a fuel injection valve at its open state with a constant low current after rapid opening thereof.

As one example of such electric load current control apparatuses, there has been known one of an internal feedback control type which itself generates a switching drive command in accordance with a deviation between a detected current and a target current command generated by a microprocessor (see, for instance, a first patent document: Japanese patent application laid-open No. H10-225179 (FIG. 2 and Abstract) and a second patent document: Japanese patent application laid-open No. 2000-114039 (FIGS. 1, 6, Abstract, and Paragraph No. 0003)).

In addition, as another example of conventional apparatuses, there has also been known one of an external feedback control type in which a microprocessor merely generates a target load current command, and a deviation integration circuit provided externally of the microprocessor generates a switching drive command in accordance with a deviation between a target load current and a detected current (see, for example, a third patent document: Japanese patent application laid-open No. H5-217737 (FIG. 1 and Abstract)). In the apparatus of the external feedback control type described in the third patent document, the control load of the microprocessor is reduced, but the hardware configuration thereof becomes complicated.

On the other hand, there are a variety of modes about the connecting location of a current detection resistor, but in the conventional apparatuses described in the above-mentioned first and third patent documents for instance, a feeder circuit is arranged between a power supply line connected, through and in the order of a switching element, an electric load and a current detection resistor, to a power supply positive terminal and a ground wire connected to a power supply negative terminal.

In this case, as wiring for the electric load, there are required two pieces of wiring, i.e., positive wiring connected with the switching element, and negative wiring connected with the current detection resistor, and it is necessary to consider the following five modes as abnormal forms or states.

The first mode is a load short-circuit accident in which the electric load itself is internally short-circuited, or a positive-to-negative line short-circuit accident between the positive and negative lines. In this case, it is possible to avoid a burnout accident by interrupting or turning off the switching element when an excessive current or overcurrent is detected by the current detection resistor. In addition, in a transitional time for which the switching element is being turned off, the excessive current to the switching element is limited by the resistance value of the current detection resistor, so a stress on the switching element can be reduced.

The second mode is an in-phase power supply fault accident in which the positive phase wiring and the power supply line are short-circuited with each other. In this case, no energization command is provided to the switching element, or the detection of a maximum current will be carried out in spite of a small energization rate. As a result, a warning indication can be carried out upon detection of an abnormal state, but current interruption cannot be performed. However, since an excessively large load current does not flow, the possibility of causing a burnout accident at once is small.

The third mode is a hetero-phase ground fault accident in which there takes place a short circuit between the positive phase wiring and the ground line. In this case, it is possible to detect abnormality because the detected current abnormally falls or decreases in spite of the fact that an energization command is provided to the switching element, but even if the switching element is interrupted or turned off quickly by the detection of abnormality, an abnormally excessive current flows through the switching element. Thus, this is an abnormal mode of a high probability that there occurs an internal short circuit of the switching element itself, and hence the switching element might subsequently be burned out to be open circuited. This is because the current detection resistor is put into a state that becomes unable to exert its current limiting function.

The fourth mode is an in-phase ground fault accident in which a short circuit takes place between the negative phase wiring and the ground line. In this case, abnormality can be detected due to the fact that the detected current abnormally falls despite the fact that an energization command is provided to the switching element, so the switching element can be interrupted or turned off by the detection of abnormality.

The fifth mode is a hetero-phase power supply fault accident in which a short circuit takes place between the negative phase wiring and the power supply line. In this case, a maximum current is detected in spite of the fact that no energization command is provided to the switching element or the energization rate of the switching element is small. Consequently, a warning indication can be carried out upon detection of an abnormal state, but current interruption cannot be performed, thus resulting in an abnormal mode in which a burnout accident of the current detection resistor or a break or disconnection accident thereof occurs.

In short, the feeder circuit described in the first or third patent document is constructed such that the switching element and the current detection resistor are connected at positions apart from each other with the electric load interposed therebetween, as a result of which there will be a very high probability that when a hetero-phase power supply fault accident or a hetero-phase ground fault accident occurs, protection of these parts is difficult, thus leading to burnout accidents thereof.

On the other hand, in the feeder circuit according to the second patent document, the current detection resistor is connected to an intermediate position between the switching element and the electric load, and hence special wiring for the electric load is the positive phase wiring alone. In this case, there are two abnormal modes which are described below.

The first mode is a load short-circuit accident in which the electric load itself is internally short-circuited, or a hetero-phase ground fault accident between the positive line and the ground line. In this case, it is possible to avoid a burnout accident by interrupting or turning off the switching element when an excessive current or overcurrent is detected by the current detection resistor. In addition, in a transitional time for which the switching element is being interrupted or turned off, the overcurrent to the switching element is limited by the resistance of the current detection resistor, so a stress on the switching element can be reduced.

The second mode is an in-phase power supply fault accident in which the positive phase wiring and the power supply line are short-circuited with each other. In this case, abnormality is detected by abnormal reduction of the detected current in spite of the fact that an energization command is provided to the switching element. As a result, an abnormal state can be detected to make a warning indication but current interruption cannot be performed. However, an excessively large load current does not flow, so the possibility of causing a burnout accident at once is small.

Accordingly, it is ideal from the viewpoint of overcurrent protection to directly connect the switching element and the current detection resistor with each other as in the case of the second patent document, but on the other hand, there exist, as will be described later, two problems; one is great reduction in current detection accuracy, and the other is that a negative voltage is impressed to a differential amplifier for current detection by a commutating diode connected in parallel to the electric load, thus causing a malfunction of the differential amplifier.

In the case of the first patent document, the current detection resistor is connected to the ground line side, so it is possible to achieve current detection with a relatively high degree of precision. However, there exist an individual variation of the resistance value of the current detection resistor and an offset error of the amplifier or an AD converter when the current value is in the zero state. Therefore, the detection values obtained when two large and small currents are supplied to the current detection resistor and the values measured by an external calibration instrument are compared to provide a current proportional constant and an offset error, which are then stored as calibration constants, so that at the time of actual operation, it becomes possible to perform highly accurate current detection by using the calibration constants thus stored.

In addition, as another example of conventional apparatuses, there has been proposed an apparatus of an internal feedback type in which a current detection resistor is connected between a switching element and an electric load, and calibration processing similar to the one described in the first patent document is carried out (see, for instance, a fourth patent document: Japanese patent application laid-open No. 2003-111487 (FIG. 1 and Abstract)). In this case, calibration constants with the use temperature environment being changed are stored, and at the time of actual operation, appropriate calibration constants are utilized in accordance with the actual operation temperature environment.

Accordingly, in the case of the fourth patent document, more sophisticated calibration is performed as compared with the one in the first patent document, but in actuality, it is not a calibration scheme based on the generation factor of the current detection error, so there still remains an error component that changes in accordance with a variation of the drive power supply voltage and the energization duty of the switching element.

Further, as still another example of conventional apparatuses, there has also been proposed an apparatus of an external feedback type in which a current detection resistor is connected between a switching element and an electric load, and a compensation power supply is used to cancel a negative voltage impressed by a commutating diode (see, for instance, a fifth patent document: Japanese patent application laid-open No. H10-39939 (FIG. 1 and Abstract)).

On the other hand, referring to an overcurrent detection circuit upon occurrence of abnormality, in FIG. 1 described in the second patent document, it is constructed such that an output voltage of the current detection circuit is input to an AD converter of the microprocessor, and if an AD conversion value thereof is excessively large, it is assumed that a load short circuit or a ground fault of the positive phase wiring has occurred. In FIG. 3 described in this second patent document, an overcurrent is detected by comparing an output voltage of the current detection circuit with a reference voltage.

Thus, in the case of the method of detecting an overcurrent by the output voltage of the current detection circuit, when the value of a current detection signal changes from 0 [V] to 5 [V] for instance, in order to prevent inadvertent abnormality detection at voltages in the vicinity of 5 [V], a normal signal voltage needs to be in a very low voltage range, and hence there arises a problem that digital conversion accuracy of the AD converter is reduced.

Here, note that the provision of overcurrent detection resistors, the differential amplifier, a comparison determination circuit, and a latch circuit, as shown in FIG. 6 in the second patent document, results in a costly construction which, in particular, requires two current detection resistors that are heat-generating parts, so such a construction is undesirable from the viewpoint of size reduction and power saving.

In the above-mentioned conventional current control apparatuses, for instance, the first or third patent document has a problem that it is difficult to take protective measures against hetero-phase power supply faults or hetero-phase ground faults of the electric load.

Also, in the second, fourth or fifth patent document, protection against short-circuit accidents becomes easy but there is a problem that current detection errors due to the energization duty of the switching element or variation of the power supply voltage have a great influence on current detection accuracy.

In addition, in the first or fourth patent document, calibration means for improving current detection accuracy is disclosed but has a problem that current detection errors caused by the energization duty of the switching element or variation of the power supply voltage can not be corrected.

Moreover, in the second or third patent document, overcurrent detection means is also disclosed but in any case, there is a problem that a detection voltage for normal current is in a low voltage range, so digital conversion accuracy of the AD converter is reduced.

SUMMARY OF THE INVENTION

Accordingly, one object of the present invention is to obtain a current control apparatus for an electric load in which a current detection resistor is connected between a switching element and an electric load so as to make easy protective measures against load short-circuit accidents, and which is capable of providing an effective calibration element to improve reduction in current detection accuracy.

Another object of the present invention is to provide a current control apparatus for an electric load which is constructed so as to be free from the influence of an overcurrent detection circuit used as a protective measure against load short-circuit accidents, thereby making it possible to prevent reduction in the digital conversion accuracy of an AD converter.

A further object of the present invention is to provide a current control apparatus for an electric load which is capable of improving accuracy in the detection and warning of an abnormal state such as a positive phase power supply fault accident in which a current detection resistor is short-circuited with external wiring.

Bearing the above objects in mind, according to the present invention, there is provided a current control apparatus for an electric load which includes: a feeder circuit having a switching element and a current detection resistor both inserted in series between a drive power supply and an electric load for feeding electric power from the drive power supply to the electric load through the switching element and the current detection resistor; a current control part that controls an on/off ratio of the switching element in such a manner that a load current detected by the current detection resistor is made to coincide with a target load current Is to be supplied to the electric load; and a current control part including a microprocessor, a differential amplifier circuit part, a detected error calibration section, a conversion estimating section, and a feedback control section. The microprocessor includes a nonvolatile program memory, a nonvolatile data memory, a RAM memory for arithmetic operation, and a multichannel AD converter. The differential amplifier circuit part amplifies a difference voltage between voltages at opposite ends of the current detection resistor to generate a monitored voltage Ef substantially proportional to the load current and to input it to the microprocessor. The detected error calibration section stores a current proportional constant of the monitored voltage Ef, a voltage proportional constant of an error component, and an offset component, which are measured at the time of adjustment for shipment of the apparatus as a product, into the nonvolatile data memory as calibration constants. The conversion estimating section calculates an estimated load current Ime based on the monitored voltage Ef and the calibration constants or calculates an estimated monitored voltage Es corresponding to the target load current Is. The feedback control section controls an energization duty γ, which is a closed circuit duration of the switching element divided by a switching period thereof, while setting the target load current Is as a target value of the current control part, and the estimated load current Ime as a feedback value, or setting the estimated monitored voltage Es as a target value of the current control part, and the monitored voltage Ef as a feedback value. At least the detected error calibration section, the conversion estimating section and the feedback control section are executed by the microprocessor based on a control program stored in the nonvolatile program memory.

According to the present invention, the switching element and the current detection resistor are connected with each other in a mutually adjacent relation, so special wiring to the electric load can be eliminated. Besides, in the apparatus of a feeder circuit construction in which a burnout preventive measure against a short-circuit malfunction of the wiring or the electric load is simplified by the current limiting function of the current detection resistor, it is possible to perform highly accurate current control by supplementing deterioration in current detection accuracy. Moreover, since detection errors are calibrated according to respective factors for the detection errors, it is possible to carry out highly accurate current control by utilizing calibration constants in an appropriate manner during the operation of the current control apparatus in various driving environments.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described while referring to the accompanying drawings.

Embodiment 1.

Figure 1:
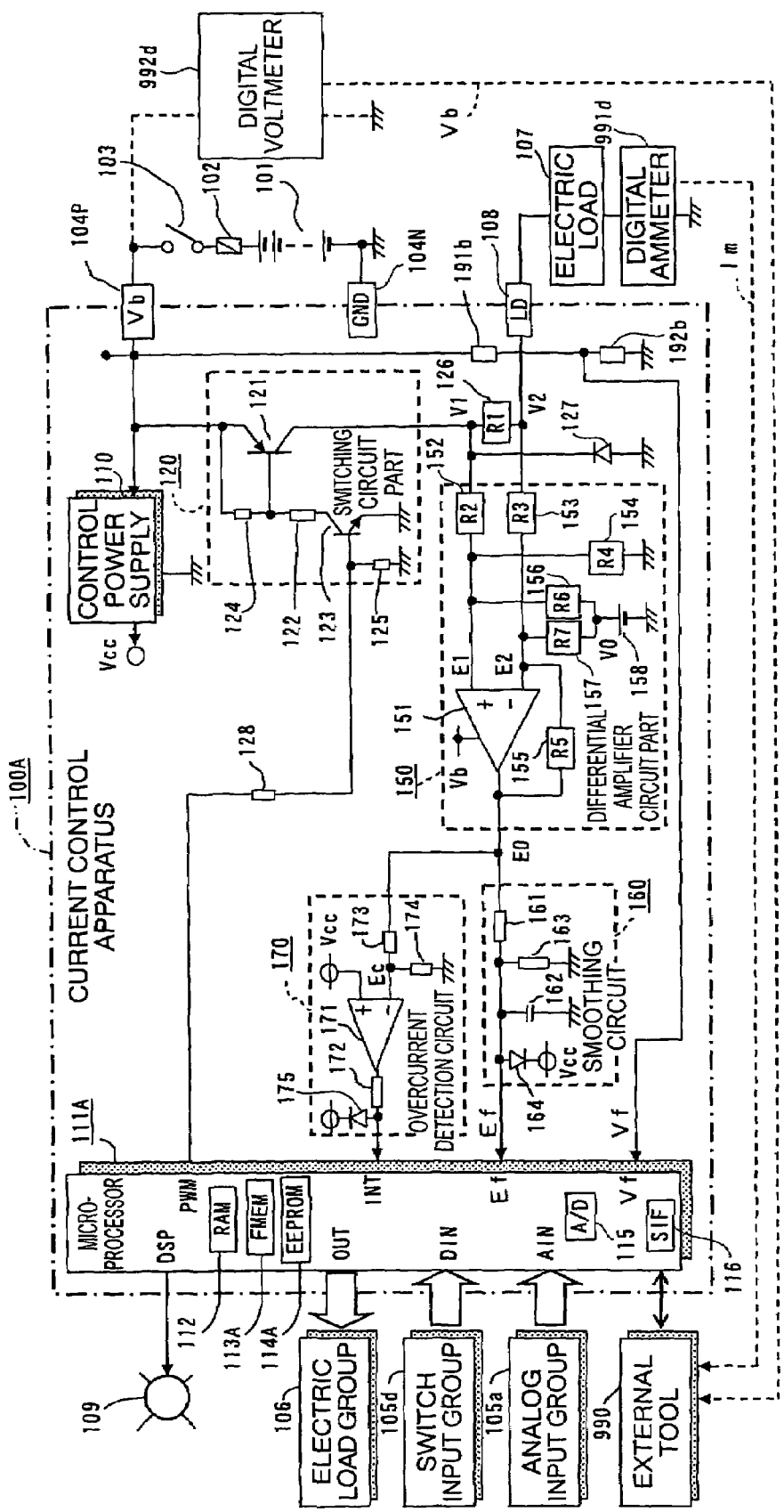
FIG. 1 is a block diagram showing the overall construction of a current control apparatus for an electric load according to a first embodiment of the present invention.

FIG. 1 is a block diagram that shows the overall construction of a current control apparatus for an electric load according to a first embodiment of the present invention.

In FIG. 1, the current control apparatus, generally designated at 100A, is provided with a power supply terminal 104P, a ground terminal 104N, and an output terminal 108. The ground terminal 104N of the current control apparatus 100A is connected to ground, and a drive power supply circuit comprising a drive power supply 101, a fuse 102 and a power supply switch 103 is connected between the power supply terminal 104P and the ground terminal 104N.

In addition, an inductive electric load 107 is connected to the output terminal 108 of the current control apparatus 100A, and a calibration digital ammeter 991d is connected between the electric load 107 and ground as required. A calibration digital voltmeter 992d is connected between opposite ends of a drive power supply circuit 101-103 as required. An external load current Im detected by the digital ammeter 991d is input to an external tool 990. Similarly, a drive power supply voltage Vb detected by the digital voltmeter 992d is input to the external tool 990.

The current control apparatus 100A includes a stabilization control power supply unit 110 (hereinafter referred to simply as a "control power supply") connected to the power supply terminal 104P, a microprocessor 111A to which electric power is fed from the control power supply 110, a switching circuit part 120 that responds to a feedback control output PWM (pulse width modulation control signal) output from the microprocessor 111A, a drive resistor 128 inserted between the microprocessor 111A and a control input terminal of the switching circuit part 120, a differential amplifier circuit part 150 connected to the switching circuit part 120, a smoothing circuit 160 and an overcurrent detection circuit 170 both connected to the differential amplifier circuit part 150, a current detection resistor 126 and a commutating diode 127 arranged at an input side of the differential amplifier circuit part 150, and a pair of voltage dividing resistors 191b, 192b (power supply voltage measuring circuit) inserted between the power supply terminal 104P (the input terminal of the switching element 121) and ground.

The voltage dividing resistors 191b, 192b, which together constitute the power supply voltage measuring circuit, are connected in series with each other, and a voltage across the opposite ends of the voltage dividing resistor 192b (a potential at a junction between the voltage dividing resistors 191b, 192b) is input to the microprocessor 111A as a power supply monitoring voltage Vf.

An output voltage E0 of the differential amplifier circuit part 150 becomes a prestage voltage for a monitored voltage Ef, and is input to the smoothing circuit 160 and the overcurrent detection circuit 170. The monitored voltage Ef output from the smoothing circuit 160 is input to an voltage monitoring input terminal of the microprocessor 111A. The output voltage of the overcurrent detection circuit 170 is input to an interrupt input terminal INT of the microprocessor 111A.

A warning indicator 109 constituting an abnormality warning section, an electric load group 106, a switch input group 105d for generating digital signals, an analog input group 105a for generating analog signals, and a calibration external tool 990 are connected to the microprocessor 111A as external equipment.

In the current control apparatus 100A, the circuit elements such as the control power supply 110, the microprocessor 111A, the switching circuit part 120 including the switching element 121 as a central component, the differential amplifier circuit part 150, the smoothing circuit 160, the overcurrent detection circuit 170, etc., are accommodated in a sealed casing (not shown).

The microprocessor 111A comprises a RAM memory 112 for arithmetic operation, a nonvolatile program memory (FMEM) 113A, a data memory (EEPROM) 114A, a multi-channel AD converter 115, and a serial communication interface circuit (SIF) 116. In addition, the microprocessor 111A includes an output port OUT to which the electric load group 106 is connected, a digital input port DIN to which the switch input group 105d is connected, an analog input port AIN to which the analog input group 105a is connected, an output port that generates a feedback control output PWM, and an output port that generates an abnormality warning signal DSP.

The switch input group 105d including sensor switches, operation switches, etc., is connected to the digital input port DIS of the microprocessor 111A through a connector and an input interface circuit (not shown).

Similarly, the analog input group 105a including a variety of analog sensors is connected to the analog input port AIN of the microprocessor 111A through a connector and an input interface circuit, and the electric load group 106 including actuators, indication equipment, etc., is connected to the output port OUT of the microprocessor 111A through a connector and an output interface circuit (not shown).

The electric load 107, which is included in the electric load group 106, is a load (e.g., a linear solenoid, etc.) which requires current control, and to which electric power is fed from the output terminal 108. The warning indicator (abnormality warning section) 109, which is included in the electric load group 106, is driven by a command signal from the abnormality warning signal DSP of the microprocessor 111A.

Here, note that in a calibration operation of the current control apparatus 100A prior to its shipment as a product, the external tool 990 is connected to the microprocessor 111A through an SIF 116. At the same time, an output signal of the digital ammeter 991d connected in series to the electric load 107 (external load current Im) and an output signal of the digital voltmeter 992d (drive power supply voltage Vb of the drive power supply 101 impressed to the power supply terminal 104P) are supplied to the microprocessor 111A through the external tool 990, and are transferred to the RAM memory 112.

The control power supply 110 in the current control apparatus 100A generates a stabilized control power supply voltage Vcc (e.g., DC 5 [V]) from the drive power supply voltage Vb (e.g., DC 10 [V]-16 [V]), and feeds it to respective parts in the current control apparatus 100A. Inside the microprocessor 111A, the RAM memory 112 for arithmetic operation, the FMEM 113A, the data memory 114A, the multichannel AD converter 115, and the SIF 116 are constructed so as to mutually cooperate with one another.

The FMEM 113A is composed, for instance, of a nonvolatile flash memory or the like which is flash electrically erasable, writable and readable, and the data memory 114A is composed of a nonvolatile EEPROM or the like which is electrically writable and readable in units of 1 bite.

The switching circuit part 120 in the current control apparatus 100A includes a switching element 121 (e.g., PNP junction type transistor), a serial circuit comprising a drive resistor 122 and a transistor 123 of NPN type connected to a base circuit of the switching element 121, a stabilization resistor 124 connected between an emitter terminal and a base terminal of the switching element 121, and a stabilization resistor 125 connected between an emitter terminal and a base terminal of the transistor 123.

The switching element 121 and the current detection resistor 126 are inserted in series between the drive power supply 101 and the electric load 107, and serve to constitute a feeder circuit to feed electric power from the drive power supply 101 to the electric load 107. That is, the switching element 121 has its one end connected to the power supply terminal 104P, and its other end connected to the output terminal 108 through the current detection resistor 126 having a resistance value of R1, so that electric power is fed to the electric load 107.

The commutating diode 127 is connected in parallel to the serial circuit including the current detection resistor 126 and the inductive electric load 107 in such a polarity that permits a transient-decay current of the electric load 107 to be returned or fed back when the switching element 121 is opened or turned off. The transistor 123 is driven by the feedback control output PWM from the microprocessor 111A through the drive resistor 128. That is, the transistor 123 and the switching element 121 become conductive when the feedback control output PWM is at a logical high level "H".

Also, the differential amplifier circuit part 150 in the current control apparatus 100A includes a differential amplifier 151 that is operated by the drive power supply voltage Vb, an input resistance 152 having a resistance value of R2, an input resistance 153 having a resistance value of R3, a voltage dividing resistor 154 having a resistance value of R4, a negative feedback resistor 155 having a resistance value of R5, a bias resistor 156 having a resistance value of R6, a bias resistor 157 having a resistance value of R7, and a bias power supply 158 that constitutes a bias correction circuit.

In the differential amplifier circuit part 150, relations among the respective resistor values R2, R4, R6 of the input resistor 152, the voltage dividing resistor 154 and the bias resistor 156, and the respective resistor values R3, R5, R7 of the input resistor 153, the negative feedback resistor 155 and the bias resistor 157 are represented as designed theoretical values in the following manner.

R2=R3
R4=R5
R6=R7

The input resistance 152 is connected between a positive terminal of the current detection resistor 126 (the potential to ground=V1) and a non-inverting input terminal (+) (the potential to ground=E1) of the differential amplifier 151. The input resistor 153 is connected between a negative terminal of the current detection resistor 126 (the potential to ground=V2) and an inverting input terminal (−) of the differential amplifier 151 (the potential to ground=E2). The voltage dividing resistor 154 is connected between the non-inverting input terminal (+) of the differential amplifier 151 and the ground terminal 104N (ground).

The negative feedback resistor 155 is connected between an output terminal (the potential to ground=E0) and the inverting input terminal (−) of the differential amplifier 151. The bias resistor 156 is connected between the non-inverting input terminal (+) of the differential amplifier 151 and the bias power supply 158. The bias resistor 157 is connected between the inverting input terminal (−) of the differential amplifier 151 and the bias power supply 158. The bias power supply 158 is composed of a reference voltage generation circuit that is operated by an input voltage of the power supply terminal 104P (=the drive power supply voltage Vb), and generates a bias voltage of V0 potential to ground.

Moreover, the smoothing circuit 160 in the current control apparatus 100A comprises a serial resistor 161, a capacitor 162 and a parallel resistor 163 inserted between one end of the serial resistor 161 and the ground, and a voltage limiting diode 164 inserted between one end of the series resistor 161 and the control power supply voltage Vcc.

In the smoothing circuit 160, the serial resistor 161 is connected between the output terminal of the differential amplifier 151 and the voltage monitoring input terminal of the microprocessor 111A (to which the monitored voltage Ef is input). The capacitor 162 is connected between the voltage monitoring input terminal of the microprocessor 111A and the ground, and the parallel resistor 163 is connected in parallel to the capacitor 162. The voltage limiting diode 164 is connected between the voltage monitoring input terminal of the microprocessor 111A and a power supply line of a control power supply voltage Vcc fed by the control power supply 110.

On the other hand, the overcurrent detection circuit 170 in the current control apparatus 100A comprises a comparison circuit 171, an output resistor 172, an input resistor 173, a voltage dividing resistor 174, and a voltage limiting diode 175.

The output resistor 172 is connected between an output terminal of the comparison circuit 171 and the interrupt input terminal INT of the microprocessor 111A. The input resistor 173 is connected between the output terminal of the differential amplifier 151 and an inverting input terminal (−) of the comparison circuit 171. The voltage dividing resistor 174 is connected between the inverting input terminal (−) of the comparison circuit 171 and the ground. The voltage limiting diode 175 is connected between the interrupt input terminal of the microprocessor 111A and the power supply line of the control power supply voltage Vcc fed by the control power supply 110.

The output voltage E0 of the differential amplifier 151 is a prestage voltage for the monitored voltage Ef input to the microprocessor 111A, and the monitored voltage Ef becomes equal to a voltage obtained by dividing the prestage voltage E0 by the serial resistor 161 and the parallel resistor 163. In addition, a divided voltage Ec obtained by dividing the prestage voltage E0 by the input resistor 173 and the voltage dividing resistor 174 is impressed to the inverting input terminal (−) of the comparison circuit 171.

The comparison circuit 171 in the overcurrent detection circuit 170 is operated by the drive power supply voltage Vb, similar to the differential amplifier 151 in the differential amplifier circuit part 150, and the non-inverting input terminal (+) of the comparison circuit 171 is connected to the power supply line of the controlled power supply voltage Vcc. As will be described later, the prestage voltage E0 generally changes within a range of from E0=0 [V] to Vcc (e.g., Vcc=5 [V]) depending on the magnitude of the load current that flows through the electric load 107.

However, there is a possibility that the prestage voltage E0 rises up to Vb (=10 [V]-16 [V]) upon occurrence of an abnormality such as a load short-circuit accident, etc. Accordingly, in order to limit the voltage impressed to the input terminal of the microprocessor 111A to a level equal to or less than the controlled power supply voltage Vcc upon occurrence of an abnormality, the voltage limiting diodes 164, 175 are connected to the smoothing circuit 160 and the overcurrent detection circuit 170, respectively.

However, the voltage limiting diode 175 in the overcurrent detection circuit 170 is not required by using the controlled power supply voltage Vcc as the power supply voltage of the comparison circuit 171, and by setting the voltage impressed to the non-inverting input terminal (+) of the comparison circuit 171 to a value (e.g., about DC 4 [V]) slightly lower than the controlled power supply voltage Vcc.

In the current control apparatus 100A, the microprocessor 111A constitutes, in association with the differential amplifier circuit part 150, the smoothing circuit 160 and the overcurrent detection circuit 170, a current control part that serves to control the on/off ratio (energization or power supply duty γ) of the switching element 121 so as to make the load current detected by the current detection resistor 126 coincide with a target load current Is to be supplied to the electric load 107. In addition, the microprocessor 111A includes a detected error calibration section, a conversion estimating section and a feedback control section, as will be described later.

The microprocessor 111A calculates calibration constants from the relation among the monitored voltage Ef, the actual load current and the drive power supply voltage Vb at the time of calibration operation, as will be described later, and calculates an estimated load current Ime from the monitored voltage Ef based on the calibration constants at the time of actual operation. Also, the microprocessor 111A calculates the estimated load current Ime (to be described later) from the monitored voltage Ef, integrates, for instance, a deviation (=Is−Ime) of the thus estimated load current Ime from the target load current Is, and increases the switching energization rate of the switching element 121 in accordance with the increasing integral value thus obtained.

The differential amplifier circuit part 150 amplifies a difference voltage between the voltages at the opposite ends of the current detection resistor 126 to provide a monitored voltage Ef, substantially proportional to the load current, which is then input to the microprocessor 111A through the smoothing circuit 160.

In the microprocessor 111A, the detected error calibration section saves or stores a current proportional constant of the monitored voltage Ef, a voltage proportional constant of an error component, and an offset component (to be described later, respectively), which are measured at the time of adjustment for shipment of the apparatus as a product, into the nonvolatile data memory (EEPROM) 114A as calibration constants.

In addition, the conversion estimating section in the microprocessor 111A calculates the estimated load current Ime based on the monitored voltage Ef and the calibration constants or it calculates an estimated monitored voltage Es corresponding to the target load current Is.

Further, in the microprocessor 111A, the feedback control section controls the energization duty γ, which is obtained by dividing the closed circuit duration of the switching element 121 by the switching period thereof, while setting the target load current Is as a target value of the current control part, and the estimated load current Ime as a feedback value, or setting the estimated monitored voltage Es as a target value of the current control part, and the monitored voltage Ef as a feedback value. Thus, the functions of at least the detected error calibration section, the conversion estimating section and the feedback control section are executed by the microprocessor 111A based on a control program stored in the nonvolatile program memory (FMEM) 113A.

As referred to above, the current control apparatus 100A for the electric load 107 according to the first embodiment of the present invention comprises the feeder circuit including the switching element 121 and the current detection resistor 126 both inserted in series between the drive power supply 101 and the electric load 107 for feeding electric power from the drive power supply 101 to the electric load 107 through the switching element 121 and the current detection resistor 126, and the current control part that controls the on/off ratio of the switching element 121 in such a manner that the load current detected by the current detection resistor 126 is made to coincide with the target load current Is to be supplied to the electric load 107.

The current control part includes the microprocessor 111A, the differential amplifier circuit part 150, the detected error calibration section, the conversion estimating section, and the feedback control section. The microprocessor 111A includes the nonvolatile program memory (FMEM) 113A, the nonvolatile data memory 114A, the RAM memory 112 for arithmetic processing, and the multichannel AD converter 115.

The differential amplifier circuit part 150 amplifies the difference voltage between the voltages V1, V2 at the opposite ends of the current detection resistor 126, generates the monitored voltage Ef substantially proportional to the load current, and inputs it to the microprocessor 111A. The detected error calibration section saves or stores the current proportional constant of the monitored voltage Ef, the voltage proportional constant of the error component, and the offset component, which are measured at the time of adjustment for shipment of the apparatus as a product, into the nonvolatile data memory 114A as calibration constants. The conversion estimating section calculates the estimated load current Ime based on the monitored voltage Ef and the calibration constants or calculates the estimated monitored voltage Es corresponding to the target load current Is.

The feedback control section controls the energization duty γ, which is the closed circuit duration of the switching element 121 divided by the switching period thereof, while setting the target load current Is as the target value of the current control part, and the estimated load current Ime as the feedback value, or setting the estimated monitored voltage Es as the target value of the current control part, and the monitored voltage Ef as the feedback value. In addition, the functions of at least the detected error calibration section, the conversion estimating section and the feedback control section are executed by the microprocessor 111A based on the control program stored in the FMEM 113A.

Moreover, the feeder circuit includes the commutating diode 127, and the differential amplifier circuit part 150 includes the bias correction circuit (the bias power supply 158). The commutating diode 127 is connected in parallel to the electric load 107 in such a manner that it has a polarity to permit a continued transient-decay current due to the inductance of the electric load 107 to be returned or fed back upon opening of the switching element 121.

The bias correction circuit 158 impresses a substantially equal, positive bias voltage V0 to the first and second inputs of the differential amplifier 151 so as to cancel a negative voltage impressed thereto due to a voltage drop of the commutating diode 127 upon opening of the switching element 121, thereby inhibiting the negative voltage input from being impressed to the differential amplifier 151. The current control part includes a power supply voltage measuring circuit that measures the power supply monitoring voltage Vf.

The detected error calibration section includes a first, a second and a third data acquisition section, a calibration factor calculation section that calculates calibration factors from the data acquired by the first, second and third data acquisition sections, a power supply voltage calibration section that calibrates the power supply monitoring voltage Vf, and a transfer storage section that transfers and stores the calibration factors as calibration constants (all these sections being described later, respectively). The power supply voltage measuring circuit inputs a divided voltage of the drive power supply voltage Vb from the drive power supply 101 to the microprocessor 111A as the power supply monitoring voltage Vf.

The first data acquisition section (to be described later) acts, upon input of a first calibration command with the drive power supply voltage Vb being impressed to the current control part, to write and store, into the RAM memory 112 as a first error voltage Ef0, the value of a monitored voltage that is generated from the differential amplifier circuit part 150 with the switching element 121 fully opened.

The second data acquisition section (to be described later) acts, upon input of a second calibration command with the wiring extending from the feeder circuit to the electric load 107 being cut or broken, to write and store, into the RAM memory 112 as a second error voltage Ef1, the value of a monitored voltage that is generated from the differential amplifier circuit part 150 with the switching element 121 being made fully conductive, and at the same time to write and store the value of the drive power supply voltage Vb measured at the outside into the RAM memory 112.

The third data acquisition section (to be described later) acts, upon input of a third calibration command with the wiring extending from the feeder circuit to the electric load 107 being connected, to write and store, into the RAM memory 112 as a measured voltage Ef2, the value of a monitored voltage that is generated from the differential amplifier circuit part 150 with the switching element 121 being made fully conductive, and at the same time to write and store the value of the external load current Im measured at the outside into the RAM memory 112.

When the voltage drop Vd of the commutating diode 127 is made substantially equal to 1 [V] (Vd≈1 [V]), the calibration factor calculation section (to be described later) calculates and stores a voltage proportional constant A of the error component, a current proportional constant B and an offset component C in such a manner that the monitored voltage Ef, the drive power supply voltage Vb and the energization duty γ of the differential amplifier circuit part 150 and the external load current Im satisfy the following relation: $Ef=A\times(Vb+Vd)\times\gamma+B\times Im+C$.

The offset component C coincides with the first error voltage Ef0 stored in the first data acquisition section. The voltage proportional constant A is calculated from the data acquired by the first and second data acquisition sections as follows: $A=(Ef1-Ef0)/(Vb+Vd)$. The current proportional constant B is calculated from the data acquired by the second and third data acquisition sections as follows: $B=(Ef2-Ef1)/Im$.

The power supply voltage calibration section is executed in the first, second and third data acquisition sections to write and store the power supply monitoring voltage Vf into the RAM memory 112, and it calculates a power supply voltage calibration factor Kv as $Kv=Vb/Vf$, or applies a fixed constant which is preset as the reciprocal of the voltage division ratio of the drive power supply voltage Vb.

The transfer storage section transfers and stores, into the nonvolatile data memory 114A as calibration constants, the respective values of the voltage proportional constant A, the current proportional constant B, the offset component C, and the power supply voltage calibration factor Kv, all of which are the calculation results of the calibration factor calculation section.

The current control part includes a serial communication interface circuit (SIF) 116 that connects between the microprocessor 111A and the external tool 990 for calibration operation, whereby a calibration command, voltage information on the drive power supply 101, and current information on the electric load 107 input from the external tool 990 through the SIF 116 at the time of calibration operation are transferred to and stored into the RAM memory 112. The FMEM 113A includes the conversion estimating section that calculates the estimated load current Ime or the estimated monitored voltage Es, and a switching control output generation section in the form of the feedback control section.

The conversion estimating section calculates the estimated load current Ime from the monitored voltage Ef generated from the differential amplifier circuit part 150 and the present value of the energization duty γ of the switching element 121 as follows: $Ime=[Ef-A\times(Vb+Vd)\times\gamma-C]/B$. Alternatively, it calculates the estimated monitored voltage Es generated from the differential amplifier circuit part 150 when the target load current Is flows at the energization duty γ of the switching element 121 as follows: $Es=A\times(Vb+Vd)\times\gamma+B\times Is+C$. The switching control output generation section gradually increases or decreases the energization duty γ of the switching element 121 in response to a deviation between the target load current Is and the estimated load current Ime, or in response to a deviation between the estimated monitored voltage Es and the actual monitored voltage Ef.

The FMEM 113A includes a program that constitutes an initial setting section. The initial setting section calculates a roughly estimated value γ0 of the energization duty from the relation among the minimum power supply voltage Vmin, the reference load current Ir, the power supply monitoring voltage Vf and the target load current Is by using an expression $[0=(Vmin/Vb)\times(Is/Ir)$ (here, $Vb=Kv\times Vf$)], and sets it as an energization duty immediately after starting of the energization (supply of power).

The reference load current Ir is calculated by using a standard resistance value Rc, which is determined within a resistance value variation range (Rmin-Rmax) of the electric load as follows: $Ir=Vmin/Rc$. In addition, the current control part includes the control power supply 110, the overcurrent detection circuit 170, the voltage limiting diode 164, an output stop section (to be described later), and the abnormality warning section (including the warning indicator 109).

The control power supply 110 is fed with power from the drive power supply 101, generates the stabilized control power supply voltage Vcc, which is lower than the drive power supply voltage Vb, and supplies it to the microprocessor 111A. The differential amplifier circuit part 150 is operated by impression of the drive power supply voltage Vb to amplify the difference voltage between the voltages V1, V2 at the opposite ends of the current detection resistor 126, generate the monitored voltage Ef substantially proportional to the load current, and input it to the microprocessor 111A.

The conversion estimating section calculates the estimated load current Ime based on the monitored voltage Ef, or calculates the estimated monitored voltage Es corresponding to the target load current Is. The feedback control section controls the energization duty γ, which is equal to the closed circuit duration of the switching element 121 divided by the switching period thereof, while setting the target load current Is as the target value of the current control part, and the estimated load current Ime as the feedback value, or setting the estimated monitored voltage Es as the target value of the current control part, and the actual monitored voltage Ef as the feedback value.

When the value of the prestage voltage E0 of the monitored voltage Ef obtained from the differential amplifier circuit part 150 exceeds a predetermined value that is equal to or greater than the controlled power supply voltage Vcc, the overcurrent detection circuit 170 generates an overcurrent determination warning signal indicative of an excess of the load current and inputs it to the microprocessor 111A. The voltage limiting diode 164 is connected to the smoothing circuit 160 and serves to limit the monitored voltage Ef to be input to the microprocessor 111A to the level of the controlled power supply voltage Vcc.

In response to the overcurrent determination signal, the output stop section stops the feedback control output PWM from the feedback control section to the switching element 121, and the abnormality warning section provides a warning indication of such an abnormally stopped state. The overcurrent determination signal is impressed to the interrupt input terminal INT of the microprocessor 111A, and the output stop section comes to stop the feedback control output PWM in immediate response to the generation of the overcurrent determination signal.

The FMEM 113A includes an average voltage estimation section (to be described later) that estimates an average monitored voltage Va, which is an average value of the voltage impressed to the electric load 107, an abnormality determination section (to be described later) comprising at least one of an overcurrent state detection section and an undercurrent state detection section, the output stop section, and a program that constitutes the abnormality warning section.

The average voltage estimation section calculates the product of the energization duty γ of the switching element 121 and the drive power supply voltage Vb as the average monitored voltage Va. When the relative relation between the monitored voltage Ef and the average monitored voltage Va varies exceeding an allowable variation range, the abnormality determination section generates an abnormality determination warning signal indicating that the monitored voltage Ef is excessively large or small. In response to the abnormality determination signal, the output stop section stops the feedback control output PWM, and the abnormality warning section indicates a warning of the abnormally stopped state.

Next, reference will be made to a specific operation of the current control apparatus 100A constructed as shown in FIG. 1.

Now, assuming that the turn-on time and the turn-off time of the switching element 121 are represented by τ on and τ off, respectively, and that the switching period is represented by τ, the energization duty γ is represented by the following expression (1).

$$\gamma = \tau on / \tau (\tau = \tau on + \tau off) \qquad (1)$$

On the other hand, when the standard resistance value Rc is decided to be a value between a minimum resistance value Rmin and a maximum resistance value Rmax corresponding to the temperature changes of the electric load 107 (Rc=from Rmin to Rmax), and when the variation or amplitude range of the drive power supply voltage Vb is set to a value from a minimum value Vmin (minimum power supply voltage) to a maximum value Vmax (maximum power supply voltage), the reference load current (standard current) Ir is defined by the following expression.

$$Ir = Vmin/Rc$$

Thus, fixed constants such as the respective resistance values Rmin, Rc, Rmax, the respective voltage values Vmin, Vmax are stored and kept in advance in the FMEM 113A or the EEPROM 114A.

In this case, if a target load current of the electric load 107 is equal to Is, and if the resistance value of the electric load 107 coincides with the standard resistance value Rc, the roughly estimated value γ0 of the energization duty at the time when the drive power supply voltage is equal to Vb is represented by the following expression (2).

$$\gamma 0 = (Is/Ir) \times (Vmin/Vb) \qquad (2)$$

Here, note that the resistance value R1 of the current detection resistor 126 is represented as R1<<Rmin, and hence it is so small as to be ignored.

Turning now to the the characteristics related to the differential amplifier 151, the sum total of the current flowing into the non-inverting input terminal (+) thereof becomes substantially zero, so the following expression (3) holds.

$$(V1-E1)/R2+(0-E1)/R4+(V0-E1)/R6=0 \therefore V1/R2+V0/R6=E1/R246 \qquad (3)$$

Here, note that R246 in expression (3) above is represented by the following expression.

$$R246 = 1/(1/R2+1/R4+1/R6)$$

Similarly, the sum total of the current flowing into the inverting input terminal (−) of the differential amplifier 151 becomes substantially zero, so the following expression (4) holds.

$$(V2-E2)/R3+(E0-E2)/R5+(V0-E2)/R7=0 \therefore V2/R3+E0/R5+V0/R7=E2/R357 \qquad (4)$$

Here, note that R357 in expression (4) above is represented by the following expression.

$$R357 = 1/(1/R3+1/R5+1/R7)$$

Since in the differential amplifier 151, a potential E1 at its non-inverting input terminal (+) and a potential E2 at its inverting input terminal (−) becomes substantially equal to each other, an output potential E0 is calculated from expressions (3), (4) above according to the following expression (5).

$$R246 \times (V1/R2+V0/R6) = R357 \times (V2/R3+E0/R5+V0/R7)$$
$$\therefore (R246/R2) \times V1 - (R357/R3) \times V2 + [(R246/R6) - (R357/R7)] \times V0 = (R357/R5) \times E0 \qquad (5)$$

Here, assuming that the load current flowing into the current detection resistor 126 is equal to the external load current Im, the following expression (6) holds.

$$V2 = V1 - Im \times R1 \qquad (6)$$

Accordingly, the output voltage E0 is calculated according to the following expression (7) by using expressions (5), (6) above.

$$E0 = Kd \times V1 + Ki \times Im + K0 \qquad (7)$$

Here, note that coefficients Kd, Ki and K0 in expression (7) above are represented by the following expressions, respectively.

$$Kd = (R246/R2 - R357/R3) \times (R5/R357)$$
$$= (R246/R357) \times (R5/R2) - (R5/R3)$$

$$Ki = R1 \times (R357/R3) \times (R5/R357)$$
$$= R1 \times (R5/R3)$$

$$K0 = [(R246/R6) - (R357/R7)] \times (R5/R357) \times V0$$
$$= [(R246/R357) \times (R5/R6) - (R5/R7)] \times V0$$

Here, note that since R2≈R3, R4≈R5, and R6≈R7, the following relation holds: R246≈R357. Thus, the coefficients Kd, K0 originally become nearly zero (Kd≈0 and K0≈0).

However, in order to prevent the output voltage of the differential amplifier 151 from becoming a negative value in the state of a minute load current, it is intentionally designed such that some parts of resistance values do not become equal to or coincident with one another. Thus, when an intentionally unbalanced circuit is to be constructed, a resistor having a minute resistance value corresponding to an error ratio of the voltage dividing resistor 154 may be connected in series to the voltage dividing resistor 154, for instance.

Then, the monitored voltage Ef (average value) divided by the resistance value R163 of the parallel resistor 163 and the resistance value R161 of the serial resistor 161 is calculated. Since the voltage V1 becomes equal to the drive power supply voltage Vb (V1=Vb) in the duration τ on, and the voltage V1 becomes equal to −Vd (V1=−Vd) in the duration τ off, the monitored voltage Ef (average value) is calculated by the following expression (8). Here, Vd is a voltage drop of the commutating diode 127.

$$Ef=[\int E0 dt/\tau] \times [R163/(R163+R161)]=[(Kd \times Vb+Ki \times Im+K0) \times \tau on/\tau+(-Kd \times Vd+Ki \times Im+K0) \times \tau off/\tau] \times [R163/(R163+R161)] \therefore Ef=A \times (Vb+Vd) \times \gamma + B \times Im+C \quad (8)$$

Here, the respective calibration constants A, B, C in expression (8) above are represented by the following expressions.

$$A=Kd \times [R163/(R163+R161)]$$

$$B=Ki \times [R163/(R163+R161)]$$

$$C=K0 \times [R163/(R163+R161)]$$

Figure 2:
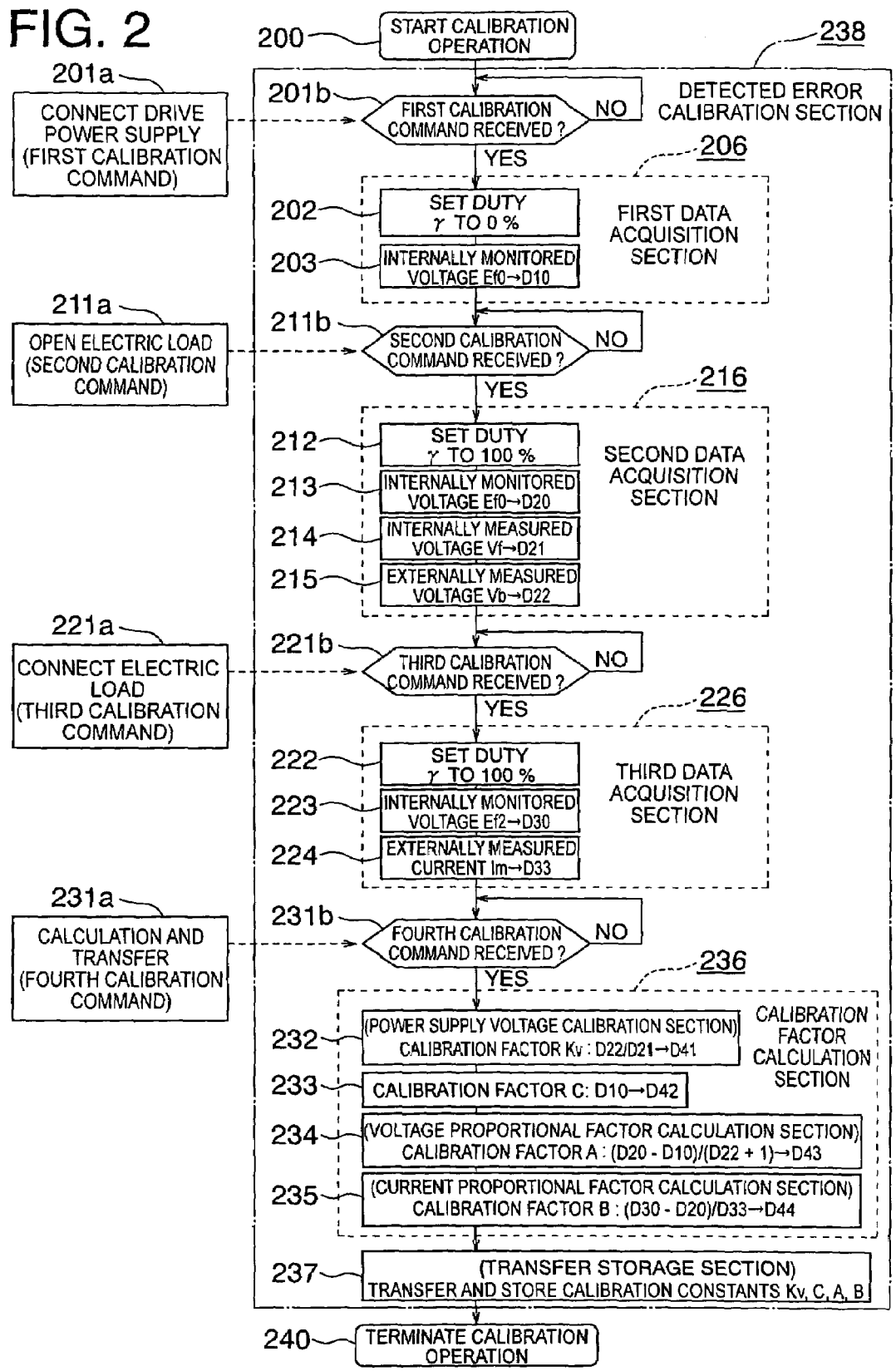
FIG. 2 is a flow chart illustrating a processing operation for calibration according to the first embodiment of the present invention.

Now, reference will be made to a specific operation for calibration according to the first embodiment of the present invention as illustrated in FIG. 1 while referring to a flow chart of FIG. 2. FIG. 2 illustrates a processing routine of a detected error calibration section 238 in the microprocessor 111A. In FIG. 2, steps 202, 203 together constitute a first data acquisition section 206 in the detected error calibration section 238.

Similarly, steps 212 through 215 together constitute a second data acquisition section 216, steps 222 through 224 together constitute a third data acquisition section 226, and steps 232 through 235 together constitute a calibration factor calculation section 236. In the calibration factor calculation section 236, the step 232 corresponds to the power supply voltage calibration section, the step 234 corresponds to the voltage proportional factor calculation section, and the step 235 corresponds to the current proportional factor calculation section. Also, step 237 corresponds to the transfer storage section.

On the other hand, step 201a is a process in which a first calibration command is generated by the external tool 990 after connection of the drive power supply 101, and this step relates to a determination step 201b in the detected error calibration section 238. Similarly, step 211a is a process in which a second calibration command is generated by the external tool 990 after disconnection of the electric load 107, and this step relates to a determination step 211b. Also, step 221a is a process in which a third calibration command is generated by the external tool 990 after reconnection of the electric load 107, and this step relates to a determination step 221b. Further, step 231a is a process in which a fourth calibration command is generated by the external tool 990 to instruct starting of arithmetic calculation and transfer, and this step relates to a determination step 231b.

In FIG. 2, first of all, the microprocessor 111A starts a calibration operation (step 200), and determines whether a first calibration command from the external tool 990 has been received (step 201b). When it is determined in step 201b that a first calibration command has not been received (that is, NO), the step 201b is repeatedly executed, and a stand-by state is held until a first calibration command is received.

When the first calibration command is generated, the prescribed drive power supply 101 is beforehand connected to the current control apparatus 100A (step 201a). When it is determined in step 201b that a first calibration command has been received (that is, YES), the control flow shifts to the first data acquisition section 206 where the energization duty γ of the feedback control output PWM is set to 0% (step 202). In addition, the monitored voltage Ef at this time is transferred, as the first error voltage Ef0, to a predetermined address in a memory, e.g., a data register D10 in the RAM memory 112 (step 203).

Then, it is determined whether a second calibration command from the external tool 990 has been received (step 211b), and when it is determined that a second calibration command has not been received (that is, NO), the step 211b is repeatedly executed, and a stand-by state is held until a second calibration command is received.

Here, note that when the second calibration command is generated, the circuit connected to the electric load 107 is disconnected with the prescribed drive power supply 101 being beforehand connected to the current control apparatus 100A (step 211a). When it is determined in step 211b that a second calibration command has been received (that is, YES), the control flow shifts to the second data acquisition section 216 where the energization duty γ of the feedback control output PWM is set to 100% (step 212).

Subsequently, the monitored voltage Ef at this time is set to the second error voltage Ef1, and transferred to a predetermined address in the memory, e.g., a data register D20 in the RAM memory 112 (step 213), and the value of the power supply monitoring voltage Vf at this time is transferred to data register D21 (step 214). Also, the value of the drive power supply voltage Vb input from the calibration digital voltmeter 992d through the external tool 990 is transferred to a data register D22 (step 215).

Then, it is determined whether a third calibration command from the external tool 990 has been received (step 221b), and when it is determined that a third calibration command has not been received (that is, NO), the step 221b is repeatedly executed, and a stand-by state is held until a third calibration command is received.

Here, note that when the third calibration command is generated, the electric load 107 is connected with the prescribed drive power supply 101 being beforehand connected to the current control apparatus 100A (step 221a). When it is determined in step 221b that a third calibration command has been received (that is, YES), the control flow shifts to the third data acquisition section 226 where the energization duty γ of the feedback control output PWM is set to 100% (step 222).

Subsequently, the monitored voltage Ef at this time is set to the measured voltage Ef2, and transferred to a predetermined address in the memory, e.g., a data register D30 in the RAM memory 112 (step 223). Also, the value of the external load current Im input from the calibration digital ammeter 991d through the external tool 990 is transferred to a data register D33 (step 224).

Then, it is determined whether a fourth calibration command from the external tool 990 has been received (step 231b), and when it is determined that a fourth calibration command has not been received (that is, NO), the step 231b is repeatedly executed, and a stand-by state is held until a fourth calibration command is received.

Here, note that when the fourth calibration command is generated, it is verified whether the first through third calibration commands in steps 201a, 211a and 221a have been generated (step 231a). When it is determined in step 231b that a fourth calibration command has been received (that is, YES), the control flow shifts to the calibration factor calculation section 236 where the power supply voltage calibration factor Kv is calculated from the values of the data registers transferred and stored in steps 214, 215 according to the following expression, then transferred to and written into a data register D41 (step 232: the power supply voltage calibration section).

$$Kv = Vb/Vf$$
$$= D22/D21 \rightarrow D41$$

The value of the power supply voltage calibration factor Kv corresponds to an inverse voltage division ratio that is obtained by dividing the total sum of the resistance values of the voltage dividing resistors 191b, 192b by the resistance value of the voltage dividing resistor 192b, and even if a designed theoretical value is used for such a factor, the influence on accuracy is small to an extent that can be ignored.

Subsequently, the value of the first error voltage Ef0 transferred and stored in step 203 is transferred to and written into a data register D42 as the offset component C (step 233). In addition, the voltage proportional constant A of the error component of the monitored voltage Ef is calculated from the values of the data registers transferred and stored in steps 213, 203, 215 according to the following expression, and the constant A thus calculated is then transferred to and written into a data register D43 (step 234: the voltage proportional factor calculation section).

$$A = (Ef1 - Ef0)/(Vb + Vd)$$
$$= (D20 - D10)/(D22 + 1) \rightarrow D43$$

Subsequently, the current proportional constant B of the monitored voltage Ef is calculated from the values of the data registers transferred and stored in steps 223, 213, 224 according to the following expression, and the current proportional constant B thus calculated is then transferred to and written into a data register D44 (step 235: the current proportional factor calculation section).

$$B = (Ef2 - Ef1)/Im$$
$$= (D30 - D20)/D33 \rightarrow D44$$

Finally, the respective calibration constants Kv, C, A, B calculated by the calibration factor calculation section 236 (steps 232 through 235) are transferred to and stored into the EEPROM 114A (step 237: the transfer storage section), and transfer verification collation (not shown) is executed, after which the calibration operation (FIG. 2) of the detected error calibration section 238 is terminated (step 240).

Now, reference will be made to a specific operation of pulse width modulation (PWM) control routine according to the first embodiment of the present invention as illustrated in FIG. 1 while referring to a flow chart of FIG. 3.

Figure 3:
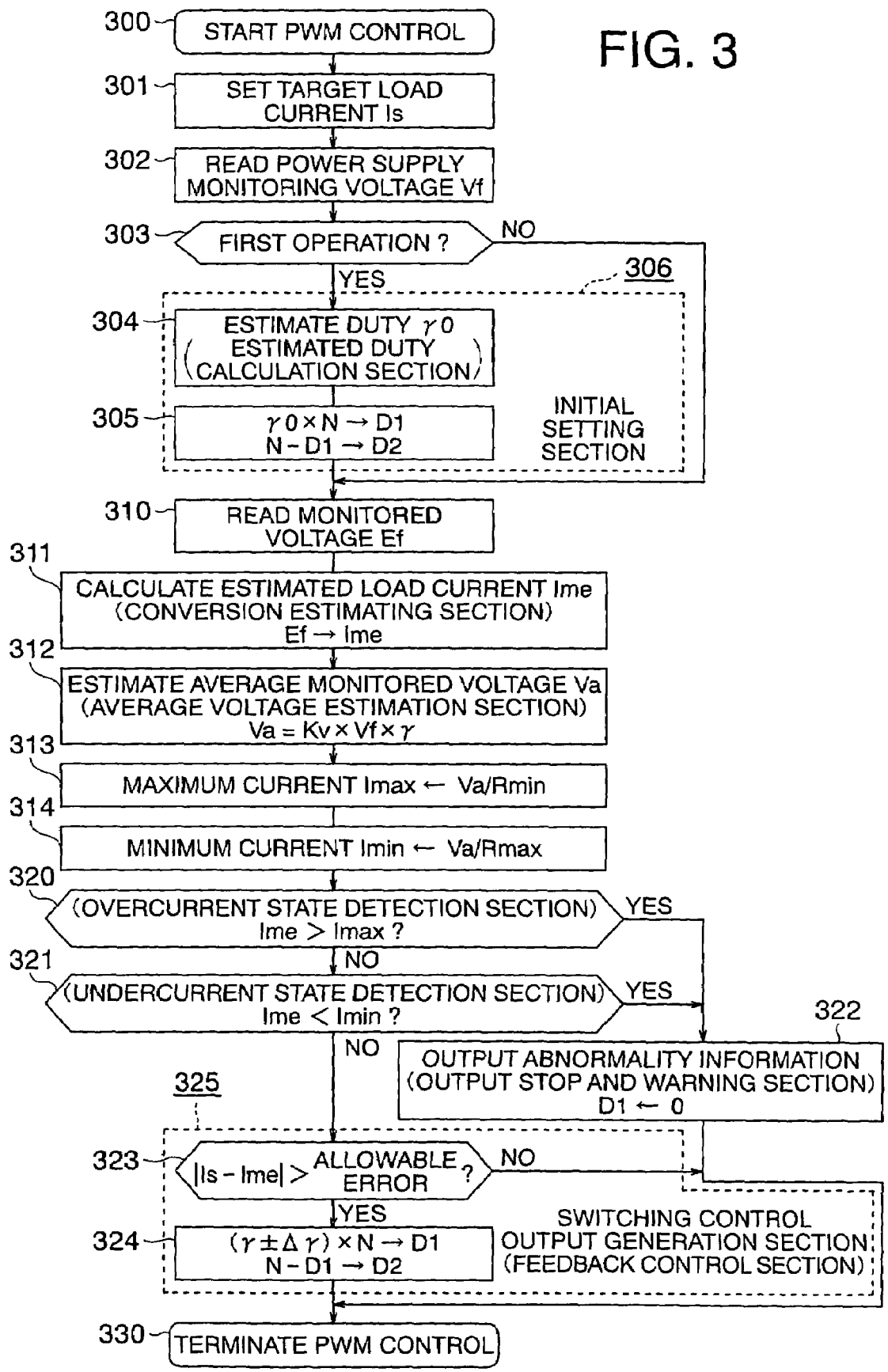
FIG. 3 is a flow chart illustrating a processing operation for a general control routine according to the first embodiment of the present invention.

In FIG. 3, step 304 corresponds to an estimated duty calculation section, and steps 304, 305 together constitute an initial setting section 306 in the microprocessor 111A. In addition, step 311 corresponds to the conversion estimating section, step 312 corresponds to the average voltage estimation section, and steps 320, 321 correspond to the overcurrent state detection section and the undercurrent state detection section, respectively. Further, step 322 corresponds to the output stop section, the abnormality warning section, and steps 323, 324 together constitute the switching control output generation section (feedback control section) 325.

The overcurrent state detection section (step 320) and the undercurrent state detection section (step 321) together constitute the abnormality determination section that generates an abnormality warning determination signal indicating an excessive largeness or smallness of the monitored voltage Ef and then shifts to step 322 when the relative relation between the monitored voltage Ef and the average monitored voltage Va varies exceeding the allowable variation range.

In response to the abnormality determination signal, an output stop and warning section (step 322) stops the feedback control output PWM, and provide a warning indication of the abnormally stopped state. Here, note that in FIG. 3, when an overcurrent state or an undercurrent state is detected in step 320 or 321, in either case, an output is stopped and an abnormality warning is issued in step 322.

However, the control flow can be changed such that in case of an overcurrent state, an output is stopped and abnormality is warned, and on the other hand, in case of an undercurrent state, an output is not stopped but an abnormality warning alone is issued.

In FIG. 3, first of all, the microprocessor 111A starts an operation for the feedback control output PWM as one of a multitude of operations in the control flow to be executed (step 300). Subsequently, the value of the target load current Is determined in another control flow operation (not shown) is read and set (step 301), and the present value of the power supply monitoring voltage Vf is read (step 302).

Then, referring to the operating state of a flag (not shown), it is determined whether the execution of the following control flow is the first operation after the start of the operation (step 303). When it is determined in step 303 that this is not the first operation (that is, NO), the control flow shifts to step 310 (to be described later), whereas when it is determined that this is the first operation (that is, YES), the control flow shifts to a processing step 304 in the initial setting section 306.

In step 304, the roughly estimated value γ0 of the energization duty is calculated from the above-mentioned expression (2) by using the value of the target load current Is read and set in step 301 and the standard resistance value Rc (=from Rmin to Rmax) in the form of a fixed constant stored beforehand in the FMEM 113A or the EEPROM 114A. Here, note that the value of the drive power supply voltage Vb in the expression (2) is calculated according to the following expression from the value of the power supply monitoring voltage Vf read in step 302 and the value of the power supply voltage calibration factor Kv that is a calibration constant.

$$Vb = kv \times Vf$$

As a result, the roughly estimated value γ0 of the energization duty is calculated by the following expressions.

$$\gamma 0 = (Is/Ir) \times (V\min/Vb)$$
$$= Is \times Rc/(Kv \times Vf)$$

However, in the above expressions, the reference load current Ir, the standard resistance value Rc and the drive power supply voltage Vb are respectively represented below by using the power supply voltage calibration factor Kv, the power supply monitoring voltage Vf, the minimum resistance value Rmin, the maximum resistance value Rmax, and a minimum value Vmin and a maximum value Vmax of the drive power supply voltage Vb.

$$Ir = V\min/Rc$$

$$Rc = R\min - R\max$$

$$Vb = Kv \times Vf = V\min - V\max$$

Subsequently, the roughly estimated value γ0 of the energization duty calculated in step 304 is multiplied by a predetermined magnification N, the integer part of which, i.e., "γ0×N", is stored in a data register D1 in the form of a memory of a specific address in the RAM memory 112, and a value of "N−D1" is stored in the data register D2 (step 305). Here, the value of the predetermined magnification N is set to one thousand (N=1000), for instance.

Thereafter, the value of the monitored voltage Ef input to the microprocessor 111A is read (step 310), and the value of the monitored voltage Ef thus read is substituted for the above-mentioned expression (8), so that the estimated load current Ime is converted and estimated by the following expression (step 311).

$$Ime = [Ef - A \times (Vb + Vd) \times \gamma - C]/B$$

$$(Vb = Kv \times Vf)$$

The roughly estimated value γ0 of the energization duty calculated in step 304 is used in the first operation as the value of the energization duty γ of the above expression used in step 311, but the energization duty γ is corrected in step 324 to be described later, so it always becomes the latest value at that time. In addition, the data stored in the nonvolatile data memory 114A are read and used as the values of the calibration constants A, B, C, Kv, and the value read in step 302 is used as the value of the power supply monitoring voltage Vf.

Subsequently, the average monitored voltage Va impressed to the electric load 107 is calculated by the following expression (step 312: the average voltage estimation section).

$$Va = \int V2 \cdot dt/\tau$$
$$= Vb \times \tau \text{ on}/\tau - Vd \times \tau \text{ off}/\tau$$
$$= (Vb + Vd) \times \gamma - Vd(Vd \approx 1[V])$$
$$\approx Kv \times Vf \times \gamma$$

In the above expressions, the value of the drive power supply voltage Vb and the value of the energization duty γ are the same as those used in step 311. However, the energization period τ is represented according to the following expression by using the turn-on duration τ on and the turn-off duration τ off.

$$\tau = \tau\text{on} + \tau\text{off}$$

Subsequently, the value of the average monitored voltage Va calculated in step 312 and the values of the minimum resistance value Rmin and the maximum resistance value Rmax of the electric load 107 stored in the FMEM 113A or the EEPROM 114A as fixed constants are read to calculate a maximum current Imax and a minimum current Imin (step 313 and step 314). Here, note that the maximum resistance value Rmax and the minimum resistance value Rmin are the upper and lower limit values of the electrical resistance of one electric load in consideration of its individual variation, a change in its environmental temperature, and a temperature rise of the electric load itself.

Then, a comparison is made between the estimated load current Ime calculated in step 311 and the maximum current Imax calculated in step 313 so as to determine whether the estimated load current Ime is greater than the maximum current Imax (step 320: the overcurrent state detection section). When it is determined as Ime>Imax in step 320 (that is, YES), it is assumed that an overcurrent state occurs, so abnormality warning output processing (step 322: the output stop and warning section) is executed and the processing routine of FIG. 3 is terminated (step 330).

On the other hand, when it is determined as Ime≦Imax in step 320 (that is, NO), it is assumed that no overcurrent state occurs, so a comparison is made between the estimated load current Ime and the minimum current Imin calculated in step 314 so as to determine whether the estimated load current Ime is less than the maximum current Imin (step 321: the undercurrent state detection section). When it is determined as Ime<Imin in step 321 (that is, YES), it is assumed that an undercurrent state occurs, so the control flow shifts to the abnormality warning output processing (step 322).

The output stop and warning section (step 322) set the value of the data register D1 for determination of the energization duty γ to "0", whereby the feedback control output PWM (the pulse width modulation control signal) from the microprocessor 111A (the feedback control section) to the switching element 121 is stopped, and an abnormality warning signal DSP is generated to operate the warning indicator 109. On the other hand, when it is determined as Ime≧Imin in step 321 (that is, NO), it is assumed that no undercurrent state exists, and the control flow shifts to the processing of the switching control output generation section 325 (the feedback control section).

In the switching control output generation section 325, a comparison is first made between the target load current Is set in step 301 and the estimated load current Ime calculated in step 311 so as to determine whether a comparison deviation |Is−Ime| between the target load current Is and the estimated load current Ime exceeds a predetermined value (allowable error) (step 323).

When it is determined as |Is−Ime|≦the allowable error in step 323 (that is, NO), it is assumed that the comparison deviation is minute (within the range of the allowable error), and the processing routine of FIG. 3 is terminated (step 330). On the other hand, when it is determined as |Is−Ime|>the allowable error in step 323 (that is, YES), the present energization duty γ is corrected to increase or decrease by a correction value Δγ in accordance with the relative magnitude and polarity (plus or minus) of the comparison deviation |Is−Ime| (step 324), and the processing routine of FIG. 3 is terminated (step 330).

Specifically, in step 324, the increased or decreased correction result "γ±Δγ" due to the correction value Δγ is multiplied by the predetermined magnification N, and the integer part of "γ±Δγ" is stored in the data register D1 in the form of a memory of a specific address in the RAM memory 112, and a value of "N−D1" is stored in the data register D2.

Here, note that in FIG. 3, when it is determined in step 323 that the comparison deviation |Is-Ime| is minute, or in the termination step 330 following the step 322 or 324, the stand-by processing is carried out. Accordingly, when the operation start step 300 is activated again after another control flow has been executed, the microprocessor 111A executes the control flow of steps 300 through 330 in a repeated manner. In addition, the switching control output generation section 325 comprising the steps 323, 324 constitutes the feedback control section that generates the feedback control output PWM under the pulse width modulation control.

Here, an overall outline of the control flow of FIG. 3 will be described.

First of all, the initial setting section 306 (steps 304, 305) makes a comparison between the reference load current Ir and the target load current Is at a stage where an appropriate energization duty γ due to the feedback control has not yet been determined, so that the roughly estimated value γ0 of the energization duty in the present drive power supply voltage Vb is thereby determined.

The conversion estimating section (step 311) calculates the estimated load current Ime based on the value of the measured monitored voltage Ef and the calibration constant, and acquires an accurate load current by excluding an individual variation of the current detection resistor 126 and a current detection error of the differential amplifier circuit part 150. The feedback control section 325 (steps 323, 324) makes a comparison between the target load current Is and the estimated load current Ime on the basis of this result, and if there exists a large deviation that exceeds an allowable error therebetween, the energization rate γ is increased or decreased (step 324), thereby making it possible to control the target load current Is and the estimated load current Ime so as to coincide with each other.

Next, considering the case where the overcurrent state detection section (step 320) determines an overcurrent state, such an overcurrent state is caused by a short circuit (load short circuit) between the positive and negative lead wires of the electric load 107, a layer-to-layer short circuit between windings, a ground fault accident between the positive phase wiring connected to the output terminal 108 and the ground line (or a vehicle body, the ground, etc.) connected to the ground terminal 104N, etc. According to the construction of FIG. 1, the overcurrent detection circuit 170 operates with respect to the short-circuit and ground fault accidents as referred to above, so double or duel abnormality detection processing is executed.

For instance, the output voltage E0 of the differential amplifier 151 is usually in a range of from 0 [V] to Vcc (e.g., 5 [V]), but when an overcurrent flows through the current detection resistor 126 due to a load short circuit, the output voltage E0 increases rapidly up to the drive power supply voltage Vb (e.g., from 10 [V] to 16 [V]). In this case, the comparison circuit 171 in the overcurrent detection circuit 170 detects the rapid increase of the output voltage E0 of the differential amplifier 151 and generates an abnormality warning signal.

However, since the monitored voltage Ef is limited by the voltage limiting diode 164 in the smoothing circuit 160 so as not to exceed the controlled power supply voltage Vcc, it is impossible to detect that the estimated load current Ime has come to be in an excessively large state. Accordingly, when the energization duty γ is relatively small and hence the maximum current Imax is not too large (Ime<Imax), the overcurrent state detection section (step 320) becomes effective or active, so the control flow shifts to abnormality warning output processing (step 322). Thus, it is possible to use the overcurrent detection section (step 320) as a ancillary double system together with the overcurrent detection circuit 170.

On the other hand, a break or open-circuit accident of the electric load 107 or its wiring, a power supply fault accident of the positive phase wiring and the like are given as the case where the undercurrent state detection section (step 321) determines an undercurrent state. In particular, in case where the output terminal 108 and the power supply terminal 104P are completely short-circuited with each other in the power supply fault accident of the positive phase wiring, the current flowing through the current detection resistor 126 becomes zero (0 [A]), so an alienation or difference occurs between the target current and the actual current, thus making it possible to easily detect an abnormal current state. Similarly, upon occurrence of an open-circuit accident, too, the current flowing through the current detection resistor 126 becomes zero (0 [A]), so an abnormal current state can be easily detected.

However, when a power supply fault accident occurs between a remote location of the positive phase wiring extending from the output terminal 108 to the electric load 107 and a remote location of the power supply wiring extending from the power supply terminal 104P to the drive power supply 101, there is formed a parallel circuit having the resistance value R0 of the wiring and the resistance value R1 of the current detection resistor 126, so the current flowing through the current detection resistor 126 decreases at a ratio of "R0/(R0+R1)". In this case, there is a possibility that an abnormal current state cannot be detected only by simply comparing the actual current with the target current.

For instance, if the target current is less than or equal to a branch current Ix to the current detection resistor 126 when the switching element 121 is made fully conductive with the occurrence of a power supply fault accident due to the resistance value R0, it is possible to perform feedback control in such a manner that the actually measured value is made coincident with the target value. As a result, there occurs no alienation or divergence between the target value and the measured value, thus making it impossible to detect an abnormal current state.

However, in the determination processing (steps 320, 321) in FIG. 3, the present average monitored voltage Va impressed to the electric load 107 is estimated, and the minimum current Imin and the maximum current Imax are calculated from the maximum resistance value Rmax and the minimum resistance value Rmin of the electric load 107, whereby it is determined whether the minimum current Imin and the maximum current Imax flow through the current detection resistor 126. Consequently, an abnormal current state can be determined at a high degree of precision on the basis of a highly reliable determination criterion or reference.

Although in the above steps 320, 321, the estimated load current Ime is compared with the maximum load current Imax and the minimum load current Imin, other parameters corresponding to the current value may instead be used. For instance, the maximum load current Imax and the minimum load current Imin calculated in steps 313, 314 can be converted into the corresponding output voltages E0 of the differential amplifier circuit part 150 to provide a maximum monitoring voltage Emax and a minimum monitoring voltage Emin, whereby the monitored voltage Ef can be compared with the maximum monitoring voltage Emax and the minimum monitoring voltage Emin. In short, it only needs to determine that there exist no abnormal alienation or divergence in the relative relation between the monitored voltage Ef and the average monitored voltage Va (estimated value).

Now, reference will be made to a specific operation of an interrupt control (regular interrupt) routine according to the first embodiment of the present invention as illustrated in FIG. 1 while referring to a flow chart of FIG. 4.

Figure 4:
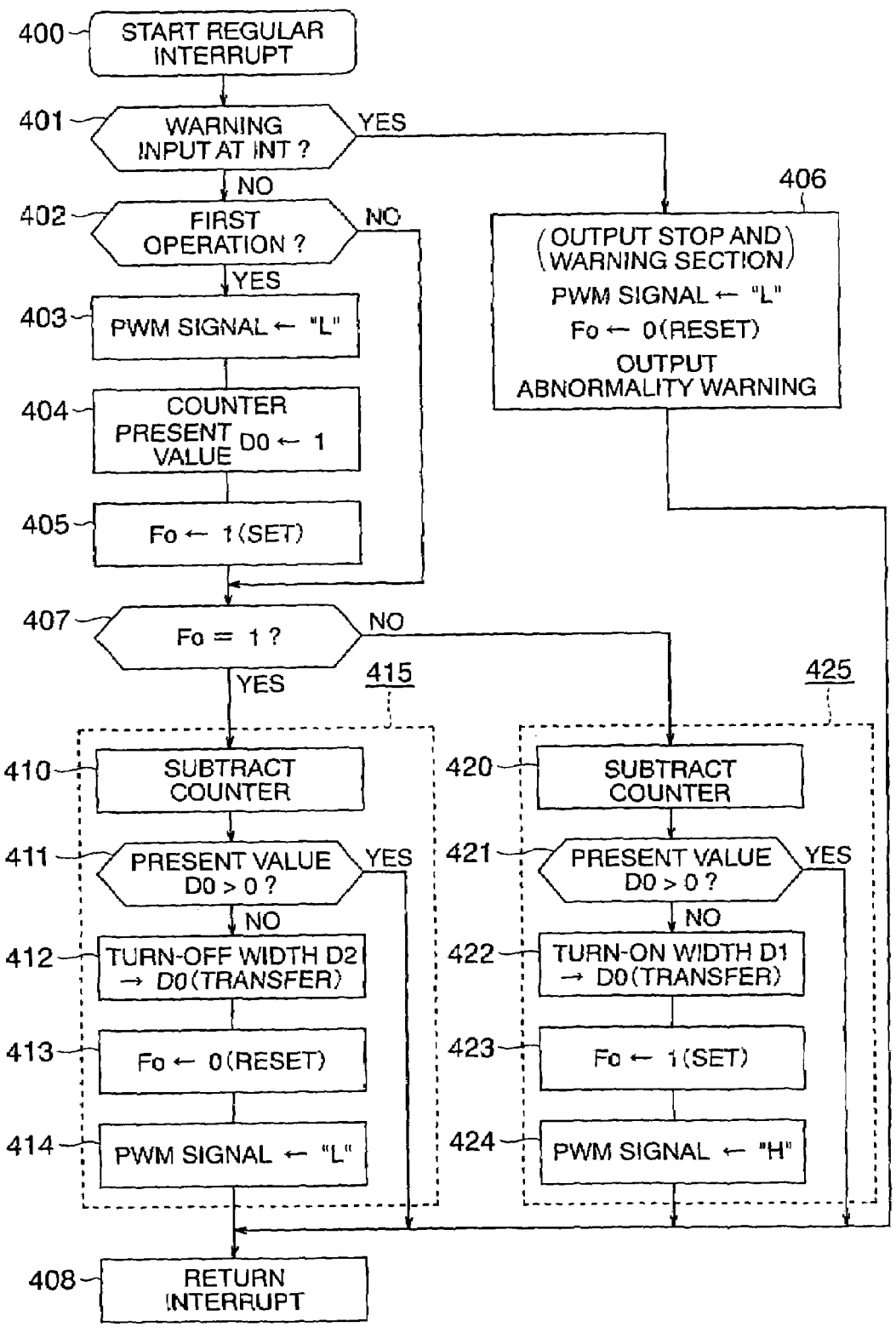
FIG. 4 is a flow chart illustrating a control operation for an interrupt control routine according to the first embodiment of the present invention.

In FIG. 4, step 406 corresponds to the output stop and warning section. Also, an operation step 415 comprising steps 410 through 414 is executed from a time point at which an output flag Fo is set (step 423) to a time point at which the output flag Fo is reset (step 413), and the period of execution thereof depends on the value of the data register D1 set in step 422, and corresponds to a duration for which the logical level of the feedback control output PWM is high ("H").

On the other hand, an operational step 425 comprising steps 420 through 424 is executed from the time point at which the output flag Fo is reset (step 413) to a time point at which the output flag Fo is set (step 423). This period of execution depends on the value of the data register D2 set in step 412, and corresponds to a duration for which the logical level of the feedback control output PWM is low ("L").

First of all, the microprocessor 111A starts a regular interrupt operation in which it is activated substantially at a fixed or constant time interval (step 400), checks an input operation to the interrupt input terminal INT by the overcurrent detection circuit 170, and determines whether there is a warning input of an abnormality warning signal (step 401).

When it is determined in step 401 that there is a warning input from the overcurrent detection circuit 170 to the interrupt input terminal INT (that is, YES), the control flow shifts to the abnormality warning processing (step 406) of the output stop and warning section.

In step 406, the logic level of the feedback control output PWM is set to low ("L"), and the output flag Fo is reset to zero ("0"), and an abnormality warning signal DSP is generated to activate the warning indicator 109. Subsequently, the interrupt routine of FIG. 4 is terminated, and a return is performed to the original control step at an interrupt starting time point (step 408).

On the other hand, when it is determined in step 401 that there is no warning input to the interrupt input terminal INT (that is, NO), it is then determined whether the present processing is the first operation after the start of operation of the microprocessor 111A (step 402).

When it is determined in step 402 that the present processing is not the first operation (that is, NO), the control flow shifts to flag determination processing (step 407) to be described later, whereas when it is determined that the present processing is the first operation (that is, YES), the logical level of the feedback control output PWM is set to "L" (step 403), and the present value of the subtraction counter (register) D0 for the calculation of interruption frequency (the number of interrupts) is set to "1" (step 404), and the output flag Fo is further set to "1 (ON)" (step 405).

Then, referring to the output flag Fo, it is determined whether the processing of step 405 (or step 423 to be described later) has already been executed, i.e., whether the output flag Fo has been set to "1" (step 407). When determined as Fo=1 in step 407 (that is, YES), the present value of the subtraction counter (register) D0 is decremented (subtracted by 1) (step 410).

Subsequently, it is determined whether the present value of the subtraction counter (register) D0 still exceeds "0" (step 411), and when determined as D0>0 (that is, YES), the control flow shifts to interrupt return processing (step 408).

In addition, when the present value of the subtraction counter (register) D0 becomes "0" and it is determined as D0≦0 in step 411 (that is, NO), the value of the data register D2 set in the above step 305 (see FIG. 3) (or step 324) (the turn-off width of the feedback control output PWM) is transferred to the register D0 (step 412).

Subsequently, the output flag Fo set in step 405 (or step 423) is reset to "0" (step 413), and the logical level of the feedback control output PWM is further set to "L" (step 414), after which the control flow shifts to the interrupt return processing (step 408).

On the other hand, when the output flag Fo is reset and hence it is determined as Fo=0 in step 407 (that is, NO), the present value of the subtraction counter (register) D0 for the calculation of interruption frequency is decremented (subtracted by 1) (step 420).

Subsequently, it is determined whether the present value of the register D0 still exceeds "0" (step 421), and when determined as D0>0 (that is, YES), the control flow shifts to the interrupt return processing (step 408). On the other hand, when it is determined as D0≦0 in step 421 (that is, NO), the value of the data register D1 set in the above step 305 (or step 324) (the period for which the logical level of the feedback control output PWM is "H": the turn-on width) is transferred to the register D0 (step 422).

Subsequently, the output flag Fo reset in step 413 is set to "1" (step 423), and the logical level of the feedback control output PWM is further set to "H" (step 424), after which the control flow shifts to the interrupt return processing (step 408).

As is clear from the above explanation, the current control apparatus 100A (see FIG. 1) according to the first embodiment of the present invention serves to feed electric power from the drive power supply 101 to the electric load 107 through the feeder circuit comprising the switching element 121 and the current detection resistor 126 connected with each other in this order, and at the same time is provided with the differential amplifier circuit part 150 and the microprocessor 111A, which includes the nonvolatile program memory (FMEM) 113A, the nonvolatile data memory (EEPROM) 114A, the RAM memory 112 for arithmetic operation and the multichannel AD converter 115, in order to control the on/off ratio of the switching element 121 in such a manner that the current (load current Im) detected by the current detection resistor 126 is made coincident with the target load current Is.

In addition, the microprocessor 111A constitutes the detected error calibration section 238 (see FIG. 2), the conversion estimating section (step 311 in FIG. 3), and the feedback control section 325 (steps 323, 324). The detected error calibration section 238 is provided with the first through third data acquisition sections 206, 216, 226, the calibration factor calculation section 236 (steps 232 through 235) including the power supply voltage calibration section (step 232), and the transfer storage section (step 237).

The differential amplifier circuit part 150 amplifies the difference voltage between the voltages at the opposite ends of the current detection resistor 126 connected between the switching element 121 and the electric load 107 by means of the differential amplifier 151, generates the monitored voltage Ef substantially proportional to the energization current (load current Im) to the electric load 107, and inputs it to the microprocessor 111A. Moreover, the detected error calibration section 238 is executed or operated, at the time when the product is adjusted for shipment, to measure the current proportional constant B of the monitored voltage Ef due to the differential amplifier circuit part 150, the voltage proportional constant A of the error component, and the offset component C, and to store them into the EEPROM 114A as the calibration constants.

The conversion estimating section (step 311) calculates the estimated load current Ime based on the monitored voltage Ef and the above calibration constants. The feedback control section 325 (steps 323, 324) controls the energization duty γ in the form of the ratio of the closed circuit duration to the switching period of the switching element 121 by setting the target load current Is and the estimated load current Ime as the target value and the feedback value, respectively. In addition, the functions of at least the detected error calibration section 238, the conversion estimating section 311 and the feedback control section 325 are executed by the microprocessor 111A based on the control program stored in the FMEM 113A.

The feeder circuit includes the commutating diode 127, and the differential amplifier circuit part 150 includes the bias correction circuit 158. The current detection resistor 126 is connected between the electric load 107 and the switching element 121. The commutating diode 127 is connected in parallel to the serial circuit comprising the current detection resistor 126 and the inductive electric load 107 in such a polarity that permits a continued transient-decay current due to the inductance of the electric load 107 to be returned or fed back when the switching element 121 is opened or turned off.

The bias correction circuit 158 in the differential amplifier circuit part 150 impresses a substantially equal, positive bias voltage to the first and second inputs of the differential amplifier 151 so as to cancel a negative voltage impressed thereto due to a voltage drop of the commutating diode 127 upon opening of the switching element 121, thereby inhibiting the negative voltage input from being impressed to the differential amplifier 151. That is, the bias correction circuit 158 serves to cancel the negative voltage input generated resulting from nonprovision of the current detection resistor 126 at the side of the ground terminal 104N, thereby making it unnecessary for the differential amplifier 151 and the multichannel AD converter 115 to handle a positive and a negative voltage.

Further, the current control apparatus 100A is provided with the power supply voltage measuring circuit including the voltage dividing resistors (the voltage dividing circuit) 191$b$, 192$b$, and the power supply voltage measuring circuit serves to divide the drive power supply voltage Vb of the drive power supply 101 by means of the voltage dividing resistors 191$b$, 192$b$, and input the thus divided voltage to the microprocessor 111A as the power supply monitoring voltage Vf. Though the multichannel AD converter 115 is built into the microprocessor 111A in FIG. 1, it may be installed as an external element.

The first data acquisition section 206 in the detected error calibration section 238 acts to write and store, into the RAM memory 112 as the first error voltage Ef0, the value of the monitored voltage that is generated from the differential amplifier circuit part 150 with the switching element 121 fully opened when the first calibration command is input upon impression of the drive power supply voltage Vb of the prescribed drive power supply 101 to the current control apparatus 100A.

The second data acquisition section 216 acts, upon input of the second calibration command with the feeder circuit to the electric load 107 being interrupted, to write and store, into the RAM memory 112 as the second error voltage Ef1, the value of the monitored voltage that is generated from the differential amplifier circuit part 150 with the switching element 121 being made fully conductive, and to take in the value of the drive power supply voltage Vb of the drive power supply 101 measured on the outside to write and store it into the RAM memory 112.

The third data acquisition section 226 acts, upon input of the third calibration command with the feeder circuit to the electric load 107 being connected, to write and store, into the RAM memory 112 as the measured voltage Ef2, the value of the monitored voltage that is generated from the differential amplifier circuit part 150 with the switching element 121 being made fully conductive, and to take in the value of the external load current Im measured on the outside to write and store it into the RAM memory 112.

The calibration factor calculation section 236 (steps 232 through 235) calculates and stores the current proportional constant B, the voltage proportional constant A of the error component, and the offset component C by using the energization duty γ of the switching element 121 and the voltage drop Vd (≈1 [V]) of the commutating diode 127 in such a manner that the relation among the monitored voltage (average value) Ef due to the differential amplifier circuit part 150, the drive power supply voltage Vb and the external load current Im satisfies the following expression.

$$Ef = A \times (Vb + Vd) \times \gamma + B \times Im + C$$

Here, note that the offset component C coincides with the first error voltage Ef0 stored by the first data acquisition section 206, and the voltage proportional constant A is calculated from the data acquired by the first and second data acquisition sections 206, 216 according to the following expression.

$$A = (Ef1 - Ef0)/(Vb + Vd)$$

Furthermore, the current proportional constant B is calculated from the data acquired by the second and third data acquisition sections 216, 226 according to the following expression.

$$B = (Ef2 - Ef1)/Im$$

The power supply voltage calibration section (step 232) is executed in the first through third data acquisition sections 206, 216, 226 to write and store the power supply monitoring voltage Vf into the RAM memory 112, and to calculate the power supply voltage calibration factor Kv according to the following expression.

$$Kv = Vb/f$$

Alternatively, the power supply voltage calibration section (step 232) applies, as the power supply voltage calibration factor Kv, the fixed constant which is preset as the reciprocal of the voltage division ratio with respect to the drive power supply voltage Vb.

Finally, the transfer storage section (step 237) in the detected error calibration section 238 transfers and stores, into the EEPROM 114A as calibration constants, the respective values of the voltage proportional constant A, the current proportional constant B, the offset component C, and the power supply voltage calibration factor Kv, all of which are the calculation results of the calibration factor calculation section 236.

As a result, the calibration constants according to individual factors can be calculated and stored systematically and efficiently, so the calibration operation can be easily performed by the addition of facile automation equipment in a production line to mass-produced products. In addition, by calculating the drive power supply voltage Vb from the value of the power supply monitoring voltage Vf in an accurate manner, it is possible to use the drive power supply voltage Vb thus calculated for other purposes such as, for example, calibration of the conversion characteristic of the multichannel AD converter 115 in the microprocessor 111A which is in operation.

Moreover, the current control apparatus 100A is provided with the serial communication interface circuit 116 that connects between the external tool 990 for calibration operation and the microprocessor 111A, so a calibration command in the calibration operation, voltage information on the drive power supply 101, load current information and so on can be input from the external tool 990, transferred and stored into the RAM memory 112. Accordingly, measured values according to measuring instruments for highly accurate calibrating can be transferred to the RAM memory 112 in the current control apparatus as digital data without being processed, whereby the reliability of current control can be improved.

Further, the nonvolatile program memory (FMEM) 113A includes a program to constitute the conversion estimating section (step 311 in FIG. 3) that calculates the estimated load current Ime, and the switching control output generation section (the feedback control section) 325 (steps 323, 324) of the switching element 121. The conversion estimating section (step 311) calculates the estimated load current Ime from the monitored voltage Ef generated by the differential amplifier circuit part 150 and the present energization duty γ of the switching element 121 according to the following expression.

$$Ime=[Ef-A\times(Vb+Vd)\times\gamma-C]/B$$

Moreover, the switching control output generation section 325, which constitutes the feedback control section, gradually increases or decreases the energization duty γ of the switching element 121 in response to the deviation between the target load current Is and the estimated load current Ime. As a result, the microprocessor 111A corrects errors generated by the current detection resistor 126 or the differential amplifier circuit part 150 in doing feedback control so as to make the estimated load current Ime coincide with the target load current Is, whereby highly accurate current control can be achieved by the use of inexpensive circuit components.

Further, the nonvolatile program memory (FMEM) 113A includes the program that constitutes the initial setting section 306 (steps 304, 305), and the initial setting section 306 calculates the roughly estimated value γ0 of the energization duty of the switching element 121 from the relation among the minimum power supply voltage Vmin, the reference load current Ir, the power supply monitoring voltage Vf and the target load current Is by using the following expression, and sets it as an energization duty immediately after starting of the energization (supply of power).

$$\gamma 0=(Vmin/Vb)\times(Is/Ir)(here, Vb=Kv\times Vf)$$

Also, the reference load current Ir is calculated according to the following expression by using the standard resistance value Rc, which is determined to be within the resistance value variation range (from Rmin to Rmax) of the electric load 107.

$$Ir=Vmin/Rc$$

As a result, at the start of operation, the target load current Is can be reached quickly.

As described above, the current control apparatus 100A feeds electric power from the drive power supply 101 to the electric load 107 through and in the order of the switching element 121 and the current detection resistor 126, so that the on/off ratio of the switching element 121 is controlled so as to make the current detected by the current detection resistor 126 coincide with the target load current to the electric load 107. To this end, the current control apparatus 100A includes: the microprocessor 111A having the FMEM 113A, the EEPROM 114A, the RAM memory 112 and the multichannel AD converter 115; the control power supply 110 that is fed with power from the drive power supply 101 to generate the stabilized control power supply voltage Vcc, which is lower than the drive power supply voltage Vb, and supply it to the microprocessor 111A; the differential amplifier circuit part 150; the overcurrent detection circuit 170; and the warning indicator (abnormality warning section) 109. In addition, the microprocessor 111A constitutes the conversion estimating section (step 311), the feedback control section 325 (steps 323, 324), and the output stop section (step 406).

The differential amplifier circuit part 150 has the differential amplifier 151 for amplifying the difference voltage between the voltages at the opposite ends of the current detection resistor 126, and it is operated, upon impression of the drive power supply voltage Vb to the electric load 107 as a power supply voltage, to generate the monitored voltage Ef substantially proportional to the energization current to the electric load 107 and input it to the microprocessor 111A. The conversion estimating section 311 calculates the estimated load current Ime from the value of the monitored voltage Ef, and the feedback control section 325 controls the energization duty γ of the switching element 121 by setting the target load current Is and the estimated load current Ime as the target value and the feedback value, respectively.

When the value of the prestage voltage E0 of the monitored voltage Ef obtained from the differential amplifier circuit part 150 exceeds the predetermined value that is equal to or greater than the controlled power supply voltage Vcc, the overcurrent detection circuit 170 generates an overcurrent determination signal and inputs it to the microprocessor 111A, and serves to limit the monitored voltage Ef, which is input to the microprocessor 111A through the voltage limiting diode 164, to the level of the controlled power supply voltage Vcc. In response to an abnormality determination signal, the output stop section 406 and the warning indicator (abnormality warning section) 109 stop the feedback control output PWM of the microprocessor 111A, and indicate a warning of the abnormally stopped state. In the above construction, the switching element 121 and the current detection resistor 126 are connected with each other in a mutually adjacent relation, so special wiring to the electric load 107 can be eliminated.

Moreover, in the above-mentioned feeder circuit construction in which a burnout preventive measure against a short-circuit malfunction of the wiring or the electric load 107 is simplified by the current limiting function of the current detection resistor 126, it is possible to prevent the burnout of the switching element 121 or the current detection resistor 126 by quickly detecting a short-circuit accident of the electric load 107 or the load wiring at a location outside the microprocessor 111A.

Further, it is possible to prevent reduction in control accuracy by adjusting the monitored voltage Ef during the normal operation to a sufficiently large value within the range of the controlled power supply voltage Vcc.

Furthermore, a warning signal from the overcurrent detection circuit 170 is impressed to the interrupt input terminal INT of the microprocessor 111A, so that the output stop section 406 is operated in immediate response to an overcurrent determination signal. Accordingly, the feedback control output PWM of the microprocessor 111A can be quickly stopped in immediate response to the occurrence of abnormality.

Besides, the FMEM 113A includes a program that constitutes the average voltage estimation section 312, at least one of the overcurrent state detection section 320 and the undercurrent state detection section 321, the output stop section 322, and the abnormality warning section. The average voltage estimation section 312 calculates the product of the energization duty $\gamma$ of the switching element 121 and the drive power supply voltage Vb as the average monitored voltage Va (estimated value).

The overcurrent state detection section 320 performs an abnormality determination when the relative relation between the monitored voltage Ef and the average monitored voltage Va varies exceeding an allowable variation range to indicate an excessively large state of the monitored voltage Ef, whereas the undercurrent state detection section 321 performs an abnormality determination when the relative relation between the monitored voltage Ef and the average monitored voltage Va varies exceeding an allowable variation range to indicate an excessively small state of the monitored voltage Ef.

In response to an occurrence of abnormality of the overcurrent state detection section 320 or the undercurrent state detection section 321, the output stop section 322 and the warning indicator (abnormality warning section) 109 stop the feedback control output PWM of the microprocessor 111A, and indicate a warning of the abnormally stopped state.

As described above, the switching element 121 and the current detection resistor 126 are connected with each other in a mutually adjacent relation, so special wiring to the electric load 107 can be reduced, and besides, in the feeder circuit construction in which a burnout preventive measure at the time of a short-circuit malfunction is simplified by the current limiting function of the current detection resistor 126, an open-circuit or break of the electric load 107 or a power supply fault, open-circuit or break of the load wiring can be detected accurately by using the undercurrent state detection section 321, so that an abnormal state can be properly warned.

Moreover, in a state where the energization duty $\gamma$ is relatively small, it is possible to detect an overcurrent state due to a short-circuit of the electric load 107 or a ground fault accident of the wiring by using the overcurrent state detection section 320, whereby a backup function for the overcurrent detection circuit 170 can be achieved.

Embodiment 2

Figure 5:
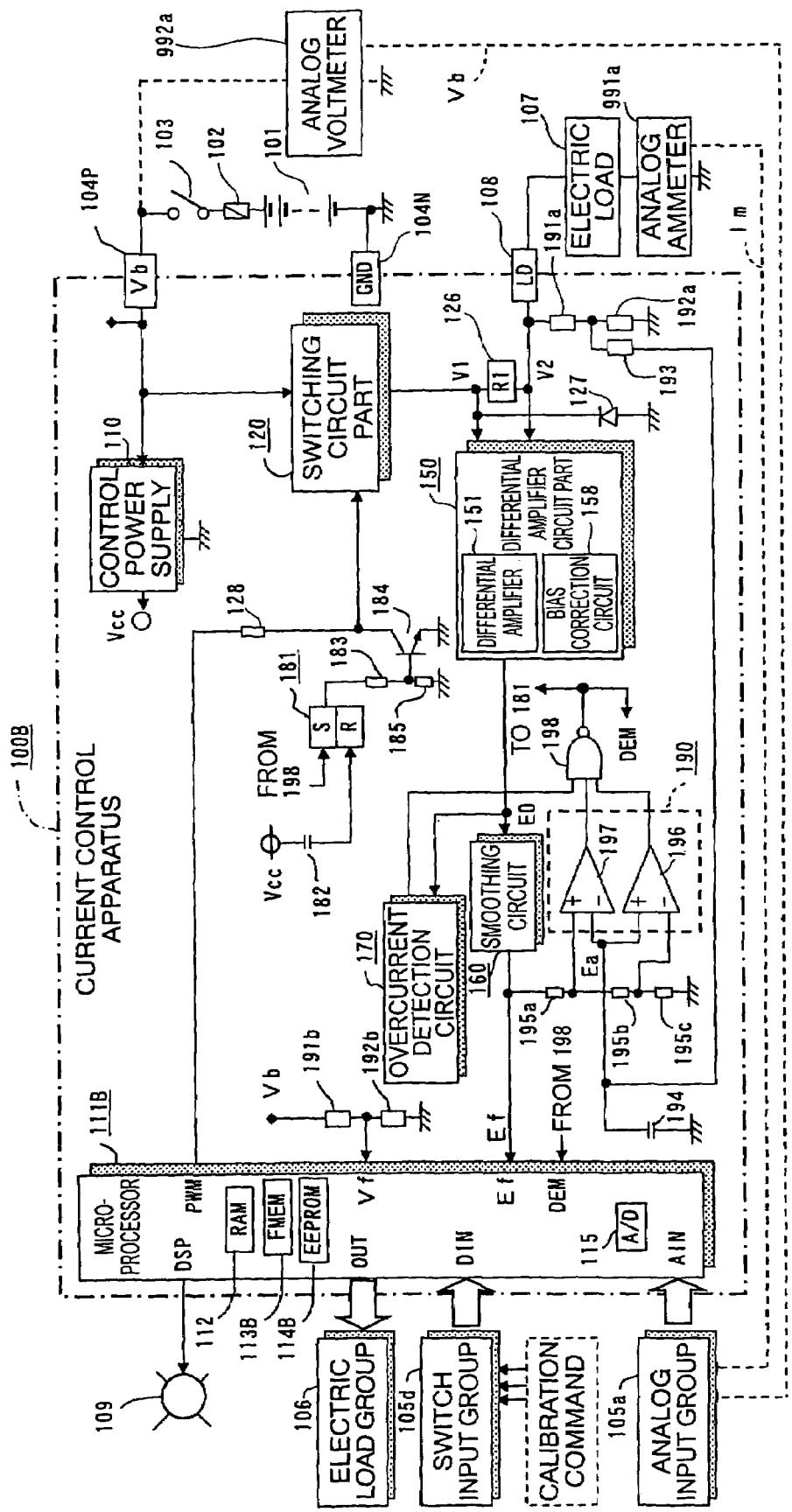
FIG. 5 is a block diagram showing the overall construction of a current control apparatus for an electric load according to a second embodiment of the present invention.

In the above-mentioned first embodiment (see FIG. 1), a warning signal from the overcurrent detection circuit 170 is impressed to the interrupt input terminal INT, but as shown in FIG. 5, the switching element 121 can be made nonconductive at once through an abnormality occurrence storage circuit 181 that responds to the warning signal, and an abnormality warning determination signal can be impressed to an input terminal DEM of a microprocessor 111B.

Hereinafter, a second embodiment of the present invention will be described with emphasis placed on its differences from the above-mentioned first embodiment as shown in FIG. 1 while referring to the accompanying drawings.

FIG. 5 is a circuit block diagram that shows the overall construction of a current control apparatus for an electric load according to the second embodiment of the present invention, and the parts or components same as those described above (FIG. 1) are identified by the same symbols or by the same symbols with "B" affixed to their ends, while omitting a detailed explanation thereof.

In FIG. 5, the current control apparatus 100B includes, similar to the one 100A as described above, a microprocessor 111B which is fed with electric power from a control power supply 110, a switching circuit part 120, a differential amplifier circuit part 150, a smoothing circuit 160, an overcurrent detection circuit 170 and so on, and the apparatus 100B is accommodated in a sealed casing (not shown).

In this case, an analog ammeter 991a and an analog voltmeter 992a both for calibration are used in place of the above-mentioned digital ammeter 991d and digital voltmeter 992d (see FIG. 1). In addition, external equipment connected to the current control apparatus 100B is similar to the above-mentioned one (see FIG. 1) except for omission of the external tool 990.

That is, the current control apparatus 100B is provided with a power supply terminal 104P, a ground terminal 104N, and an output terminal 108, and the external equipment includes a drive power supply 101, a fuse 102, a power supply switch 103, a switch input group 105d, an analog input group 105a, an electric load group 106, an electric load 107, and a warning indicator (abnormality warning section) 109, all of which are connected to the current control apparatus 100B.

In the current control apparatus 100B, the microprocessor 111B, being fed with a controlled power supply voltage Vcc from the control power supply 110, includes, as stated above, a RAM memory 112 for arithmetic operation, an FMEM 113B, an EEPROM 114B, and a multichannel AD converter 115, all of which operate in cooperation with one another.

In this case, the microprocessor 111B includes a processing program that is substantially similar to the one incorporated in the above-mentioned microprocessor 111A but with a part thereof being changed therefrom, so the contents of the nonvolatile program memory (FMEM) 113B and the nonvolatile data memory (EEPROM) 114B are changed. The above-mentioned SIF 116 is omitted here, and the microprocessor 111B is provided with the input terminal DEM in place of the above-mentioned interrupt input terminal INT.

In a calibration operation before shipment of a product, a calibration command is supplied to the microprocessor 111B from an input switch of a predetermined number among the switch input group 105d through a digital input port DIN. As a result, an output signal (external load current Im) of the analog ammeter 991a for calibration connected in series to the electric load 107 and an output signal (drive power supply voltage Vb impressed to the power supply terminal 104P) of the analog voltmeter 992a for calibration connected to the drive power supply 101 are supplied from the input terminal of the predetermined number among the analog input group 105a to the microprocessor 111B to be transferred to the RAM memory 112.

The current control apparatus 100B includes, as additional components, an abnormality occurrence storage circuit 181 comprising a flip-flop circuit with a set input S and a reset input R, an initialization capacitor 182 connected to the reset input R, a drive resistor 183 connected to an set output, a transistor 184 with a grounded emitter and a collector terminal connected to a junction between a drive resistor 128 and the switching circuit part 120, and a stabilization resistor 185 connected between a junction between the drive resistor 183 and a base terminal of the transistor 184 and the ground.

Moreover, the current control apparatus 100B is provided with voltage dividing resistors 191*a*, 192*a* inserted between the output terminal 108 and the ground, and a serial resistor 193 and a smoothing capacitor 194 for extracting a detected voltage of the voltage dividing resistors 191*a*, 192*a* as an average measured voltage Ea (corresponding to an average monitored voltage Va). The voltage dividing resistors 191*a*, 192*a*, the serial resistor 193, and the smoothing capacitor 194 together constitute an average voltage measuring circuit.

Further, the current control apparatus 100B includes voltage dividing resistors 195*a*, 195*b*, 195*c* inserted in series between the smoothing circuit 160 and the ground for dividing the monitored voltage Ef, comparison circuits 196, 197 that compare the respective divided voltages of the voltage dividing resistors 195*a*, 195*b*, 195*c* with the average measured voltage Ea, and a NAND circuit (NAND output element) 198 that takes a logical product of an output signal of the comparison circuits 196, 197 and an output signal of the overcurrent detection circuit 170.

The comparison circuits 196, 197 together constitute an abnormal current state detection circuit (abnormality determination section) 190, and one comparison circuit 196 constitutes an overcurrent state detection circuit, and the other comparison circuit 197 constitutes an undercurrent state detection circuit. In addition, an output signal of the NAND output element 198 is input to the input terminal DEM of the microprocessor 111B, and at the same time to the set input S of the abnormality occurrence storage circuit 181.

Moreover, although FIG. 5 shows the case where the abnormal current state detection circuit 190 includes both of the comparison circuits 196, 197 (overcurrent state detection circuit and undercurrent state detection circuit), the abnormal current state detection circuit 190 needs only to include at least one of the comparison circuits 196, 197.

For instance, the microprocessor 111B activates an output stop and warning section (step 622 in FIG. 6) to be described later in response to an abnormality determination signal (overcurrent state determination signal) when an overcurrent state is determined at least by the comparison circuit 196.

The output voltage E0 of the differential amplifier 151 is a prestage voltage for the monitored voltage Ef input to the microprocessor 111A, as stated above, and a voltage obtained by dividing the prestage voltage E0 by the serial resistor 161 and the parallel resistor 163 in the smoothing circuit 160 becomes the monitored voltage Ef. Further, as shown in FIG. 1, in the overcurrent detection circuit 170, the divided voltage Ec of the prestage voltage E0 due to the input resistor 173 and the voltage dividing resistor 174 is impressed to an inverting input of the comparison circuit 171. The comparison circuit 171 in the overcurrent detection circuit 170 is operated by the drive power supply voltage Vb, similar to the differential amplifier 151, and a non-inverting input terminal (+) of the comparison circuit 171 is connected to the power supply line of the controlled power supply voltage Vcc.

Furthermore, as stated above, the prestage voltage E0 usually changes between 0 [V] and Vcc (Vcc=5 [V]) depending on the magnitude of a load current flowing through the electric load 107, but upon occurrence of an abnormality such as a short-circuit accident, etc., the prestage voltage E0 rises up to Vb (=10 [V]-16 [V]). Thus, a voltage limiting diode 175 (see FIG. 1) is provided in the overcurrent detection circuit 170 so as to limit a voltage impressed to an input terminal of the NAND output element 198 to the controlled power supply voltage Vcc or less.

However, the voltage limiting diode 175 can be omitted by using the controlled power supply voltage Vcc as the power supply voltage of the comparison circuit 171 (see FIG. 1) in the overcurrent detection circuit 170, and by setting the voltage impressed to the non-inverting input terminal of the comparison circuit 171 to a value (e.g., about DC 4 [V]) slightly lower than the controlled power supply voltage Vcc.

In FIG. 5, the overcurrent detection circuit 170 has its output terminal connected to a first input terminal of the NAND output element 198. The voltage dividing resistors 195*a*, 195*b*, 195*c* are connected in series with one another to divide the monitored voltage Ef into a first voltage and a second voltage, and a relative magnitude relation between the first divided voltage at a junction between the voltage dividing resistor 195*a* and the voltage dividing resistor 195*b* and the second divided voltage at a junction between the voltage dividing resistor 195*b* and the voltage dividing resistor 195*c* is as follows: the first divided voltage>the second divided voltage.

In the comparison circuit 196 constituting the overcurrent state detection circuit, the average measured voltage Ea is impressed to a non-inverting input terminal (+) of the comparison circuit 196, and the second divided voltage of the monitored voltage Ef is impressed to an inverting input terminal (−) thereof, with an output terminal thereof being connected to a third input terminal of the NAND output element 198.

Also, in the comparison circuit 197 constituting the undercurrent state detection circuit, the average measured voltage Ea is impressed to an inverting input terminal (−) of the comparison circuit 197, and the first divided voltage (>the second divided voltage) of the monitored voltage Ef is impressed to a non-inverting input terminal (+) thereof, with an output terminal thereof being connected to a second input terminal of the NAND output element 198.

On the other hand, the initialization capacitor 182 connected to the abnormality occurrence storage circuit 181 is connected between the reset input R and the output terminal (controlled power supply voltage Vcc) of the control power supply 110 so as to reset the abnormality occurrence storage circuit 181 at the time when power is turned on.

The output signal of the NAND output element 198 is input to the input terminal DEM of the microprocessor 111B as an abnormality determination signal for warning, and at the same time to the set input S of the abnormality occurrence storage circuit 181. Accordingly, when at least one of the three input signals becomes a low logical level "L", the NAND output element 198 generates an output signal of a high logical level "H" to provide a warning input to the microprocessor 111B, and at the same time to set the abnormality occurrence storage circuit 181.

A set output signal from the abnormality occurrence storage circuit 181 is impressed to the base terminal of the transistor 184 through the drive resistor 183. The stabilization resistor 185 is connected between the base terminal and the emitter terminal of the transistor 184 through the ground.

The energization or power supply to the switching circuit part 120 is controlled by a feedback control output PWM input from the microprocessor 111B through the drive resistor 128. The collector terminal (output terminal) of the transistor 184 is connected between the base terminal and the emitter terminal of the transistor 123 (see FIG. 1) in the switching circuit part 120. As a result, when the abnormality occurrence storage circuit 181 stores an abnormal state by means of the output signal of the NAND output element 198, the transistor 184 is made conductive, and the transistor 123 and the switching element 121 (see FIG. 1) in the switching circuit part 120 are made nonconductive.

As stated above, the current control part of the current control apparatus 100B according to the second embodiment of the present invention includes the microprocessor 111B, the control power supply 110, the differential amplifier circuit part 150, the conversion estimating section 311, the feedback control section 325, the overcurrent detection circuit 170, the voltage limiting diode 164 (see FIG. 1), the output stop section 322, and the abnormality warning section (warning indicator 109). The microprocessor 111B includes the FMEM 113B, the nonvolatile data memory 114B, the RAM memory 112, and the multichannel AD converter 115. The conversion estimating section, the feedback control section, the output stop section and the abnormality warning section operate in the same manner as described above.

The overcurrent detection circuit 170 includes a warning signal input circuit connected to the input terminal DEM of the microprocessor 111B and the abnormality occurrence storage circuit 181. The abnormality occurrence storage circuit 181 is set by the overcurrent determination signal to stop the conduction of the switching element 121, and is reset when power is turned on.

In addition, the current control part includes the average voltage measuring circuit (the voltage dividing resistors 191a, 192a, the serial resistor 193 and the smoothing capacitor 194), and the abnormality determination section (the abnormal current state detection circuit 190). The average voltage measuring circuit divides and smoothens the voltage impressed to the electric load 107 to generate an average measured voltage Ea proportional to the average impressed voltage to the electric load 107.

The abnormality determination section generates an abnormality determination signal when the relative relation between the monitored voltage Ef and the average measured voltage Ea varies exceeding an allowable variation range. The output stop section and the abnormality warning section stop, in response to the abnormality determination signal, the feedback control output PWM from the feedback control section to the switching element 121 and at the same time provide a warning indication of such an abnormally stopped state.

Moreover, the abnormality determination section 190 includes at least one of the overcurrent state detection circuit (the comparison circuit 196) and the undercurrent state detection circuit (the comparison circuit 197). The overcurrent state detection circuit comprises the comparison circuit 196 for determination of an excessively large current, and supplies an abnormality determination signal in the form of a warning signal to the microprocessor 111B when the relative relation between the monitored voltage Ef and the average measured voltage Ea varies exceeding an allowable variation range to indicate the excessive largeness of the monitored voltage Ef.

The undercurrent state detection circuit comprises the comparison circuit 197 for determination of an excessively small current, and supplies an abnormality determination signal in the form of a warning signal to the microprocessor 111B when the relative relation between the monitored voltage Ef and the average measured voltage Ea varies exceeding an allowable variation range to indicate the excessive smallness of the monitored voltage Ef. The output stop section and the abnormality warning section serve to stop, in response to a warning signal from the overcurrent state detection circuit or the undercurrent state detection circuit, the feedback control output PWM and at the same time indicate a warning of the abnormally stopped state.

The overcurrent state detection circuit (the comparison circuit 196) or the undercurrent state detection circuit includes a warning signal input circuit connected to the input terminal DEM of the microprocessor 111B and the abnormality occurrence storage circuit 181. The abnormality occurrence storage circuit 181 is set by a warning signal to stop the conduction of the switching element 121, and is reset when power is turned on.

Now, reference will be made to a specific operation of pulse width modulation (PWM) control routine according to the second embodiment of the present invention as illustrated in FIG. 5 while referring to a flow chart of FIG. 6. Although the detection error calibration processing comprising the microprocessor 111B is executed in the same manner as referred to above (see FIG. 2), a calibration command and a measurement signal from the analog voltmeter 992a or the analog ammeter 991a are supplied to the microprocessor 111B as a part of input signals of the switch input group 105d and the analog input group 105a.

Figure 6:
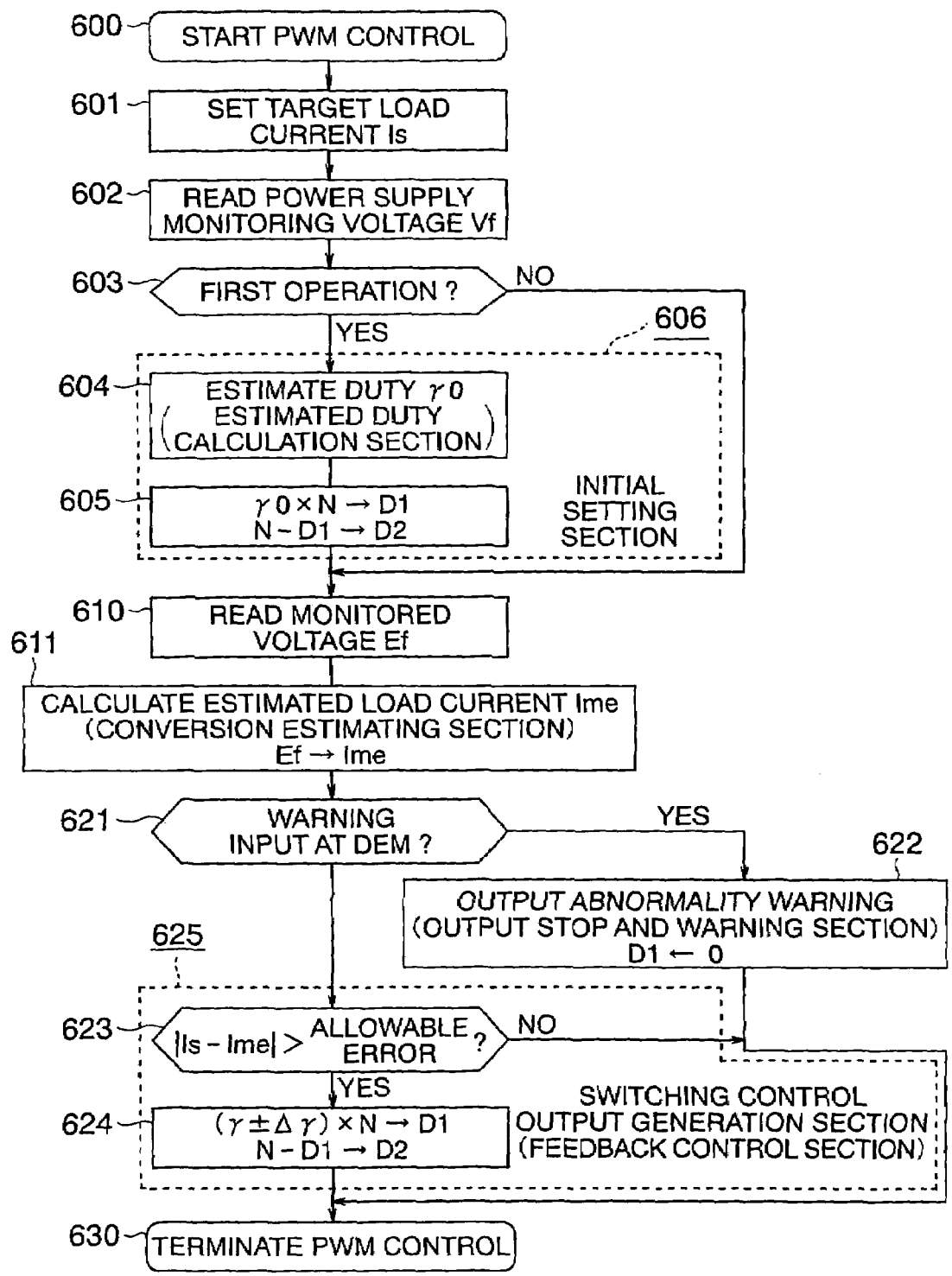
FIG. 6 is a flow chart illustrating a processing operation for a general control routine according to the second embodiment of the present invention.

In FIG. 6, the processes in steps 600 through 611 and steps 622 through 630 are the same as steps 300 through 311 and steps 322 through 330 as described above (see FIG. 3), respectively. In addition, steps 604, 605 constitute an initial setting section 606, and a switching control output generation section 625 comprising steps 623, 624 constitutes a feedback control section for generating a feedback control output PWM according to pulse width modulation control.

In this case, PWM control is started (step 600), the target load current Is is set (step 601), the power supply monitoring voltage Vf is read (step 602), and first operation determination processing is executed (step 603). Thereafter, the initial setting section 606 is executed or activated (steps 604, 605), the monitored voltage Ef is read (step 610), and the conversion estimating section is executed or activated (step 611). After completion of these steps, a determination is made as to whether a warning signal exists at (or is impressed on) the input terminal DEM (step 621).

When it is determined in step 621 that a warning signal is impressed to the input terminal DEM (that is, YES), the control flow shifts to abnormality warning output processing (step 622), whereas when it is determined that a warning input is not impressed (that is, NO), the control flow shifts to the deviation determination processing of the switching control output generation section (feedback control section) 625 (step 623).

In step 622, the content of the data register D1 is set to "0", and an abnormality warning signal DSP is generated to activate the warning indicator (abnormality warning section) 109. In step 623, a magnitude comparison determination is made for the target load current Is set in step 601 and the estimated load current Ime calculated in step 611. When a comparison deviation |Is-Ime| exceeds a predetermined value (allowable error), the control flow shifts to step 624, whereas when the comparison deviation is minute (i.e., |Is-Ime|≦allowable error), the control flow shifts to an operation end step 630.

In step 624, a correction value Δγ for the present energization duty γ is corrected increasingly or decreasingly in accordance with the relative magnitude and polarity (plus or minus) of the comparison deviation |Is-Ime|. The integer part of the value obtained by multiplying the correction result by a predetermined magnification N (e.g., N=1000) is stored in the data register D1 as a memory of a specific address in the RAM memory 112, and a value of "N−D1" is stored in the data register D2.

When the result of the determination in step 623 indicates that the comparison deviation is minute (that is, NO), the operation end step 630 executed following steps 622, 624 is stand-by processing. The control flow of FIG. 6 is repeatedly executed each time an operation start step 600 is activated again after the microprocessor 111B executes another control flow.

Although a feedback control output PWM is generated as in FIG. 4 when the data registers D1, D2 are set according to steps 605, 624, the microprocessor 111B of FIG. 5 has its interrupt input terminal INT (see FIG. 1) unused, and hence operates with the above-mentioned steps 401, 406 (see FIG. 4) being excluded.

Here, the overcurrent detection circuit 170 in FIG. 5 operates as described above, but when overcurrent abnormality occurs, the switching element 121 is made nonconductive at once through the abnormality occurrence storage circuit 181 instead of inputting an alarm or warning to the interrupt input terminal INT (not shown) of the microprocessor 111B. In addition, a warning signal from the overcurrent detection circuit 170 that indicates an abnormal state is impressed to the input terminal DEM of the microprocessor 111B through the NAND circuit 198, whereby the feedback control output PWM is stopped and at the same time the warning indicator 109 is driven to warn the abnormality.

In FIG. 5, the comparison circuit 196 constituting the overcurrent state detection circuit corresponds to the step 320 in FIG. 3, and the comparison circuit 197 constituting the undercurrent state detection circuit corresponds to the step 321 in FIG. 3. However, while in the above-mentioned first embodiment, the operations of the respective steps 320, 321 depend on the software in the microprocessor 111B, in this second embodiment of the present invention, the operations of the respective comparison circuits 196, 197 depend on hardware.

That is, when an overcurrent state or an undercurrent state is detected, the comparison circuits 196, 197 serve to make the switching element 121 nonconductive through the NAND output element 198 and the abnormality occurrence storage circuit 181, and input an abnormality determination signal to the microprocessor 111B through the input terminal DEM, whereby the feedback control output PWM is stopped and the warning indicator 109 is driven to execute abnormality warning processing.

Here, note that the resistance value of the current detection resistor 126 and the amplification factor of the differential amplifier circuit part 150 are designed in such a manner that when the reference load current Ir flows as the load current, the value of the monitored voltage Ef substantially coincides with the controlled power supply voltage Vcc (=5 [V]). In contrast to this, the average measured voltage Ea is designed to substantially coincide with the controlled power supply voltage Vcc (=5 [V]) when the switching element 121 becomes fully conductive to make the drive power supply voltage Vb have a maximum value Vmax (=16 [V]).

Since the reference load current Ir is a current value when the drive power supply voltage Vb is at a minimum value Vmin (=10 [V]), the average measured voltage Ea in the normal operating state becomes a value below a level of $5 \times (10/16) = 3.15$ [V]. Accordingly, the average measured voltage Ea varies within the range of 0 [V]-3.15 [V] when the estimated load current Ime changes within the range of from 0 [V] to the reference load current Ir.

In contrast to this, the monitored voltage Ef varies from 0 [V] to 5 [V] when the estimated load current Ime changes within the range of from 0 [V] to the reference load current Ir. Accordingly, the first divided voltage due to the voltage dividing resistors 195a, 195b, 195c is set to 0 [V]-3.8 [V] for instance, and the second divided voltage is set to 0 [V]-2.5 [V] for instance, so each of the outputs of the comparison circuits 196, 197 normally becomes a high logical level "H".

However, when the relative relation of the monitored voltage Ef and the average measured voltage Ea is changed to exceed an allowable variation range due to the occurrence of abnormality, the output of the comparison circuit 196 or 197 becomes a low logical level "L", so the abnormal state can be detected in a reliable manner. In particular, when a short-circuit accident of the electric load 107 or a ground fault accident of the positive phase wiring is generated in the circuit configuration of FIG. 5, the average measured voltage Ea obtained from the voltage dividing resistors 191a, 192a decreases suddenly, so the output of the comparison circuit 196 becomes a low logical level "L" even if the monitored voltage Ef is limited by the voltage limiting diode 164, thus making it possible to detect the overcurrent state.

As described above, the current control apparatus 100B according to the second embodiment of the present invention is provided with the microprocessor 111B having the FMEM 113B, the EEPROM 114B, the RAM memory 112 and the multichannel AD converter 115, and it is further provided with the control power supply 110 that supplies to the microprocessor 111B the stabilized control power supply voltage Vcc lower than the drive power supply voltage Vb, the differential amplifier circuit part 150, the overcurrent detection circuit 170, and the abnormality warning section 109. The microprocessor 111B constitutes the conversion estimating section (step 611 in FIG. 6), the output stop section (step 622), and the feedback control section 625 (steps 623, 624).

The differential amplifier circuit part 150 has the differential amplifier 151 that is operated by impression of the drive power supply voltage Vb to amplify the difference voltage between the voltages at the opposite ends of the current detection resistor 126 connected between the switching element 121 and the electric load 107 to generate the monitored voltage Ef substantially proportional to the energization current (load current Im) to the electric load 107, and to input it to the microprocessor 111B.

The conversion estimating section (step 611) calculates the estimated load current Ime from the value of the monitored voltage Ef, and the feedback control section 625 (steps 623, 624) controls the energization duty γ of the switching element 121 by setting the target load current Is and the estimated load current Ime as the target value and the feedback value, respectively. The overcurrent detection circuit 170 generates an overcurrent determination signal and inputs it to the input terminal DEM of the microprocessor 111B when the value of the prestage voltage E0 output from the differential amplifier circuit part 150 exceeds the predetermined value that is equal to or greater than the controlled power supply voltage Vcc.

In addition, the voltage limiting diode 164 (see FIG. 1) in the smoothing circuit 160 serves to limit the monitored voltage Ef, which is input to the microprocessor 111B, to the level of the controlled power supply voltage Vcc. The output stop section (step 622) in the microprocessor 111B is operated in response to an overcurrent determination signal to stop the feedback control output PWM from the feedback control section to the switching circuit part 120 (the switching element 121). Further, the warning indicator (abnormality warning section) 109 warns and indicates the abnormally stopped state in response to the overcurrent determination signal.

Moreover, the switching element 121 and the current detection resistor 126 are connected with each other in a mutually adjacent relation, so special wiring to the electric load 107 can be reduced, and besides, in the feeder circuit construction in which a burnout preventive measure at the time of a short-circuit malfunction is simplified by the current limiting function of the current detection resistor 126, it is possible to prevent the burnout of the switching element 121 or the current detection resistor 126 by quickly detecting a short-circuit accident of the electric load 107 or the load wiring at a location outside the microprocessor 111B. Further, it is possible to ensure high control accuracy by adjusting the monitored voltage Ef during the normal operation to a sufficiently large value within the range of the controlled power supply voltage Vcc.

Furthermore, the current control apparatus 100B includes, in addition to the warning signal input circuit connected to the input terminal DEM of the microprocessor 111B, the abnormality occurrence storage circuit 181, and the abnormality occurrence storage circuit 181 is set in response to an overcurrent determination signal to stop the conduction of the switching element 121, and is reset when power is turned on. Accordingly, it is possible to quickly open (turn off) the switching element 121 in immediate response to the occurrence of abnormality without depending on the microprocessor 111B. At the same time, the feedback control section in the microprocessor 111B stops the feedback control output (drive control signal) PWM to the switching element 121 by supplying the warning signal to the input terminal DEM, so a double or dual safety circuit configuration can be achieved.

As described above, the current control apparatus 100B (see FIG. 5) according to the second embodiment of the present invention is provided with the microprocessor 111B having the FMEM 113B, the EEPROM 114B, the RAM memory 112 and the multichannel AD converter 115, and it is further provided with the switching circuit part 120 having the switching element 121 (see FIG. 1), the differential amplifier circuit part 150, the smoothing circuit 160, the overcurrent detection circuit 170, the average voltage measuring circuit including the voltage dividing resistors 191a, 192a, the comparison circuits (abnormality determination section) 196, 197, and the warning indicator (abnormality warning section) 109. The microprocessor 111B constitutes the conversion estimating section (step 611), the output stop section (step 622), and the feedback control section 625 (steps 623, 624).

The differential amplifier circuit part 150 generates the monitored voltage Ef substantially proportional to the current supplied to the electric load 107, and inputs it to the microprocessor 111B. The conversion estimating section (step 611) calculates the estimated load current Ime from the value of the monitored voltage Ef. The feedback control section (switching control output generation section) 625 controls the energization duty γ of the switching element 121 by setting the target load current Is and the estimated load current Ime as the target value and the feedback value, respectively. The voltage dividing resistors 191a, 192a and the smoothing capacitor 194 constituting the average voltage measuring circuit divides and smoothens the voltage impressed to the electric load 107 to generate an average measured voltage Ea proportional to the average impressed voltage to the electric load 107.

The comparison circuits 196, 197 constituting the abnormality determination section makes an abnormality determination when the relative relation between the monitored voltage Ef and the average measured voltage Ea varies exceeding an allowable variation range. The output stop section (step 622) and the warning indicator (abnormality warning section) 109 are operated in response to the abnormality determination of the comparison circuits 196, 197 to stop the feedback control output PWM from the microprocessor 111B (the feedback control section) to the switching element 121 (see FIG. 1), and at the same time indicate a warning of the abnormally stopped state.

As described above, the switching element 121 and the current detection resistor 126 are connected with each other in a mutually adjacent relation, so special wiring to the electric load 107 can be reduced, and besides, in the feeder circuit construction of FIG. 5, safety can be improved by detecting abnormality of the electric load 107 or the load wiring in an accurate manner.

Here, note that the comparison circuits (abnormality determination section) 196, 197 need only be provided with at least one of the overcurrent state detection circuit 196 or the undercurrent state detection circuit 197. The comparison circuit (overcurrent state detection circuit) 196 makes an abnormality determination and supplies a warning signal to the microprocessor 111B when the relative relation between the monitored voltage Ef and the average measured voltage Ea varies exceeding an allowable variation range to indicate an excessively large state of the monitored voltage Ef. The comparison circuit (undercurrent state detection circuit) 197 makes an abnormality determination and supplies a warning signal to the microprocessor 111B when the relative relation between the monitored voltage Ef and the average measured voltage Ea varies exceeding an allowable variation range to indicate an excessively small state of the monitored voltage Ef.

The output stop section (step 622) and the warning indicator (abnormality warning section) 109 are operated in response to the warning signal from the comparison circuit 196 or 197 to the input terminal DEM to stop the feedback control output PWM from the feedback control section in the microprocessor 111B to the switching element 121, and at the same time indicate a warning of the abnormally stopped state.

As described above, according to the second embodiment of the present invention, the switching element 121 and the current detection resistor 126 are connected with each other in a mutually adjacent relation, so special wiring to the electric load 107 can be reduced. Besides, in the feeder circuit construction in which a burnout preventive measure against a short-circuit malfunction of the wiring or the electric load 107 is simplified by the current limiting function of the current detection resistor 126, it is possible to reduce the load of the microprocessor 111B and warn an abnormal state by detecting an open-circuit of the electric load 107 or a power supply short circuit or an open circuit or break of the load wiring by means of the comparison circuit (undercurrent state detection circuit) 197 at a location outside the microprocessor 111B.

Similarly, by detecting a short circuit of the electric load 107 and a ground fault of the load wiring by means of the comparison circuit (overcurrent state detection circuit) 196 at a location outside the microprocessor 111B, it is possible to reduce the load of the microprocessor 111B, prevent the burnout of the switching element 121 or the current detection resistor 126, and warn the abnormal state.

Moreover, the comparison circuits 196, 197 include the abnormality occurrence storage circuit 181 in addition to the NAND circuit (warning signal input circuit) 198 connected to the input terminal DEM of the microprocessor 111B, and the abnormality occurrence storage circuit 181 is set in response to a warning signal to the input terminal DEM to stop the conduction of the switching element 121, and is reset when power is turned on. With such an arrangement, the switching element 121 can be quickly opened in immediate response to the occurrence of abnormality without depending on the microprocessor 111B. Further, the warning signal is impressed to the input terminal DEM of the microprocessor 111B, so that the microprocessor 111B stops the drive control output PWM to the switching element 121, thus making it possible to achieve a double or dual safety feature.

Embodiment 3

Figure 7:
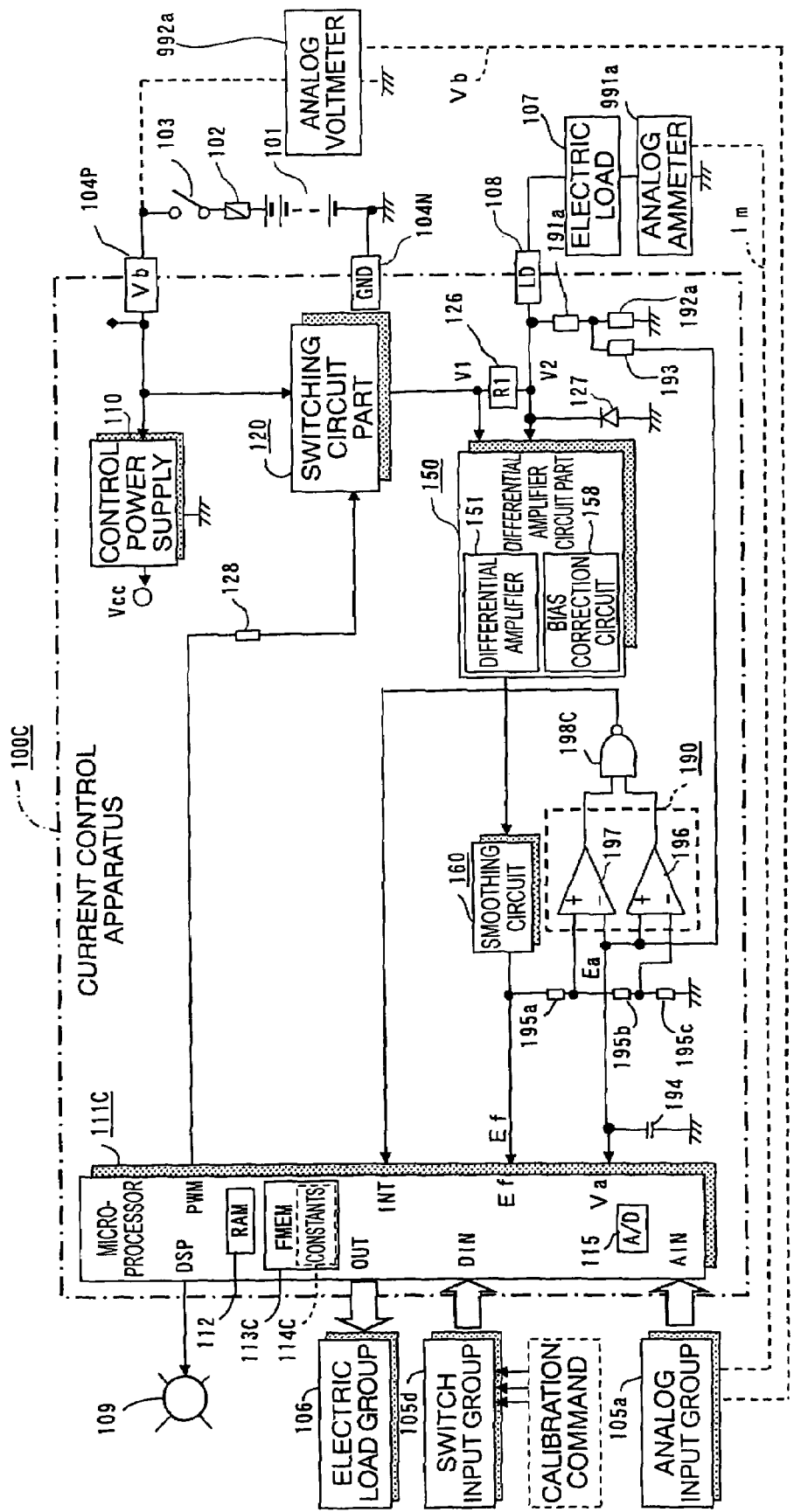
FIG. 7 is a block diagram showing the overall construction of a current control apparatus for an electric load according to a third embodiment of the present invention.

Although in the above-mentioned second embodiment (see FIG. 5), the power supply monitoring voltage Vf detected by the power supply voltage measuring circuit (the voltage dividing resistors 191b, 192b) is input to the microprocessor 111B, the average measured voltage Ea may instead be input to a microprocessor 111C as the average monitored voltage Va, as shown in FIG. 7.

FIG. 7 is a circuit block diagram that shows the overall construction of a current control apparatus for an electric load according to a third embodiment of the present invention, and the same parts or components as those described above (FIG. 5) are identified by the same symbols or by the same symbols with "C" affixed to their ends, while omitting a detailed explanation thereof.

In FIG. 7, a current control apparatus 100C includes, similar to the one as described above, a microprocessor 111C which is fed with electric power from a control power supply 110, a switching circuit part 120, a differential amplifier circuit part 150, a smoothing circuit 160 and so on, and the apparatus 100C is accommodated in a sealed casing (not shown).

In addition, the current control apparatus 100C is provided with a power supply terminal 104P, a ground terminal 104N, and an output terminal 108, and external equipment includes a drive power supply 101, a fuse 102, a power supply switch 103, a switch input group 105d, an analog input group 105a, an electric load group 106, an electric load 107, a warning indicator (abnormality warning section) 109 and so on, all of which are connected to the current control apparatus 100C.

Moreover, in a calibration operation before shipment of a product, a calibration command is supplied from an input terminal of a predetermined number in the switch input group 105d, and an output signal of an analog ammeter 991a for calibration connected in series to the electric load 107 and an output signal of an analog voltmeter 992a for calibration for measuring the drive power supply voltage Vb of the drive power supply 101 impressed to the power supply terminal 104P are supplied from the input terminals of predetermined numbers among the analog input group 105a to the microprocessor 111C to be transferred to the RAM memory 112, as will be described later.

As the internal configuration of the current control apparatus 100C, the microprocessor 111C, being fed with a controlled power supply voltage Vcc from the control power supply 110, includes the RAM memory 112 for arithmetic operation, a nonvolatile program memory (FMEM) 113C including a data memory 114C, and a multichannel AD converter 115, all of which operate in cooperation with one another. In this case, the data memory 114C utilizes a partial area of the FMEM 113C which is flash erasable in blocks, and stores therein calibration constants (to be described later).

The switching circuit part 120 and the differential amplifier circuit part 150 are constructed similarly as described above, but a commutating diode 127 associated with the differential amplifier circuit part 150 is connected in parallel to the electric load 107, and a current detection resistor 126 is connected externally of the commutating diode 127. Accordingly, the capacitor 162 (see FIG. 1) in the smoothing circuit 160 is set to an electrostatic capacity larger than the above-mentioned one.

Voltage dividing resistors 191a, 192a constituting an average voltage measuring circuit are connected in series with each other, as described above, and connected to the output terminal 108. A voltage across the opposite ends of the voltage dividing resistor 192a is impressed to a smoothing capacitor 194 through a serial resistor 193 to provide an average measured voltage Ea. In addition, the average measured voltage Ea is input to the microprocessor 111C as an average monitored voltage Va. In this case, the above-mentioned voltage dividing resistors 191b, 192b (the power supply voltage measuring circuit) (see FIG. 1) as employed in the previous embodiments are removed or omitted, and the average monitored voltage Va is input to the microprocessor 111C in place of the above-mentioned power supply monitoring voltage Vf.

The voltage dividing resistors 195a, 195b, 195c are connected in series with one another, as described above, to divide the monitored voltage Ef into a first voltage and a second voltage (the first voltage>the second voltage). Also, in a comparison circuit 196 constituting an overcurrent state detection circuit, the average measured voltage Ea is impressed to a non-inverting input terminal (+) of the comparison circuit 196, and the second divided voltage of the monitored voltage Ef is impressed to an inverting input terminal (−) thereof, with an output terminal thereof being connected to a second input terminal of a NAND output element 198C.

Similarly, in a comparison circuit 197 constituting an undercurrent state detection circuit, the average measured voltage Ea is impressed to an inverting input terminal (−) of the comparison circuit 197, and the first divided voltage divided from the monitored voltage Ef is impressed to a non-inverting input terminal (+) thereof, with an output terminal thereof being connected to a first input terminal of the NAND output element 198C.

The NAND output element 198C has a high output logical level "H" when the logical level of at least one of the two input terminals becomes low ("L"). The output terminal of the NAND output element 198C is connected to an interrupt input terminal INT of the microprocessor 111C, so that an abnormality determination signal indicating an overcurrent state or an undercurrent state is input to the microprocessor 111C as a warning signal.

Here, focusing attention on a potential to ground V2 at a negative terminal of the current detection resistor 126, the potential to ground V2 is approximately equal to the positive value of the drive power supply voltage Vb (V2≈Vb) for the conduction period τ on of the switching element 121, whereas the potential to ground V2 is approximately equal to the negative value of the drive power supply voltage Vb (V2≈Vb) for the nonconduction period τ off of the switching element 121. Thus, the average monitored voltage Va is calculated according to the following expression (9) by using the resistance values R191, R192 of the voltage dividing resistors 191a, 192a.

$$Va = \left[\int V2 \cdot dt\right]/\tau \quad (9)$$
$$= [Vb \times \tau \text{ on}/\tau - Vd \times \tau \text{ off}/\tau] \times G$$
$$= [(Vb+Vd) \times \gamma - Vd] \times G$$
$$\approx (Vb+Vd) \times \gamma \times G$$

where a constant G is expressed as follows.

G=R192/(R191+R192)

The monitored voltage Ef is represented by the following expression (10) from expressions (8), (9) above.

Ef=D×Va+B×Im+C  (10)

where a voltage proportional constant D (calibration constant) of an error component is represented by the following expression.

$$D = A/G$$
$$= Kd \times [R163/(R163+R161)] \times (R191+R192)/R192$$

The calibration constants A, D in the above expression are the voltage proportional constants of the error component of the monitored voltage Ef, and a calibration constant B in expression (10) above is a current proportional constant, and a calibration constant C in expression (10) above is an offset component of the error component.

As described above, a current control part of the current control apparatus 100C according to the third embodiment of the present invention includes an average voltage measuring circuit (voltage dividing resistors 191a, 192a) for measuring the average monitored voltage Va that is an average value of the voltage impressed to the electric load 107. A detected error calibration section includes a first, a second and a third data acquisition section, a calibration factor calculation section that calculates calibration factors from the data acquired by the first, second and third data acquisition sections, an average voltage calibration section that calibrates the average monitored voltage Va, and a transfer storage section that transfers and stores the calibration factors as calibration constants.

The average voltage measuring circuit inputs a divided voltage obtained by dividing a voltage across the opposite ends of the electric load 107 to the microprocessor 111C as the average monitored voltage Va. The first and third data acquisition sections operate as described above. The second data acquisition section writes and stores a second error voltage Ef1 into the RAM memory 112, as described above, and at the same time writes and stores the average monitored voltage Va into the RAM memory 112 as well. The calibration factor calculation section calculates and stores the voltage proportional constant D of the error component, the current proportional constant B and the offset component C in such a manner that the monitored voltage Ef, the average monitored voltage Va and the energization duty γ of the differential amplifier circuit part 150 and the external load current Im satisfy the following relation: Ef=D×Va+B×Im+C.

The offset component C coincides with a first error voltage Ef0 stored in the first data acquisition section. The voltage proportional constant D is calculated from the data acquired by the first and second data acquisition sections as follows: D=(Ef1−Ef0)/(Va). The current proportional constant B is calculated from the data acquired by the second and third data acquisition sections as follows: B=(Ef2−Ef1)/Im.

The average voltage calibration section is executed in the second or third data acquisition section, and takes in the value of the drive power supply voltage Vb of the drive power supply 101 measured on the outside to write and store it into the RAM memory 112. The average voltage calibration section calculates an average voltage calibration factor Ka between the average monitored voltage Va when the switching element 121 becomes fully conductive and the drive power supply voltage Vb as follows; Ka=Vb/Va, or it applies a fixed constant which is preset as the reciprocal of the voltage division ratio to the voltage across the opposite ends of the electric load 107. The transfer storage section transfers and stores, into the nonvolatile data memory 114C as calibration constants, the respective values of the voltage proportional constant D, the current proportional constant B, the offset component C, and the average voltage calibration factor Ka, all of which are the calculation results of the calibration factor calculation section.

The current control part includes an input interface circuit that connects between the microprocessor 111C, the switch input group 105d, and the analog input group 105a through a bus. At the time of calibration operation, at least one of the first, second and third calibration commands is input from an input terminal of a predetermined number in the switch input group 105d. Voltage information on the drive power supply 101 and current information on the electric load 107 are input as analog inputs of predetermined numbers in the analog input group 105a, transferred to and stored into the RAM memory 112.

The FMEM 113C includes a conversion estimating section that calculates an estimated load current Ime or an estimated monitored voltage Es, and a switching control output generation section in the form of a feedback control section. The conversion estimating section calculates the estimated load current Ime from the monitored voltage Ef generated from the differential amplifier circuit part 150 and the present value of the average monitored voltage Va as follows: Ime=[Ef−D×Va−C]/B, or it calculates the estimated monitored voltage Es generated from the differential amplifier circuit part 150 when a target load current Is flows as follows: Es=D×Va+B×Is +C.

The switching control output generation section gradually increases or decreases the energization duty γ of the switching element 121 in response to a deviation between the target load current Is and the estimated load current Ime, or in response to a deviation between the estimated monitored voltage Es and the actual monitored voltage Ef.

The FMEM 113C includes a program that constitutes an initial setting section. The initial setting section calculates a roughly estimated value Vaa of the average monitored voltage Va from the relation among a minimum power supply voltage Vmin, a maximum power supply voltage Vmax, a reference load current Ir, and the target load current Is as follows; Vaa=(Vmin+Vmax)/2, and it calculates the roughly estimated value γ0 of the energization duty by using the roughly estimated value Vaa as follows; γ0=(Vmin/Vaa)×(Is/Ir), and sets it as an energization duty immediately after starting of the energization.

The reference load current Ir is calculated by using a standard resistance value Rc, which is determined within a resistance value variation range (Rmin-Rmax) of the electric load as follows: Ir=Vmin/Rc. In addition, an abnormality determination section 190 includes at least one of the overcurrent state detection circuit (the comparison circuit 196) and the undercurrent state detection circuit (the comparison circuit 197).

The overcurrent state detection circuit comprises the comparison circuit 196 for determination of an excessively large current, and supplies an abnormality determination signal in the form of a warning signal to the microprocessor 111C when the relative relation between the monitored voltage Ef and the average measured voltage Ea varies exceeding an allowable variation range to indicate an excessive large state of the monitored voltage Ef. The undercurrent state detection circuit comprises the comparison circuit 197 for determination of an excessively small current, and supplies an abnormality determination signal in the form of a warning signal to the microprocessor 111C when the relative relation between the monitored voltage Ef and the average measured voltage Ea varies exceeding an allowable variation range to indicate an excessive small state of the monitored voltage Ef.

An output stop section and an abnormality warning section serve to stop, in response to a warning signal from the overcurrent state detection circuit or the undercurrent state detection circuit, the feedback control output PWM and at the same time indicate a warning of the abnormally stopped state. The warning signal is impressed to the interrupt input terminal INT of the microprocessor 111C, and the output stop section stops the feedback control output PWM in immediate response to the generation of an overcurrent determination signal.

Figure 8:
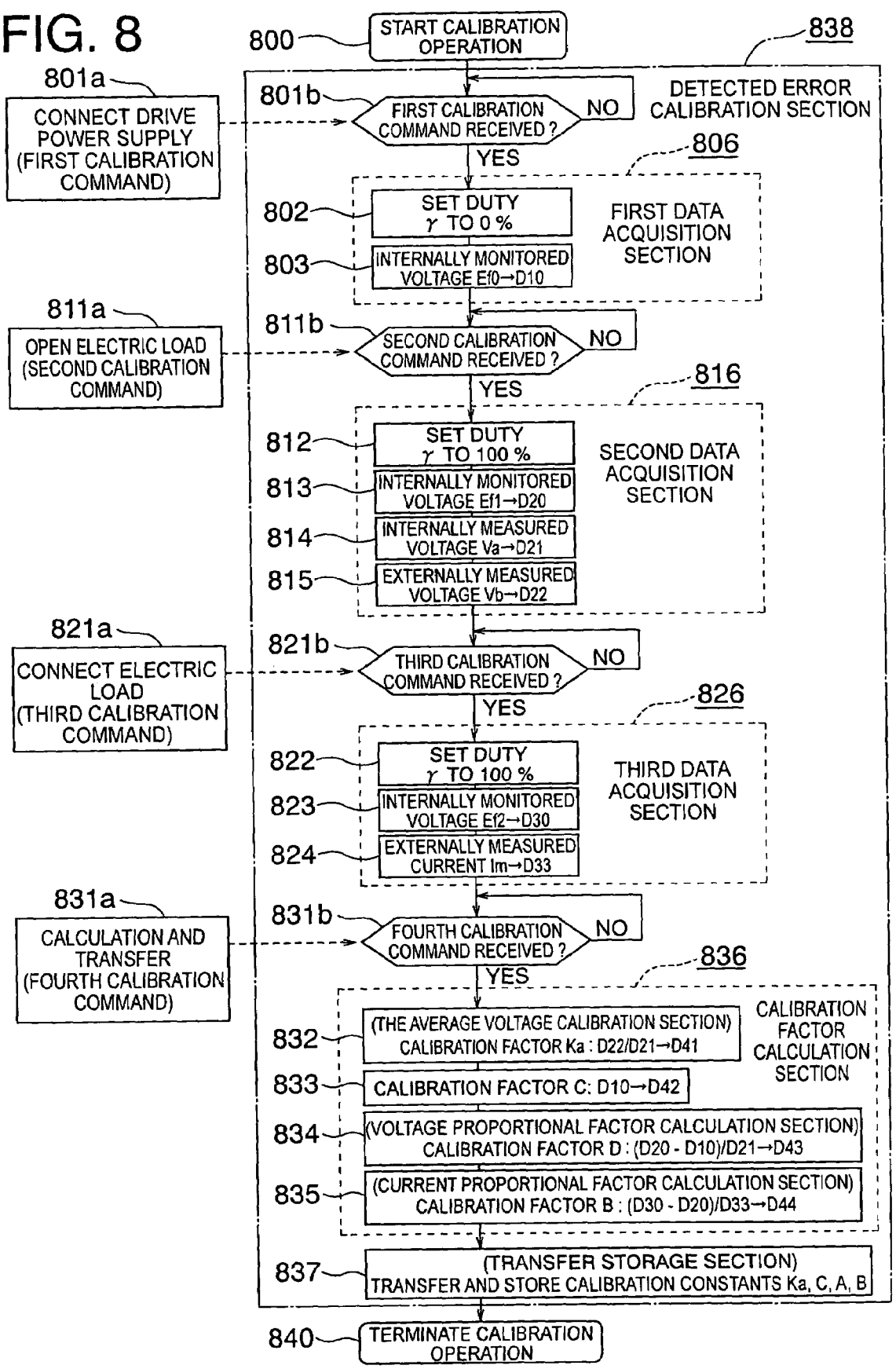
FIG. 8 is a flow chart illustrating a control operation for calibration according to the third embodiment of the present invention.

Now, reference will be made to a specific operation for calibration according to the third embodiment of the present invention as illustrated in FIG. 8 while referring to a flow chart of FIG. 7.

In FIG. 8, steps 800 through 840 correspond to the above-mentioned steps 200 through 240 (see FIG. 2), respectively. However, the factor Ka or the constant D obtained in steps 832, 834 in the calibration factor calculation section 836 are different from the above-mentioned ones (factor Kv, constant A).

First of all, the calibration operation of the microprocessor 111C is started (step 800), and it is determined whether a first calibration command input as one switch input signal of the switch input group 105d has been received (step 801b). When determined as received (that is, YES), the control flow shifts to step 802, whereas when determined as not received (that is, NO), a return is performed to step 801b while waiting until a first calibration command is received. Here, note that when a first calibration command is generated, a prescribed drive power supply 101 is beforehand connected to the current control apparatus 100C. (step 801a).

In step 802, the energization duty γ of the feedback control output PWM is set to 0%. Subsequently, the monitored voltage Ef at this time is transferred, as the first error voltage Ef0, to a predetermined address in a memory, e.g., a data register D10 in the RAM memory 112 (step 803). The steps 802, 803 together constitute a first data acquisition section 806.

Subsequent to step 803, it is determined whether a second calibration command input as one switch input signal of the switch input group 105d has been received (step 811b). When determined as received (that is, YES), the control flow shifts to step 812, whereas when determined as not received (that is, NO), a return is carried out to step 811b while waiting until a second calibration command is received. Here, note that when a second calibration command is generated, the circuit connected to the electric load 107 is disconnected with the prescribed drive power supply 101 being beforehand connected to the current control apparatus 100C (step 811a).

In step 812, the energization duty γ of the feedback control output PWM is set to 100%. Subsequently, the monitored voltage Ef at this time is transferred, as the second error voltage Ef1, to a predetermined address in a memory, e.g., a data register D20 in the RAM memory 112 (step 813).

Also, the value of the average monitored voltage Va at this time is transferred to a data register D21 (step 814), and the value of the drive power supply voltage Vb input from the analog voltmeter 992a as one analog input signal of the analog input group 105a is transferred to a data register D22 (step 815). The steps 812 through 815 together constitute a second data acquisition section 816.

Subsequent to step 815, it is determined whether a third calibration command input as one switch input signal of the switch input group 105d has been received (step 821b), and when determined as received (that is, YES), the control flow shifts to step 822, whereas when determined as not received (that is, NO), a return is performed to step 821b while waiting until a third calibration command is received. Here, note that when a third calibration command is generated, the electric load 107 is connected with a prescribed drive power supply 101 being beforehand connected to the current control apparatus 100C (step 821a).

In step 822, the energization duty γ of the feedback control output PWM is set to 100%. Subsequently, the monitored voltage Ef at this time is transferred, as the measured voltage Ef2, to a predetermined address in a memory, e.g., a data register D30 in the RAM memory 112 (step 823), and the value of the external load current Im input from the analog ammeter 991a as one analog input signal of the analog input group 105a is transferred to a data register D33 (step 824). The steps 822 through 824 together constitute a third data acquisition section 826.

Subsequent to step 824, it is determined whether a fourth calibration command input as one switch input signal of the switch input group 105d has been received (step 831b), and when determined as received (that is, YES), the control flow shifts to step 832, whereas when determined as not received (that is, NO), a return is performed to step 831b while waiting until a fourth calibration command is received. Here, note that when a fourth calibration command is generated, it is verified whether the first through third calibration commands have been generated (step 831a).

In step 832, the power supply voltage calibration factor Ka is calculated from the value of the data register transferred and stored in steps 814, 815 according to the following expression, and is transferred and written into a data register D41.

$$Ka = Vb/Va$$
$$= D22/D21 \rightarrow D41$$

Subsequently, the value of the first error voltage Ef0 transferred and stored in step 803 is transferred to and written into a data register D42 as the offset component C (step 833). In addition, the voltage proportional constant D of the error component of the monitored voltage Ef is calculated from the values of the data registers transferred and stored in steps 813, 803, 814 according to the following expression, and the voltage proportional constant D thus calculated is then transferred to and written into a data register D43 (step 834).

$$D = (Ef1 - Ef0)/Va$$
$$= (D20 - D10)/D21 \rightarrow D43$$

Subsequently, the current proportional constant B of the monitored voltage Ef is calculated from the values of the data registers transferred and stored in steps 823, 813, 824 according to the following expression, and the current proportional constant B thus calculated is then transferred to and written into a data register D44 (step 835).

$$B = (Ef2 - Ef1)/Im$$
$$= (D30 - D20)/D33 \rightarrow D44$$

Here, note that step 832 constitutes an average voltage calibration section, and step 834 constitutes a voltage proportional factor calculation section, and step 835 constitutes a current proportional factor calculation section. In addition, steps 832 through 835 together constitute the calibration factor calculation section 836.

Finally, subsequent to step 835, the respective calibration constants Ka, C, D, B calculated in steps 832 through 835 are transferred to and stored in the data memory 114C (step 837), and transfer verification collation (not shown) is executed, after which the calibration operation of FIG. 8 is terminated (step 840). For execution of the transfer verification collation (not shown), step 837 constitutes the transfer storage section, and the series of the above processes in steps 801b through 837 together constitute a detected error calibration section 838.

Now, reference will be made to a specific operation of pulse width modulation (PWM) control routine according to the third embodiment of the present invention as illustrated in FIG. 7 while referring to a flow chart of FIG. 9.

Figure 9:
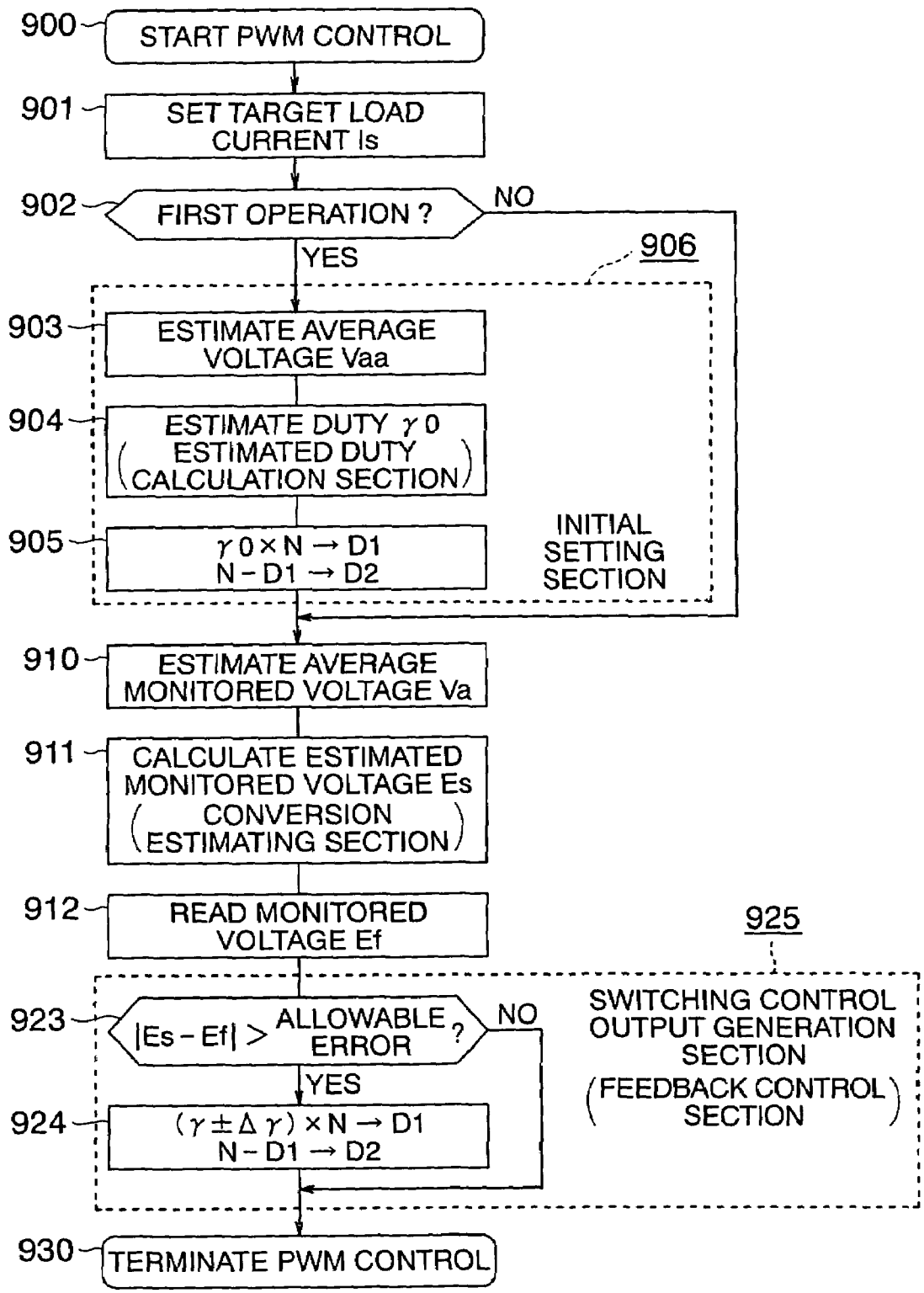
FIG. 9 is a flow chart illustrating the processing operation for a general control routine according to the third embodiment of the present invention.

In FIG. 9, steps 900, 901, 902, 904 through 906, 912, 923 through 930 are processes corresponding to those in abovementioned steps 600, 601, 603, 604 through 606, 610, 623 through 630 (see FIG. 6), respectively. Moreover, step 904 corresponds to an estimated duty calculation section, and steps 903 through 905 together constitute an initial setting section 906. Also, step 911 corresponds to the conversion estimating section, and steps 923, 924 together constitute a switching control output generation section (feedback control section) 925.

In FIG. 9, first of all, the microprocessor 111C starts, as one of a multitude of control flows to be executed, the operation of pulse width modulation control to generate a feedback control output PWM (step 900), and reads and sets the value of the target load current Is (which is determined in an unillustrated control flow) (step 901).

Subsequently, it is determined, from the operating state of a flag (not shown), whether the following control flow is the first operation after the start of operation (that is, NO) (step 902), and when it is determined as not the first operation, the control routine shifts to step 910 (to be described later). On the other hand, when determined as the first operation after the start of operation in step 902 (that is, YES), the control routine shifts to the initial setting step or section 906.

In the initial setting section 906, an average voltage (roughly estimated value) Vaa to be impressed to the electric load 107 is first calculated from the minimum value Vmin and the maximum value Vmax of the drive power supply voltage Vb according to the following expression (step 903).

$$Vaa=(Vmin+Vmax)/2$$

Subsequently, the roughly estimated value γ0 of the energization duty of the switching element 121 is calculated according to the following expression (step 904).

$$γ0=(Vmin/Vaa) \times (Is/Ir)$$

In the above expression, the reference load current Ir is calculated according to the following expression by using the standard resistance value Rc, which is determined to be within a resistance value variation range (from Rmin to Rmax) of the electric load 107.

$$Ir=Vmin/Rc$$

Subsequently, the roughly estimated value γ0 of the energization duty calculated in step 904 is multiplied by a predetermined magnification N (e.g., N=1000), the integer part of which is stored in a data register D1 in the form of a memory of a specific address in the RAM memory 112, and a value of "N−D1" is stored in the data register D2 (step 905), and the control routine shifts to step 910.

In step 910, the value of the average monitored voltage Va input to the microprocessor 111C is read. Then, an estimated monitored voltage Es corresponding to the target load current Is read in step 901 is calculated according to the following expression (step 911).

$$Es=D \times Va+B \times Is+C$$

In addition, the data stored in the data memory 114C are read and used as the values of the calibration constants D, B, C in the above expression, and the value read in step 910 is used as the value of the average monitored voltage Va. Subsequently, the monitored voltage Ef input to the microprocessor 111C is read (step 912), and the control routine shifts to a switching control output generation step or section 925.

In the switching control output generation section 925, a magnitude comparison determination is made between the estimated monitored voltage Es calculated in step 911 and the monitored voltage Ef read in step 912, and it is determined whether a comparison deviation |Es-Ef| between the estimated monitored voltage Es and the monitored voltage Ef exceeds a predetermined value (allowable error) (step 923).

When it is determined as |Es-Ef|≦the allowable error in step 923 (that is, NO), it is assumed that the comparison deviation is minute, and the processing routine of FIG. 9 is terminated (step 930). On the other hand, when it is determined as |Es-Ef|>the allowable error in step 923 (that is, YES), step 924 is executed, and the control routine then shifts to an operation end step 930.

In step 924, a correction value Δγ for the present energization duty γ is corrected increasingly or decreasingly in accordance with the relative magnitude and polarity (plus or minus) of the comparison deviation |Es-Ef| obtained in step 923, and the integer part of the value obtained by multiplying the correction result by a predetermined magnification N (e.g., N=1000) is stored in the data register D1 as a memory of a specific address in the RAM memory 112, with a value of "N−D1" being stored in the data register D2.

The operation end step 930 is a stand-by process, and the microprocessor 111C executes the control flow of steps 900 through 930 in a repeated manner each time an operation start step 900 is activated after another control flow has been executed. Here, note that the switching control output generation section 925 constitutes the feedback control section which generates a feedback control output PWM when the data registers D1, D2 are set in steps 905, 924, as stated above (see FIG. 4).

Here, an overall outline of the control flow of FIG. 9 will be described.

First of all, the initial setting section 906 (steps 903 through 905) makes a comparison between the reference load current Ir and the target load current Is at a stage where an appropriate energization duty γ due to the feedback control has not yet been determined, so that the roughly estimated value γ0 of the energization duty in the present drive power supply voltage Vb is thereby determined.

The conversion estimating section (step 911) calculates the estimated monitored voltage Es corresponding to the target load current Is based on the calibration constants, thereby acquiring an accurate estimated monitored voltage Es by excluding an individual variation of the current detection resistor 126 and a current detection error of the differential amplifier circuit part 150. If a deviation larger than an allowable error exists between the estimated monitored voltage Es to be targeted and the actual monitored voltage Ef, the feedback control section 925 (steps 923, 924) corrects the energization duty γ increasingly or decreasingly so that the estimated monitored voltage Es and the monitored voltage Ef coincide with each other.

In FIG. 7, when the overcurrent state detection circuit 196 detects or determines the presence of an overcurrent state, the following accidents and the like can be considered as its cause: a short-circuit (load short-circuit) accident between the positive and negative lead wires of the electric load 107; a layer-to-layer short-circuit accident, i.e., a short circuit between windings; and a ground fault accident, i.e., a ground short circuit from the positive phase wiring connected to the output terminal 108 to the ground line connected to the ground terminal 104N (or a vehicle body, the earth, etc.). On the other hand, when the undercurrent state detection circuit 197 detects or determines the presence of an undercurrent state, the following accidents and the like can be considered as its cause: an open circuit or break of the electric load 107 or wiring; and a power supply short-circuit fault.

Here, note that the resistance value of the current detection resistor 126 and the amplification factor of the differential amplifier circuit part 150 are designed in such a manner that when the reference load current Ir flows as the load current, the value of the monitored voltage Ef substantially coincides with the controlled power supply voltage Vcc (=5 [V]). In contrast to this, the average measured voltage Ea is designed to substantially coincide with the controlled power supply voltage Vcc (=5 [V]) when the switching element 121 becomes fully conductive to make the drive power supply voltage Vb have a maximum value Vmax (=16 [V]).

Since the reference load current Ir is a current value when the drive power supply voltage Vb is at a minimum value Vmin (=10 [V]), the average measured voltage Ea in the normal operating state becomes a value below a level of 5×(10/16)=3.15 [V]. Accordingly, the average measured voltage Ea varies within the range of 0 [V]-3.15 [V] when the estimated load current Ime changes within the range of from 0 [V] to the reference load current Ir.

In contrast to this, the monitored voltage Ef varies from 0 [V] to 5 [V] when the estimated load current Ime changes within the range of from 0 [V] to the reference load current Ir. Accordingly, the first divided voltage due to the voltage dividing resistors 195a, 195b, 195c is set to 0 [V]-3.8 [V] for instance, and the second divided voltage is set to 0 [V]-2.5 [V] for instance, so each of the outputs of the comparison circuits 196, 197 normally becomes a high logical level "H".

However, when the relative relation of the monitored voltage Ef and the average measured voltage Ea is changed to exceed an allowable variation range due to the occurrence of abnormality, each output of the comparison circuits 196, 197 becomes a low logical level "L", so the abnormal state can be detected in a reliable manner.

As described above, the current control apparatus 100C according to the third embodiment (see FIG. 7) of the present invention is been provided with the microprocessor 111C having the FMEM 113C including the data memory 114C, the RAM memory 112, and the multichannel AD converter 115, and the switching circuit part 120 having the switching element 121 (see FIG. 1), and the differential amplifier circuit part 150. In addition, the microprocessor 111C constitutes the detected error calibration section 838 (see FIG. 8), the conversion estimating section (step 911 in FIG. 9), and the feedback control section 925.

The differential amplifier 151 in the differential amplifier circuit part 150 serves to amplify a difference voltage between the voltages at the opposite ends of the current detection resistor 126 connected between the switching element 121 and the electric load 107 to input a monitored voltage Ef substantially proportional to the energization current to the electric load 107 to the microprocessor 111C. Moreover, the detected error calibration section 238 is executed or operated, at the time when the product is adjusted for shipment, to measure the current proportional constant B of the monitored voltage Ef due to the differential amplifier circuit part 150, the voltage proportional constant D of the error component, and the offset component C, and to store them into the data memory 114C as the calibration constants.

The conversion estimating section (step 911) calculates the estimated monitored voltage Es corresponding to the target load current Is, and the feedback control section 925 controls the energization duty γ of the switching element 121 by setting the estimated monitored voltage Es and the monitored voltage Ef as the target value and the feedback value, respectively. The functions of at least the detected error calibration section 838, the conversion estimating section 911 and the feedback control section 925 are executed by the microprocessor 111C based on the control program stored in the FMEM 113C.

The feeder circuit to the electric load 107 includes the commutating diode 127, and the differential amplifier circuit part 150 includes a bias correction circuit 158.

In the case of this third embodiment (FIG. 7) of the present invention, the commutating diode 127 is connected directly in parallel to the electric load 107 through the output terminal 108 in such a polarity as to permit a continued transient-decay current due to the inductance of the electric load 107 to return or fed back upon opening (turning off) of the switching element 121.

The bias correction circuit 158 in the differential amplifier circuit part 150 impresses a substantially equal, positive bias voltage to the first and second input terminals of the differential amplifier 151 so as to cancel a negative voltage impressed thereto due to a voltage drop of the commutating diode 127 upon opening (turning off) of the switching element 121, thereby inhibiting the negative voltage input from being impressed to the differential amplifier 151. Accordingly, the bias correction circuit 158 serves to cancel the negative voltage input generated resulting from nonprovision of the current detection resistor 126 at the side of the ground terminal 104N, thereby making it unnecessary for the differential amplifier 151 and the multichannel AD converter 115 to handle a positive and a negative voltage.

Moreover, the current control apparatus 100C is provided with the voltage dividing resistors (average voltage measuring circuit) 191a, 192a, and the detected error calibration section 838 (see FIG. 8). The detected error calibration section 838 is provided with the first through third data acquisition sections 806, 816, 826, the calibration factor calculation section 836, and the transfer storage section (step 837), and the calibration factor calculation section 836 has the average voltage calibration section 832.

The voltage dividing resistors (voltage dividing circuit) 191a, 192a serve to divide the voltage across the opposite ends of the electric load 107 in such a manner that the voltage thus divided is input to the microprocessor 111C as an average monitored voltage Va through the serial resistor 193 and the smoothing capacitor 194. Here, note that the multichannel AD converter 115 may be provided as external element, as stated above.

The first data acquisition section 806 acts to write and store, into the RAM memory 112 as a first error voltage Ef0, the value of a monitored voltage that is generated from the differential amplifier circuit part 150 with the switching element 121 fully opened when a first calibration command is input upon impression of a predetermined drive power supply voltage Vb to the current control part 10C.

The second data acquisition section 816 acts, upon input of a second calibration command with the feeder circuit to the electric load 107 being interrupted, to write and store, into the RAM memory 112 as a second error voltage Ef1, the value of a monitored voltage that is generated from the differential amplifier circuit part 150 with the switching element 121 being made fully conductive, and to write and store an average monitored voltage Va into the RAM memory 112.

The third data acquisition section 826 acts, upon input of a third calibration command with the feeder circuit to the electric load 107 being connected, to write and store, into the RAM memory 112 as a measured voltage Ef2, the value of a monitored voltage that is generated from the differential amplifier circuit part 150 with the switching element 121 being made fully conductive, and to take in the value of an external load current Im measured on the outside to write and store it into the RAM memory 112.

The calibration factor calculation section 836 calculates the offset component C, the voltage proportional constant D of the error component, and the current proportional constant B as follows. First of all, the relation between the monitored voltage Ef (average value) of the differential amplifier circuit part 150, the average monitored voltage Va and the external load current Im is represented from the above-mentioned expression (10) as follows.

$Ef = D \times Va + B \times Im + C$

Here, note that the offset component C coincides with the first error voltage Ef0 stored in the first data acquisition section, as stated above. In addition, the voltage proportional constant D of the error component is calculated from the data acquired by the first and second data acquisition sections 806, 816 according to the following expression, as stated above.

$D = (Ef1 - Ef0)/Va$

Moreover, the current proportional constant B is calculated from the data acquired by the second and third data acquisition sections 816, 826 according to the following expression, as stated above.

$B = (Ef2 - Ef1)/Im$

The average voltage calibration section 832 is executed in the second or third data acquisition section 816, 826 to take in the value of the drive power supply voltage Vb measured on the outside to write and store it into the RAM memory 112. The average voltage calibration section calculates an average voltage calibration factor Ka (=Vb/Va) between the average monitored voltage Va and the drive power supply voltage Vb when the switching element 121 becomes fully conductive, or applies, as an average voltage calibration factor Ka, a fixed constant which is preset as the reciprocal of the voltage division ratio to the voltage across the opposite ends of the electric load 107.

The transfer storage section 837 transfers and stores, into the data memory 114C as calibration constants, the respective values of the voltage proportional constant D, the current proportional constant B, the offset component C, and the average voltage calibration factor Ka, all of which are the calculation results of the calibration factor calculation section 836. As a result, the calibration constants according to individual factors can be calculated and stored systematically and efficiently, so the calibration operation can be easily carried out by the addition of facile automation equipment in a production line to mass-produced products.

Further, the current control apparatus 100C is provided with the input interface circuit, through which the switch input group 105d, the analog input group 105a and the microprocessor 111C are connected to one another by a bus. Accordingly, a calibration command in the above calibration operation is input as a switch input of a predetermined number in the switch input group 105d, and load current information and voltage information on the drive power supply 101 are input as analog inputs of predetermined numbers in the analog input group 105a, transferred to and stored into the RAM memory 112. As a result, the function provided by the current control apparatus 100C can be utilized, as they are, to input a calibration command and measurement information, thus making it possible to construct the calibration operation equipment at a low cost.

Furthermore, the FMEM 113C in the microprocessor 111C is provided with the conversion estimating section (step 911) that calculates the estimated monitored voltage Es, and the switching control output generation section (feedback control section) 925 of the switching element 121. The conversion estimating section (step 911) calculates, as an estimated monitored voltage Es, a monitored voltage that is generated by the differential amplifier circuit part 150 when the target load current Is flows, according to the following expression.

$Es = D \times Va + B \times Is + C$

The switching control output generation section 325, which constitutes the feedback control section, gradually increases or decreases the energization duty γ of the switching element 121 in response to a deviation between the estimated monitored current Es and the actual monitored voltage Ef. In this manner, the microprocessor 111C corrects errors generated by the current detection circuit in doing feedback control so as to make the monitored voltage Ef coincide with the target voltage (estimated monitored voltage Es), whereby highly accurate current control can be achieved by the use of inexpensive circuit components.

Further, the FMEM 113C includes a program that constitutes the initial setting section 906, as referred to above, and the initial setting section 906 estimates the rough energization duty γ0 from the relation among the minimum power supply voltage Vmin, the maximum power supply voltage Vmax, the reference load current Ir, and the target load current Is as follows. First of all, the value calculated by the following expression is applied as an roughly estimated value Vaa of the average monitored voltage Va.

$$Vaa=(Vmin+Vmax)/2$$

Also, the rough energization duty γ0 of the switching element 121 is estimated and determined according to the following expression.

$$\gamma 0=(Vmin/Vaa)\times(Is/Ir)$$

Here, the reference load current Ir is calculated according to the following expression by using the standard resistance value Rc, which is determined to be within the resistance value variation range (from Rmin to Rmax) of the electric load 107.

$$Ir=Vmin/Rc$$

Accordingly, at the start of operation, the target load current Is can be reached quickly.

As described above, the current control apparatus 100C according to the third embodiment of the present invention is provided with the microprocessor 111C, the differential amplifier circuit part 150, the voltage dividing resistors (average voltage measuring circuit) 191a, 192a, the comparison circuits (abnormality determination section) 196, 197, and the warning indicator (abnormality warning section) 109. The microprocessor 111C constitutes the conversion estimating section (step 911), the feedback control section 925, and the output stop section (step 406 in FIG. 4).

The differential amplifier circuit part 150 inputs the monitored voltage Ef substantially proportional to the load current to the microprocessor 111C, and the conversion estimating section (step 911) calculates the estimated monitored voltage Es corresponding to the target load current Is, and the feedback control section 925 controls the energization duty γ of the switching element 121 by setting the estimated monitored voltage Es and the actual monitored voltage Ef as the target value and the feedback value, respectively.

The voltage dividing resistors 191a, 192a, the serial resistor 193, and the smoothing capacitor 194 divides and smoothens the voltage impressed to the electric load 107 to generate an average measured voltage Ea proportional to the average impressed voltage to the electric load 107. The comparison circuits (abnormality determination section) 196, 197 make an abnormality determination when the relative relation between the monitored voltage Ef and the average measured voltage Ea varies exceeding an allowable variation range. The output stop section (step 406) and the warning indicator (abnormality warning section) 109 are operated in response to the abnormality determination of the comparison circuits (abnormality determination section) 196, 197 to stop the feedback control output PWM from the microprocessor 111C (the feedback control section), and at the same time indicate a warning of the abnormally stopped state.

In addition, the switching element 121 and the current detection resistor 126 are connected with each other in a mutually adjacent relation, so special wiring to the electric load 107 can be reduced, and besides, in the feeder circuit construction in which a burnout preventive measure against a short-circuit malfunction of the load wiring or the electric load 107 is simplified by the current limiting function of the current detection resistor 126, safety can be improved by detecting abnormality of the electric load 107 or the load wiring in an accurate manner.

Here, note that as the abnormality determination section, there is provided at least one of the comparison circuit 196 (the overcurrent state detection circuit) and the comparison circuit 197 (the undercurrent state detection circuit). The comparison circuit (overcurrent state detection circuit) 196 makes an abnormality determination and supplies a warning signal to the microprocessor 111C when the relative relation between the monitored voltage Ef and the average measured voltage Ea varies exceeding an allowable variation range to indicate an excessively large state of the monitored voltage Ef. The comparison circuit (undercurrent state detection circuit) 197 makes an abnormality determination and supplies a warning signal to the microprocessor 111C when the relative relation between the monitored voltage Ef and the average measured voltage Ea varies exceeding an allowable variation range to indicate an excessively small state of the monitored voltage Ef.

The output stop section (step 406) and the warning indicator (abnormality warning section) 109 are operated in response to a warning signal input from the comparison circuit 196 (the overcurrent state detection circuit) or the comparison circuit 197 (the undercurrent state detection circuit) to stop the feedback control output PWM from the microprocessor 111C (the feedback control section), and at the same time indicate a warning of the abnormally stopped state.

Moreover, in the above-mentioned feeder circuit construction in which the switching element 121 and the current detection resistor 126 are connected with each other in a mutually adjacent relation, it is possible to prevent the burnout of the switching element 121 or the current detection resistor 126 and warn an abnormal state while reducing the load of the microprocessor 111C by detecting a short circuit of the electric load 107 or a ground fault of the load wiring by means of the comparison circuit (overcurrent state detection circuit) 196 at a location outside the microprocessor 111C. Additionally, it is also possible to reduce the load of the microprocessor 111C and warn an abnormal state by detecting an open circuit or break of the electric load 107 or a power supply short circuit or an open circuit or break of the load wiring by means of the comparison circuit (undercurrent state detection circuit) 197 at a location outside the microprocessor 111C.

Further, a warning signal from the comparison circuits 196, 197 is impressed to the interrupt input terminal INT of the microprocessor 111C, so that the output stop section 406 is operated in immediate response to the generation of an abnormality determination signal. As a consequence, the feedback control output PWM of the microprocessor 111C can be quickly stopped in immediate response to the occurrence of abnormality.

Embodiment 4.

Figure 10:
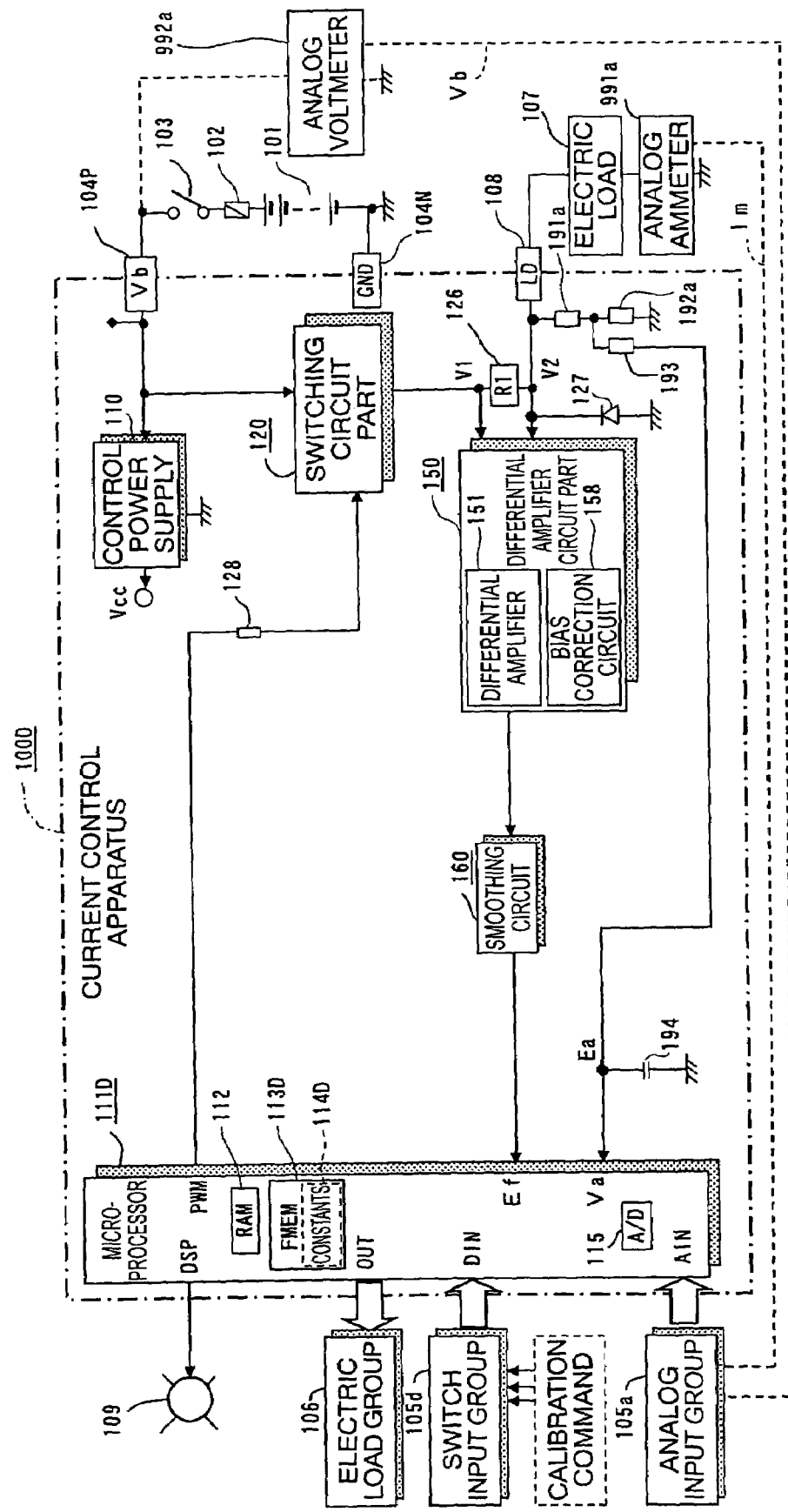
FIG. 10 is a circuit block diagram showing the overall construction of a current control apparatus for an electric load according to a fourth embodiment of the present invention.

Although in the above-mentioned third embodiment, an abnormality determination signal from the comparison circuits 196, 197 is impressed to the interrupt input terminal INT, the comparison circuits 196, 197 and the interrupt input terminal INT may be removed or omitted, as shown in FIG. 10.

FIG. 10 is a circuit block diagram that shows the overall construction of a current control apparatus for an electric load according to a fourth embodiment of the present invention, and the same parts or components as those described above (see FIG. 7) are identified by the same symbols or by the same symbols with "D" affixed to their ends, while omitting a detailed explanation thereof.

In FIG. 10, a current control apparatus 100D includes a microprocessor 111D which is fed with electric power from a control power supply 110, a switching circuit part 120, a differential amplifier circuit part 150, a smoothing circuit 160 and so on, and the apparatus 100D is accommodated in an unillustrated sealed casing. Also, as stated above, external equipment includes a drive power supply 101, a fuse 102, a power supply switch 103, a power supply terminal 104P, a ground terminal 104N, a switch input group 105d, an analog input group 105a, an electric load group 106, an electric load 107, an output terminal 108, and an abnormality warning section in the form of a warning indicator 109, all of which are connected to the current control apparatus 100D.

Here, note that in a calibration operation before shipment of a product, a calibration command input is supplied from an input terminal of a predetermined number in the switch input group 105d, and an output signal of an analog ammeter 991a connected in series to the electric load 107 and an output signal of an analog voltmeter 992a for measuring the drive power supply voltage Vb of the drive power supply 101 impressed to the power supply terminal 104P are supplied from input terminals of predetermined numbers among the analog input group 105a to the microprocessor 111D to be transferred to the RAM memory 112, as will be described later.

In the current control apparatus 100D, the microprocessor 111D, being fed with a controlled power supply voltage Vcc from the control power supply 110, includes the RAM memory 112 for arithmetic operation, a nonvolatile program memory (FMEM) 113D including a data memory 114D, and a multichannel AD converter 115, all of which operate in cooperation with one another. In this case, the data memory 114D utilizes a partial area of the FMEM 113D which is flash erasable in blocks.

The switching circuit part 120 and the differential amplifier circuit part 150 are constructed as described above, and a commutating diode 127 is connected in parallel to the electric load 107 with a current detection resistor 126 being connected externally of the commutating diode 127. Thus, in FIG. 10, a capacitor 162 (see FIG. 1) in the smoothing circuit 160 has a capacity that is set larger than that in FIG. 1.

Voltage dividing resistors 191a, 192a constituting an average voltage measuring circuit are connected in series with each other and connected in parallel to the electric load 107.

A voltage across the voltage dividing resistor 192a is input to the microprocessor 111D as an average monitored voltage Va through a serial resistor 193 and a smoothing capacitor 194. In FIG. 10, the power supply voltage measuring circuit (the voltage dividing resistors 191b, 192b in FIG. 1 and FIG. 5) is removed, and an average measured voltage Ea is input to the microprocessor 111D as the average monitored voltage Va in place of the power supply monitoring voltage Vf.

In addition, in FIG. 10, the overcurrent detection circuit 170 in FIG. 1 as well as the comparison circuit 196 (the overcurrent state detection circuit) and the comparison circuit 197 (the undercurrent state detection circuit) in FIG. 7 are also removed, and an abnormal state is determined by making a comparison between the monitored voltage Ef and the average monitored voltage Va in the microprocessor 111D, as will be described later.

Moreover, the calibration operation processing of the differential amplifier circuit part 150 is carried out as shown in FIG. 8, and an interrupt control routine for generating a feedback control output PWM is illustrated in FIG. 4. However, in FIG. 10, no interrupt input terminal INT is provided, and hence steps 401 and 406 in FIG. 4 are removed.

As described above, a current control part of the current control apparatus 100D according to the fourth embodiment of the present invention includes the microprocessor 111D, the differential amplifier circuit part 150, a conversion estimating section, a feedback control section, the average voltage measuring circuit (the voltage dividing resistors 191a, 192a), an abnormality determination section in the microprocessor 111D, an output stop section, and the abnormality warning section (the warning indicator 109). The microprocessor 111D includes component elements similar to those in the above-mentioned microprocessors, and the differential amplifier circuit part 150 operates in the same manner as described above.

The conversion estimating section calculates an estimated load current Ime based on a monitored voltage Ef, or calculates an estimated monitored voltage Es corresponding to a target load current Is, as referred to above. The feedback control section controls, as stated above, an energization duty γ, which is the closed circuit duration of a switching element 121 divided by the switching period thereof, while setting the target load current Is as a target value of the current control part, and the estimated load current Ime as a feedback value, or setting the estimated monitored voltage Es as a target value of the current control part, and the actual monitored voltage Ef as a feedback value.

The average voltage measuring circuit generates the average measured voltage Ea, as stated above, and the abnormality determination section generates an abnormality determination signal from the relative relation between the monitored voltage Ef and the average measured voltage Ea, as referred to above. The output stop section and the abnormality warning section serve to stop the feedback control output PWM, and indicate a warning of the abnormally stopped state, in response to the abnormality determination signal, as stated above. In addition, the abnormality determination section in the microprocessor 111D includes at least one of an overcurrent state detection section and an undercurrent state detection section.

The average measured voltage Ea generated by the average voltage measuring circuit is input to the microprocessor 111D as the average monitored voltage Va. The overcurrent state detection section in the microprocessor 111D generates an abnormality determination signal when the relative relation between the monitored voltage Ef and the average monitored voltage Va varies exceeding an allowable variation range to indicate an excessively large state of the monitored voltage Ef.

Also, the undercurrent state detection section generates an abnormality determination signal when the relative relation between the monitored voltage Ef and the average monitored voltage Va varies exceeding an allowable variation range to indicate an excessively small state of the monitored voltage Ef. The output stop section and the abnormality warning section serve to stop, in response to the abnormality determination signal from the overcurrent state detection section or the undercurrent state detection section, the feedback control output PWM and at the same time indicate a warning of the abnormally stopped state.

Figure 11:
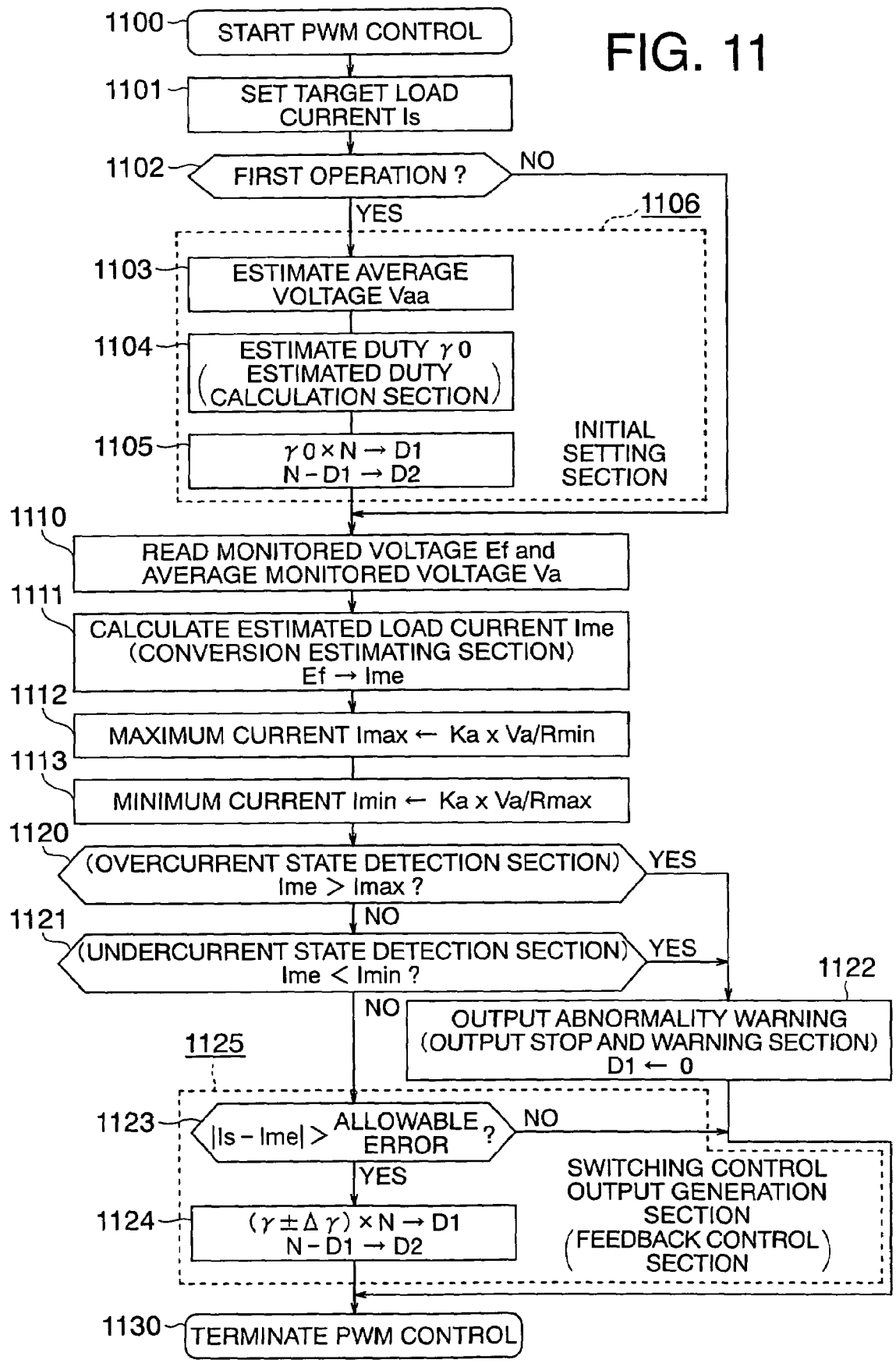
FIG. 11 is a flow chart illustrating a processing operation for a general control routine according to the fourth embodiment of the present invention.

Now, reference will be made to a specific operation of pulse width modulation (PWM) control routine according to the fourth embodiment of the present invention as illustrated in FIG. 10 while referring to a flow chart of FIG. 11. In FIG. 11, steps 1100 through 1102 are the same processes as those in the above-mentioned steps 300, 301, 303 (see FIG. 3), and steps 1104 through 1106 are the same processes as the above-mentioned steps 304 through 306, and steps 1111 through 1125 are the same processes as the above-mentioned steps 311, 313 through 325.

Accordingly, step 1104 corresponds to an estimated duty calculation section, and steps 1103 through 1105 together constitute an initial setting section 1106 in the microprocessor 111D. Step 1111 corresponds to the conversion estimating section, and steps 1120, 1121 correspond to the overcurrent state detection section and the undercurrent state detection section, respectively. Step 1122 corresponds to the output stop section and the warning indicator (the abnormality warning section), and steps 1123, 1124 together constitute a switching control output generation section 1125 (feedback control section).

First of all, the microprocessor 111D starts pulse width modulation control operation to generate a feedback control output PWM (step 1100). Subsequently, the value of the target load current Is (which is determined in an unillustrated control flow) is read (step 1101), and it is determined whether the following control flow is the first operation after the start of operation (step 1102). When it is determined as the first operation in step 1102 (that is, YES), the control flow shifts to step 1103, whereas when determined as not the first operation (that is, NO), the control flow shifts to step 1110.

In step 1103, an average voltage (roughly estimated value) Vaa to be impressed to the electric load 107 is calculated while setting a minimum value Vmin and a maximum value Vmax of the drive power supply voltage Vb of the drive power supply 101 according to the following expression.

$$Vaa=(Vmin+Vmax)/2$$

Then, in step 1104, the rough energization duty γ0 of the switching element 121 is estimated and determined according to the following expression.

$$\gamma 0=(Vmin/Vaa) \times (Is/Ir)$$

Here, the reference load current Ir (=Vmin/Rc) is calculated by setting a standard resistance value Rc, which is determined to be within a resistance value variation range (from Rmin to Rmax) of the electric load 107.

In step 1105, as stated above, the roughly estimated value γ0 of the energization duty calculated in step 1104 is multiplied by a predetermined magnification N (=1000), the integer part of which is stored in a data register D1 in the form of a memory of a specific address in the RAM memory 112, and a value of "N−D1" is stored in a data register D2.

Thereafter, the value of the monitored voltage Ef and the value of the average monitored voltage Va input to the microprocessor 111D are read (step 1110), and the value of the monitored voltage Ef thus read is substituted for the above-mentioned expression (10), so that the estimated load current Ime is converted and estimated by the following expression (step 1111).

$$Ime=[Ef-D \times Va-C]/B$$

Here, note that the data stored in the data memory (FMEM) 114D are read and used as the values of calibration constants D, C, B in the above expression, and the values read in step 1110 are used as the value of the average monitored voltage Va and the value of the monitored value Ef.

Subsequently, the value of the average monitored voltage Va read out in step 1110 is multiplied by an average voltage calibration factor Ka to obtain a voltage across the opposite ends of the electric load 107, and a maximum current Imax and a minimum current Imin are calculated by using the values of the minimum resistance value Rmin and the maximum resistance value Rmax of the electric load 107 stored in the FMEM 113D or the data memory 114D as fixed constants (steps 1112, 1113).

Then, in step 1120, the overcurrent state detection section determines whether the estimated load current Ime calculated in step 1111 is larger than the maximum current Imax calculated in step 1112, and when determined as Ime>Imax (that is, YES), it is assumed that there exists an overcurrent state, and the control flow shifts to step 1122, whereas when determined as Ime≦Imax (that is, NO), it is assumed that an overcurrent state does not exist, and the control flow shifts to step 1121.

In step 1121 which corresponds to the overcurrent state detection section, it is determined whether the estimated load current Ime calculated in step 1111 is less than the minimum current Imin calculated in step 1113, and when determined as Ime<Imin (that is, YES), it is assumed that there exists an undercurrent state, and the control flow shifts to step 1122, whereas when determined as Ime≧Imin (that is, NO), it is assumed that an undercurrent state does not exist, and the control flow shifts to step 1123.

In step 1122, as stated before, the value of the data register D1 for determination of the energization duty γ is set to "0", whereby the feedback control output PWM from the microprocessor 111D (the feedback control section) is stopped, and an abnormality warning signal DSP is generated to operate the warning indicator 109.

In step 1123, the target load current Is set in step 1101 and the estimated load current Ime calculated in step 1111 are compared with each other, and it is determined whether a comparison deviation |Is−Ime| exceeds an allowable error. When determined as |Is−Ime|>allowable error (that is, YES), the control flow shifts to step 1124, whereas when determined as |Is−Ime|≦allowable error (that is, NO), the control flow shifts to an operation end step 1130.

In step 1124, a correction value Δγ for the present energization duty γ is corrected increasingly or decreasingly in accordance with the relative magnitude and polarity (plus or minus) of the comparison deviation |Is−Ime| determined in step 1123. The correction result is multiplied by the predetermined magnification N (=1000), and the integer part of the multiplied value thus obtained is stored in the data register D1 of the RAM memory 112, with a value of "N−D1" being stored in the data register D2.

As stated above, the operation end step 1130 is a stand-by step, and the control flow of steps 1100 through 1130 is executed in a repeated manner each time an operation start step 1100 is activated after the microprocessor 111D has executed another control flow. Here, note that a switching control output generation section 1125 (steps 1123, 1124) constitutes a feedback control section that generates a feedback control output PWM due to pulse width modulation control.

Here, an overall outline of the control flow of FIG. 11 will be described.

First of all, the initial setting section 1106 makes a comparison between the reference load current Ir and the target load current Is to determine an estimated energization duty γ0 at a stage where an appropriate energization duty γ due to the feedback control has not yet been determined.

The conversion estimating section (step 1111) calculates the estimated load current Ime based on the value of the measured monitored voltage Ef, the value of the average monitored voltage Va and the calibration constants, and acquires an accurate load current by excluding an individual variation of the current detection resistor 126 and a current detection error of the differential amplifier circuit part 150. As a result, if a deviation exists between the target load current Is and the estimated load current Ime, the feedback control section 1125 can correct to increase or decrease the energization duty γ in such a manner that the target load current Is and the estimated load current Ime are controlled to coincide with each other.

In case where the overcurrent state detection section (step 1120) determines an overcurrent state, such an overcurrent state is caused by a short circuit (load short circuit) between the positive and negative lead wires of the electric load 107, a layer-to-layer short circuit between windings, a ground fault accident between positive phase wiring connected to the output terminal 108 and a ground line (or a vehicle body, the ground, etc.) connected to the ground terminal 104N, etc.

For instance, when an overcurrent flows into the current detection resistor 126 by a load short circuit, the above-mentioned overcurrent detection circuit 170 (see FIG. 1) generates an abnormality warning signal by detecting when an output voltage E0 of a differential amplifier 151 (normally, in the range of 0-Vcc) increases rapidly to the drive power supply voltage Vb (e.g., 10 [V]-16 [V]).

In FIG. 10, since the monitored voltage Ef input to the microprocessor 111 is limited by a voltage limiting diode 164 (see FIG. 1) in the smoothing circuit 160 so as not to exceed the controlled power supply voltage Vcc, it is impossible to detect that the estimated load current Ime has come to be in an excessively large state. However, the average monitored voltage Va abnormally falls due to the load short circuit, thus resulting in a state of Ef>>Va. As a consequence, the microprocessor 111D can detect the abnormality.

On the other hand, in case where the undercurrent state detection section (step 1121) determines an undercurrent state, such an undercurrent state is caused by a break or open-circuit accident of the electric load 107 or its wiring, a power supply short-circuit accident of positive phase wiring, etc. In particular, when the output terminal 108 and the power supply terminal 104P are completely short-circuited with each other in a power supply short-circuit accident of the positive phase wiring, the current flowing through the current detection resistor 126 becomes zero (0 [A]), so an alienation or divergence occurs between the target current and the actual current, thus making it possible to easily detect an abnormal state. Similarly, upon occurrence of an open-circuit or break accident, too, the current flowing through the current detection resistor 126 becomes zero (0 [A]), thus causing a divergence between the target current and the actual current, as a consequence of which an abnormal state can be easily detected.

However, when a power supply fault accident occurs between a remote location of the positive phase wiring extending from the output terminal 108 to the electric load 107 and a remote location of the power supply wiring extending from the power supply terminal 104P to the drive power supply 101, there is formed a parallel circuit having the resistance value R0 of the wiring and the resistance value R1 of the current detection resistor 126, so the current flowing through the current detection resistor 126 decreases at a ratio of "R0/(R0+R1)". In this case, there arises a possibility that an abnormal state cannot be detected only by simply comparing the actual current with the target current.

For instance, if the target current is less than or equal to a branch current Ix to the current detection resistor 126 when the switching element 121 is made fully conductive with the occurrence of a power supply fault accident due to the resistance value R0, it is possible to perform feedback control in such a manner that the actually measured current value is made coincident with the target current value. As a result, there occurs no alienation or difference between the target current value and the measured current value, thus making it impossible to detect an abnormal current state.

However, the present average monitored voltage Va impressed to the electric load 107 is monitored, and the minimum current Imin and the maximum current Imax are calculated, as comparison references in steps 1120, 1121, from the maximum resistance value Rmax and the minimum resistance value Rmin of the electric load 107, whereby it is determined whether the minimum current Imin and the maximum current Imax flow through the current detection resistor 126. Consequently, an abnormal state can be determined at a high degree of precision.

Here, note that in steps 1120, 1121, the estimated load current Ime is compared with the maximum load current Imax and the minimum load current Imin, but instead the maximum load current Imax and the minimum load current Imin calculated in steps 1112, 1113 may be converted into the corresponding output voltages of the differential amplifier circuit part 150 to provide a maximum monitoring voltage Emax and a minimum monitoring voltage Emin, whereby the monitored voltage Ef can be compared with the maximum monitoring voltage Emax and the minimum monitoring voltage Emin. In short, it only needs to determine that there exist no abnormal alienation or divergence in the relative relation between the monitored voltage Ef and the average monitored voltage Va.

As described above, the current control apparatus 100D according to the fourth embodiment of the present invention is provided with the microprocessor 111D having the FMEM 113D including the data memory 114D, the RAM memory 112, and the multichannel AD converter 115, and with the differential amplifier circuit part 150, the voltage dividing resistors (average voltage measuring circuit) 191a, 192a, and the warning indicator (abnormality warning section) 109. The microprocessor 111D is provided with the conversion estimating section (step 1111), the feedback control section 1125 (steps 1123, 1124), the abnormality determination section (steps 1120, 1121), and the output stop section (step 1122).

The differential amplifier 151 in the differential amplifier circuit part 150 amplifies a difference voltage between the voltages at the opposite ends of the current detection resistor 126 to provide a monitored voltage Ef, substantially proportional to the energization current to the electric load 107, which is then input to the microprocessor 111D through the smoothing circuit 160.

The conversion estimating section (step 1111) calculates the estimated load current Ime from the value of the monitored voltage Ef, and the feedback control section 1125 controls the energization duty γ of the switching element 121 by setting the target load current Is and the estimated load current Ime as the target value and the feedback value, respectively.

The voltage dividing resistors (average voltage measuring circuit) 191a, 192a and the smoothing capacitor 160 divide and smoothen the voltage impressed to the electric load 107 to generate an average measured voltage Ea proportional to the average impressed voltage to the electric load 107.

The abnormality determination section (steps 1120, 1121) makes an abnormality determination when the relative relation between the monitored voltage Ef and the average measured voltage Ea varies exceeding an allowable variation range.

The output stop section (step 1122) and the warning indicator (abnormality warning section) 109 are operated in response to a warning signal from the abnormality determination section (steps 1120, 1121) to stop the feedback control output PWM from the microprocessor 111D, and at the same time indicate a warning of the abnormally stopped state.

In addition, in the above-mentioned feeder circuit construction in which the switching element 121 and the current detection resistor 126 are connected with each other in a mutually adjacent relation, safety can be improved by detecting abnormality of the electric load 107 or the load wiring in an accurate manner. The average measured voltage Ea detected by the voltage dividing resistors (average voltage measuring circuit) 191a, 192a is input to the microprocessor 111D as the average monitored voltage Va.

As the abnormality determination section, there is provided at least one of the overcurrent state detection section (step 1120) and the undercurrent state detection section (step 1121). The overcurrent state detection section (step 1120) generates an abnormality determination signal when the relative relation between the monitored voltage Ef and the average monitored voltage Va varies exceeding an allowable variation range to indicate an excessively large state of the monitored voltage Ef.

The undercurrent state detection section (step 1121) generates an abnormality determination signal when the relative relation between the monitored voltage Ef and the average monitored voltage Va varies exceeding an allowable variation range to indicate an excessively small state of the monitored voltage Ef. The output stop section (step 1122) and the abnormality warning section 109 are operated in response to an abnormality generation signal from the steps 1120, 1121 to stop the feedback control output PWM from the microprocessor 111D, and at the same time indicate a warning of the abnormally stopped state.

Thus, in the above-mentioned feeder circuit construction in which the switching element 121 and the current detection resistor 126 are connected with each other in a mutually adjacent relation, it is possible to detect a break or open circuit of the electric load 107 and a power supply short circuit or a break or open-circuit of the load wiring by means of the undercurrent state detection section 1121 at a location inside the microprocessor 111D, whereby an abnormal state can be warned by the use of an inexpensive circuit configuration. In addition, a short-circuit of the electric load 107 or a ground fault of the load wiring can be detected by the overcurrent state detection section 1120 in the microprocessor 111D, and it is possible to prevent the burnout of the switching element 121 or the current detection resistor 126 with an inexpensive circuit configuration, as well as make a warning of an abnormal state.

In general, as long as the differential amplifier circuit part 150 accurately detects the load current, the actual load current is controlled in a feedback manner so as to coincide with the target load current Is even if there is a variation in the power supply voltage or the load resistance, but in actuality, there is a possibility that a current detection error occurs in the differential amplifier circuit part 150. Such a current detection error can be ignored if an inverting input circuit and a non-inverting input circuit of the differential amplifier 151 are formed with complete symmetry by using ultra high precision resistors, and the current detection resistor 126 is composed of a resistor with a high degree of precision that coincides with the theoretical value, but in this case, the use of extremely expensive circuit components results in a highly expensive product.

However, according to the above-mentioned first through fourth embodiments, by correcting the error component of the detected current, it is possible to make the actual load current coincide with the target load current Is even with the use of inexpensive circuit components even if a variation occurs in the power supply voltage or the load resistance.

Moreover, if the current control apparatus 100A or 100C (see FIG. 1 and FIG. 7) is used to perform current control only in a low current range of the electric load 107, an overcurrent will flow when the switching element 121 is made fully conductive based on a second calibration command 211a or 811a, or a third calibration command 221a or 821a in the detected error calibration section 238 or 838 (see FIG. 2 and FIG. 8). Thus, in this case, it is desirable to carry out a calibration operation by connecting a plurality of electric loads 107 in series with one another.

Further, if calibration operation equipment is constructed such that a highly accurate drive power supply is used to generate a preset drive power supply voltage Vb, the voltmeter 992a or 992d for calibration becomes unnecessary. In this case, it only needs to store predetermined values, which have been appropriately set beforehand, in the current control apparatus as drive power supply voltage data. Similarly, by setting the load current to a predetermined value, which has been appropriately set beforehand, the ammeter 991d or 991a can be made unnecessary.

Furthermore, in case where the differential amplifier 151 and the multichannel AD converter 115 can handle both positive and negative voltages inside the differential amplifier circuit part 150, the bias correction circuit 158 is not needed. In addition, a field-effect transistor can be used for the switching element 121 (see FIG. 1) in the switching circuit part 120 in place of a junction transistor illustrated in the drawings.

While the invention has been described in terms of preferred embodiments, those skilled in the art will recognize that the invention can be practiced with modifications within the spirit and scope of the appended claims.

What is claimed is:

1. A current control apparatus for an electric load comprising:

a feeder circuit including a switching element and a current detection resistor both inserted in series between a drive power supply and an electric load for feeding electric power from said drive power supply to said electric load through said switching element and said current detection resistor;

a current control part that controls an on/off ratio of said switching element in such a manner that a load current detected by said current detection resistor is made to coincide with a target load current Is to be supplied to said electric load; and said current control part including a microprocessor, a differential amplifier circuit part, a detected error calibration section, a conversion estimating section, and a feedback control section;

wherein said microprocessor includes a nonvolatile program memory, a nonvolatile data memory, a RAM memory for arithmetic operation, and a multichannel AD converter;

said differential amplifier circuit part amplifies a difference voltage between voltages at opposite ends of said current detection resistor to generate a monitored voltage Ef substantially proportional to said load current and to input it to said microprocessor;

said detected error calibration section stores a current proportional constant of said monitored voltage Ef, a voltage proportional constant of an error component, and an offset component, which are measured at the time of adjustment for shipment of said apparatus as a product, into said nonvolatile data memory as calibration constants;

said conversion estimating section calculates an estimated load current Ime based on said monitored voltage Ef and said calibration constants or calculates an estimated monitored voltage Es corresponding to said target load current Is;

said feedback control section controls an energization duty $\gamma$, which is a closed circuit duration of said switching element divided by a switching period thereof, while setting said target load current Is as a target value of said current control part, and said estimated load current Ime as a feedback value, or setting said estimated monitored voltage Es as a target value of said current control part, and said monitored voltage Ef as a feedback value; and said detected error calibration section, said conversion estimating section and said feedback control section are executed by said microprocessor based on a control program stored in said nonvolatile program memory.

2. The current control apparatus for an electric load as set forth in claim 1, wherein said feeder circuit includes a commutating diode;

said differential amplifier circuit part includes a bias correction circuit;

said commutating diode is connected in parallel to said electric load in such a manner that it has a polarity to permit a continued transient-decay current due to the inductance of said electric load to return upon opening of said switching element; and said bias correction circuit impresses a substantially equal, positive bias voltage to a first input and a second input of said differential amplifier so as to cancel a negative voltage impressed thereto due to a voltage drop of said commutating diode upon opening of said switching element, thereby inhibiting said negative voltage from being input to said differential amplifier.

3. The current control apparatus for an electric load as set forth in claim 1, wherein said current control part includes a power supply voltage measuring circuit that measures a power supply monitoring voltage Vf;

said detected error calibration section includes a first, a second and a third data acquisition section, a calibration factor calculation section that calculates calibration factors from said data acquired by said first, second and third data acquisition sections, a power supply voltage calibration section that calibrates said power supply monitoring voltage Vf, and a transfer storage section that transfers and stores said calibration factors as calibration constants;

said power supply voltage measuring circuit inputs a divided voltage of a drive power supply voltage Vb from said drive power supply to said microprocessor as said power supply monitoring voltage Vf;

said first data acquisition section acts to write and store, in said RAM memory as a first error voltage Ef0, the value of a monitored voltage that is generated from said differential amplifier circuit part with said switching element fully opened when a first calibration command is input upon impression of said drive power supply voltage Vb to said current control part;

said second data acquisition section acts, upon input of a second calibration command with wiring extending from said feeder circuit to said electric load being cut, to write and store, into said RAM memory as a second error voltage Ef1, the value of a monitored voltage that is generated from said differential amplifier circuit part with said switching element being made fully conductive, and at said same time to write and store into said RAM memory the value of said drive power supply voltage Vb externally measured;

said third data acquisition section acts, upon input of a third calibration command with wiring extending from said feeder circuit to said electric load being connected, to write and store, into said RAM memory as a measured voltage Ef2, the value of a monitored voltage that is generated from said differential amplifier circuit part with said switching element being made fully conductive, and at the same time to write and store the value of an external load current Im measured on the outside into said RAM memory;

when a voltage drop Vd of said commutating diode is made substantially equal to 1 [V] (Vd≈1 [V]), said calibration factor calculation section calculates and stores a voltage proportional constant A of the error component, a current proportional constant B and an offset component C in such a manner that said monitored voltage Ef, said drive power supply voltage Vb, said energization duty $\gamma$ and said external load current Im of said differential amplifier circuit part satisfy the following relation:

$$Ef=A\times(Vb+Vd)\times\gamma+B\times Im+C$$

said offset component C coincides with said first error voltage Ef0 stored in said first data acquisition section;

said voltage proportional constant A is calculated from data acquired by said first and second data acquisition sections as follows:

$$A=(Ef1-Ef0)/(Vb+Vd)$$

said current proportional constant B is calculated from data acquired by said second and third data acquisition sections as follows:

$$B=(Ef2-Ef1)/Im$$

said power supply voltage calibration section is executed in said first, second and third data acquisition sections to write and store said power supply monitoring voltage Vf into said RAM memory, and to calculate a power supply voltage calibration factor Kv as Kv=Vb/Vf, or apply a fixed constant which is preset as the reciprocal of a voltage division ratio of said drive power supply voltage Vb; and said transfer storage section transfers and stores, into said nonvolatile data memory as calibration constants, the respective values of said voltage proportional constant A, said current proportional constant B, said offset component C, and said power supply voltage calibration factor Kv, all of which are the calculation results of said calibration factor calculation section.

4. The current control apparatus for an electric load as set forth in claim 1, wherein said current control part includes an average voltage measuring circuit for measuring an average monitored voltage Va that is an average value of the voltage impressed to said electric load;

said detected error calibration section includes a first, a second and a third data acquisition section, a calibration factor calculation section that calculates calibration factors from data acquired by said first, second and third data acquisition sections, an average voltage calibration section that calibrates said average monitored voltage Va, and a transfer storage section that transfers and stores said calibration factors as calibration constants;

said average voltage measuring circuit inputs a divided voltage obtained by dividing a voltage across said opposite ends of said electric load to said microprocessor as said average monitored voltage Va;

said first data acquisition section acts to write and store, in said RAM memory as a first error voltage, the value of a monitored voltage that is generated from said differential amplifier circuit part with said switching element fully opened when a first calibration command is input upon impression of said predetermined drive power supply voltage Vb to said current control part;

said second data acquisition section acts, upon input of a second calibration command with wiring extending from said feeder circuit to said electric load being cut, to write and store, into said RAM memory as a second error voltage Ef1, the value of a monitored voltage that is generated from said differential amplifier circuit part with said switching element being made fully conductive, and at the same time to write and store said average monitored voltage Va into said RAM memory;

said third data acquisition section acts, upon input of a third calibration command with wiring extending from said feeder circuit to said electric load being connected, to write and store, into said RAM memory as a measured voltage Ef2, the value of a monitored voltage that is generated from said differential amplifier circuit part with said switching element being made fully conductive, and at the same time to write and store the value of an external load current Im measured at the outside into said RAM memory;

said calibration factor calculation section calculates and stores a voltage proportional constant D of an error component, a current proportional constant B and a offset component C in such a manner that a monitored voltage Ef of said differential amplifier circuit part 150, said average monitored voltage Va and said external load current Im satisfy the following relation;

$$Ef = D \times Va + B \times Im + C$$

said offset component C coincides with said first error voltage Ef0 stored in said first data acquisition section;

said voltage proportional constant D is calculated from data acquired by said first and second data acquisition sections as follows;

$$D = (Ef1 - Ef0)/Va$$

said current proportional constant B is calculated from data acquired by said second and third data acquisition sections as follows;

$$B = (Ef2 - Ef1)/Im$$

said average voltage calibration section is executed in said second or third data acquisition section to take in the value of a drive power supply voltage Vb measured on the outside to write and store it into said RAM memory, and at the same time said average voltage calibration section calculates an average voltage calibration factor Ka between an average monitored voltage Va when said switching element becomes fully conductive and said drive power supply voltage Vb as Ka=Vb/Va, or applies a fixed constant which is preset as the reciprocal of a voltage division ratio to a voltage across opposite ends of said electric load; and said transfer storage section transfers and stores, into said nonvolatile data memory as said calibration constants, the respective values of said voltage proportional constant D, said current proportional constant B, said offset component C, and said average voltage calibration factor Ka, all of which are the calculation results of said calibration factor calculation section.

5. The current control apparatus for an electric load as set forth in claim 3, wherein said current control part includes a serial communication interface circuit that connects between said microprocessor and an external tool for calibration operation; and at the time of calibration operation, a calibration command, voltage information on said drive power supply, and current information on said electric load input from said external tool through said serial communication interface circuit are transferred to and stored into said RAM memory.

6. The current control apparatus for an electric load as set forth in claim 3, wherein said current control part includes an input interface circuit that connects between said microprocessor, a switch input group, and an analog input group through a bus;

at the time of calibration operation, at least one of said first, second and third calibration commands is input from an input terminal of a predetermined number in said switch input group; and voltage information on said drive power supply and current information on said electric load are input as analog inputs of predetermined numbers in said analog input group, transferred to and stored into said RAM memory.

7. The current control apparatus for an electric load as set forth in claim 3, wherein said nonvolatile program memory includes a conversion estimating section that calculates said estimated load current Ime or said estimated monitored voltage Es, and a switching control output generation section that constitutes said feedback control section;

said conversion estimating section calculates said estimated load current Ime from said monitored voltage Ef generated from said differential amplifier circuit part and the present value of the energization duty γ of said switching element as follows;

$$Ime = [Ef - A \times (Vb + Vd) \times \gamma - C]/B$$

alternatively, said conversion estimating section calculates said estimated monitored voltage Es generated from said differential amplifier circuit part when said target load current Is flows at the energization duty γ of said switching element as follows; and $$Es = A \times (Vb + Vd) \times \gamma + B \times Is + C$$

said switching control output generation section gradually increases or decreases the energization duty γ of said switching element in response to a deviation between said target load current Is and said estimated load current Ime, or in response to a deviation between said estimated monitored voltage Es and said actual monitored voltage Ef.

8. The current control apparatus for an electric load as set forth in claim 7, wherein said nonvolatile program memory includes a program that constitutes an initial setting section;

said initial setting section calculates a roughly estimated value γ0 of said energization duty of said switching element from a relation among a minimum power supply voltage Vmin, a reference load current Ir, said power supply monitoring voltage Vf and said target load current Is by using the following expression, and sets it as an energization duty immediately after starting of the energization;

$$\gamma 0 = (\text{Vmin}/Vb) \times (Is/Ir)(\text{here}, Vb = Kv \times Vf)$$

said reference load current Ir is calculated by using a standard resistance value Rc, which is determined within a resistance value variation range (Rmin-Rmax) of said electric load as follows;

$$Ir = \text{Vmin}/Rc.$$

9. The current control apparatus for an electric load as set forth in claim 4, wherein said nonvolatile program memory includes a conversion estimating section that calculates said estimated load current Ime or said estimated monitored voltage Es, and a switching control output generation section that constitutes said feedback control section;

said conversion estimating section calculates said estimated load current Ime from said monitored voltage Ef generated from said differential amplifier circuit part and the present value of said average monitored voltage Va as follows;

$$Ime = [Ef - D \times Va - C]/B$$

alternatively, said conversion estimating section calculates said estimated monitored voltage Es generated from said differential amplifier circuit part when said target load current Is flows as follows; and $$Es = D \times Va + B \times Is + C$$

said switching control output generation section gradually increases or decreases the energization duty γ of said switching element in response to a deviation between said target load current Is and said estimated load current Ime, or in response to a deviation between said estimated monitored voltage Es and said actual monitored voltage Ef.

10. The current control apparatus for an electric load as set forth in claim 9, wherein said nonvolatile program memory includes a program that constitutes an initial setting section;

said initial setting section calculates a roughly estimated value Vaa of said average monitored voltage Va from a relation among a minimum power supply voltage Vmin, a maximum power supply voltage Vmax, a reference load current Ir, and said target load current Is as follows;

$$Vaa = /2$$

at the same time, said initial setting section calculates a roughly estimated value γ0 of said energization duty by using said roughly estimated value Vaa according to the following expression, and sets it as an energization duty immediately after starting of the energization; and $$\gamma 0 = x$$

said reference load current Ir is calculated by using a standard resistance value Rc, which is determined within a resistance value variation range of said electric load as follows;

$$Ir = \text{Vmin}/Rc.$$

11. A current control apparatus for an electric load comprising:

a feeder circuit including a switching element and a current detection resistor both inserted in series between a drive power supply and an electric load for feeding electric power from said drive power supply to said electric load through said switching element and said current detection resistor;

a current control part that controls an on/off ratio of said switching element in such a manner that a load current detected by said current detection resistor is made to coincide with a target load current Is to be supplied to said electric load; and said current control part includes a microprocessor, a control power supply, a differential amplifier circuit part, a conversion estimating section, a feedback control section, an overcurrent detection circuit, a voltage limiting diode, an output stop section, and an abnormality warning section;

wherein said microprocessor includes a nonvolatile program memory, a nonvolatile data memory, a RAM memory for arithmetic operation, and a multichannel AD converter;

said control power supply is fed with power from said drive power supply, generates a stabilized control power supply voltage Vcc, which is lower than a drive power supply voltage Vb, and supplies it to said microprocessor;

said differential amplifier circuit part amplifies a difference voltage between voltages at opposite ends of said current detection resistor to generate a monitored voltage Ef substantially proportional to said load current and to input it to said microprocessor;

said conversion estimating section calculates an estimated load current Ime based on said monitored voltage Ef, or calculates an estimated monitored voltage Es corresponding to said target load current Is;

said feedback control section controls an energization duty γ, which is equal to a closed circuit duration of said switching element divided by a switching period thereof, while setting said target load current Is as a target value of said current control part, and said estimated load current Ime as a feedback value, or setting said estimated monitored voltage Es as a target value of said current control part, and said actual monitored voltage Ef as a feedback value;

when the value of a prestage voltage E0 of said monitored voltage Ef obtained from said differential amplifier circuit part exceeds a predetermined value that is equal to or greater than said controlled power supply voltage Vcc, said overcurrent detection circuit generates an overcurrent determination warning signal indicative of an excessive large state of said load current and inputs it to said microprocessor;

said voltage limiting diode is connected to said overcurrent detection circuit for limiting said monitored voltage Ef to be input to said microprocessor to the level of said controlled power supply voltage Vcc; and said output stop section and said abnormality warning section stop a feedback control output PWM from said feedback control section to said switching element, and provide a warning indication of an abnormally stopped state in response to said overcurrent determination signal.

12. The current control apparatus for an electric load as set forth in claim 11, wherein said overcurrent determination signal is impressed to an interrupt input terminal of said microprocessor; and said output stop section stops said feedback control output in immediate response to the generation of said overcurrent determination signal.

13. The current control apparatus for an electric load as set forth in claim 11, wherein said overcurrent state detection circuit includes a warning signal input circuit connected to an input terminal of said microprocessor and an abnormality occurrence storage circuit; and said abnormality occurrence storage circuit is set by said overcurrent determination signal to stop the conduction of said switching element, and is reset when power is turned on.

14. The current control apparatus for an electric load as set forth in claim 11, wherein said nonvolatile program memory includes a program which constitutes an average voltage estimation section that estimates an average monitored voltage Va, which is an average value of the voltage impressed to said electric load, an abnormality determination section comprising at least one of an overcurrent state detection section and an undercurrent state detection section, said output stop section, and said abnormality warning section;

said average voltage estimation section calculates the product of the energization duty γ of said switching element and said drive power supply voltage Vb as said average monitored voltage Va;

when a relative relation between said monitored voltage Ef and said average monitored voltage Va varies exceeding an allowable variation range, said abnormality determination section generates an abnormality determination warning signal indicating that said monitored voltage Ef is excessively large or small; and said output stop section and said abnormality warning section stop said feedback control output PWM, and provide a warning indication of an abnormally stopped state in response to said overcurrent determination signal.

15. A current control apparatus for an electric load comprising:

a feeder circuit including a switching element and a current detection resistor both inserted in series between a drive power supply and an electric load for feeding electric power from said drive power supply to said electric load through said switching element and said current detection resistor;

a current control part that controls an on/off ratio of said switching element in such a manner that a load current detected by said current detection resistor is made to coincide with a target load current Is to be supplied to said electric load; and said current control part includes a microprocessor, a differential amplifier circuit part, a conversion estimating section, a feedback control section, an average voltage measuring circuit, an abnormality determination section, an output stop section, and an abnormality warning section;

wherein said microprocessor includes a nonvolatile program memory, a nonvolatile data memory, a RAM memory for arithmetic operation, and a multichannel AD converter;

said differential amplifier circuit part amplifies a difference voltage between voltages at opposite ends of said current detection resistor to generate a monitored voltage Ef substantially proportional to said load current and to input it to said microprocessor;

said conversion estimating section calculates an estimated load current Ime based on the value of said monitored voltage Ef, or calculates an estimated monitored voltage Es corresponding to said target load current Is;

said feedback control section controls an energization duty γ, which is a closed circuit duration of said switching element divided by a switching period thereof, while setting said target load current Is as a target value of said current control part, and said estimated load current Ime as a feedback value, or setting said estimated monitored voltage Es as a target value of said current control part, and said actual monitored voltage Ef as a feedback value;

said average voltage measuring circuit divides and smoothens a voltage impressed to said electric load to generate an average measured voltage Ea proportional to an average impressed voltage to said electric load;

said abnormality determination section generates an abnormality determination signal when a relative relation between said monitored voltage Ef and said average measured voltage Ea varies exceeding an allowable variation range; and said output stop section and said abnormality warning section stop a feedback control output PWM from said feedback control section to said switching element, and provide a warning indication of an abnormally stopped state in response to said overcurrent determination signal.

16. The current control apparatus for an electric load as set forth in claim 15, wherein said abnormality determination section includes at least one of an overcurrent state detection circuit and an undercurrent state detection circuit;

said overcurrent state detection circuit comprises a comparison circuit for determination of an excessively large current, and supplies an abnormality determination signal in the form of a warning signal to said microprocessor when said relative relation between said monitored voltage Ef and said average measured voltage Ea varies exceeding an allowable variation range to indicate an excessive large state of said monitored voltage Ef;

said undercurrent state detection circuit comprises a comparison circuit for determination of an excessively small current, and supplies an abnormality determination signal in the form of a warning signal to said microprocessor when said relative relation between said monitored voltage Ef and said average measured voltage Ea varies exceeding an allowable variation range to indicate an excessive small state of said monitored voltage Ef; and said output stop section and an abnormality warning section stop, in response to a warning signal from said overcurrent state detection circuit or said undercurrent state detection circuit, said feedback control output PWM and at said same time indicate a warning of said abnormally stopped state.

17. The current control apparatus for an electric load as set forth in claim 16, wherein said warning signal is impressed to an interrupt input terminal of said microprocessor; and said output stop section stops said feedback control output PWM in immediate response to the generation of said abnormality determination signal.

18. The current control apparatus for an electric load as set forth in claim 16, wherein said overcurrent state detection circuit or said undercurrent state detection circuit includes a warning signal input circuit connected to said input terminal of said microprocessor and an abnormality occurrence storage circuit; and said abnormality occurrence storage circuit is set by said warning signal to stop the conduction of said switching element, and is reset when power is turned on.

19. The current control apparatus for an electric load as set forth in claim 15, wherein said abnormality determination section includes at least one of an overcurrent state detection section and an undercurrent state detection section;

said average measured voltage Ea generated by said average voltage measuring circuit is input to said microprocessor as said average monitored voltage;

said overcurrent state detection section generates an abnormality determination signal when said relative relation between said monitored voltage Ef and said average monitored voltage Va varies exceeding an allowable variation range to indicate an excessively large state of said monitored voltage Ef;

said undercurrent state detection section generates an abnormality determination signal when said relative relation between said monitored voltage Ef and said average monitored voltage Va varies exceeding an allowable variation range to indicate an excessively small state of said monitored voltage Ef; and said output stop section and said abnormality warning section serve to stop, in response to an abnormality determination signal from said overcurrent state detection section or said undercurrent state detection section, said feedback control output PWM and at said same time indicate a warning of said abnormally stopped state.

* * * * *